US012432941B2

(12) United States Patent
Lin et al.

(10) Patent No.: US 12,432,941 B2
(45) Date of Patent: Sep. 30, 2025

(54) CAPACITOR AND METHOD FOR FORMING THE SAME

(71) Applicants: TAIWAN SEMICONDUCTOR MANUFACTURING COMPANY, LTD., Hsinchu (TW); NATIONAL YANG MING CHIAO TUNG UNIVERSITY, Hsinchu (TW)

(72) Inventors: Hsin-Cheng Lin, Taipei (TW); Chia-Che Chung, Hsinchu (TW); Chee-Wee Liu, Taipei (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 546 days.

(21) Appl. No.: 17/830,239

(22) Filed: Jun. 1, 2022

(65) Prior Publication Data

US 2023/0395648 A1 Dec. 7, 2023

(51) Int. Cl.
| | |
|---|---|
| *H10D 1/00* | (2025.01) |
| *H01L 23/522* | (2006.01) |
| *H10B 12/00* | (2023.01) |
| *H10D 1/68* | (2025.01) |

(52) U.S. Cl.
CPC .......... *H10D 1/042* (2025.01); *H01L 23/5223* (2013.01); *H10B 12/03* (2023.02); *H10B 12/0335* (2023.02); *H10D 1/043* (2025.01); *H10D 1/714* (2025.01); *H10D 1/716* (2025.01)

(58) Field of Classification Search
CPC .......... H01L 23/5223; H01L 28/86–92; H10D 1/042; H10D 1/714; H10D 1/716; H10B 12/03–0335
See application file for complete search history.

(56) References Cited

U.S. PATENT DOCUMENTS

| | | | | |
|---|---|---|---|---|
| 2022/0123101 A1* | 4/2022 | Li | ................ | H01L 23/5223 |
| 2023/0178587 A1* | 6/2023 | Frougier | ................ | H10D 1/716 |
| | | | | 257/532 |

OTHER PUBLICATIONS

Lucanos Strambini et al., "Three-dimensional silicon-integrated capacitor with unprecedented areal capacitance for on-chip energy storage", Nano Energy 68 (2020) 104281, pp. 1-8.
Murata 3D Silicon Capacitors, murata video Library, this can be retrieved from website: https://video.murata.com/en-global/detail/video/5764176263001.
Florent Lallemand et al., "Silicon interposers with Integrated Passive Devices, an excellent alternative to discrete components", EMPC 2013.

(Continued)

*Primary Examiner* — Jose R Diaz
(74) *Attorney, Agent, or Firm* — Maschoff Brennan

(57) ABSTRACT

The method includes forming a sacrificial multi-layer stack including alternating first sacrificial layers and second sacrificial layers stacked in a vertical direction on a substrate; removing the first sacrificial layers to form first spaces each interposing two of the second sacrificial layers; depositing a first dielectric layer and a first electrode material in the first spaces; removing the second sacrificial layers to form second spaces each interposing two portions of the first electrode material; depositing a second dielectric layer and a second electrode material in the second spaces.

20 Claims, 65 Drawing Sheets

(56) References Cited

OTHER PUBLICATIONS

C.-Y. Lin et al., "Reliability Characteristics of a High Density Metal-Insulator-Metal Capacitor on Intel's 10+ Process", IEEE IRPS, 2020.
R. Grover et al., "A Reliability Overview of Intel's 10+ Logic Technology", IEEE IRPS, 2020.
Sheikh Rashel et al., "Characterization of Low-Dielectric Constant Silicon Carbonitride (SiCN) Dielectric Films for Charge Trapping Nonvolatile Memories" ECS Transactions, 69 (3) 2015, pp. 99-109.
T R Lenka et al., "AlGaN/GaN-based HEMT on SiC substrate for microwave characteristics using different passivation layers", Pramana-journal of physics vol. 79, No. 1, 2012, pp. 151-163.
Ualal Azadmanjiri et al., "A review on hybrid nanolaminate materials synthesized by deposition techniques for energy storage applications", Journal of Materials Chemistry A, 2014.
Kai Ni et al., "A Novel Ferroelectric Superlattice Based Multi-Level Cell Non-Volatile Memory", IEEE, IEDM, 2019, pp. IEDM19-669-IEDM19-672.
M. Venkata Ramana et al., "Nanocrystalline Pb(Zr0.52Ti0.48)O3 Ferroelectric Ceramics: Mechanical and Electrical Properties", Journal of Nanomaterials, 2010, vol. 2010, Article ID 783043, pp. 1-8.
G. Alarcón-Flores et al., "Low interface states and high dielectric constant Y2O3 films on Si substrates", Journal of Vacuum Science & Technology B 24(4), 2006, pp. 1873-1877.
Takashi Hayashi et al., "Film Thickness Dependence of Dielectric Properties of BaTiO3 Thin Films Prepared by Sol-Gel Method", Japanese Journal of Applied Physics vol. 33, 1994, pp. 5277.

\* cited by examiner

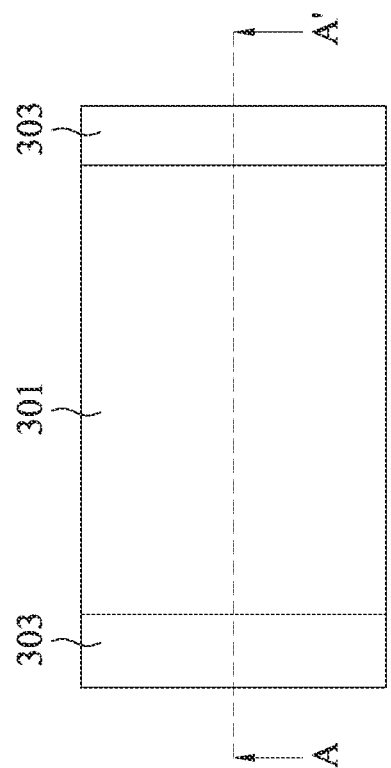
Fig. 2A
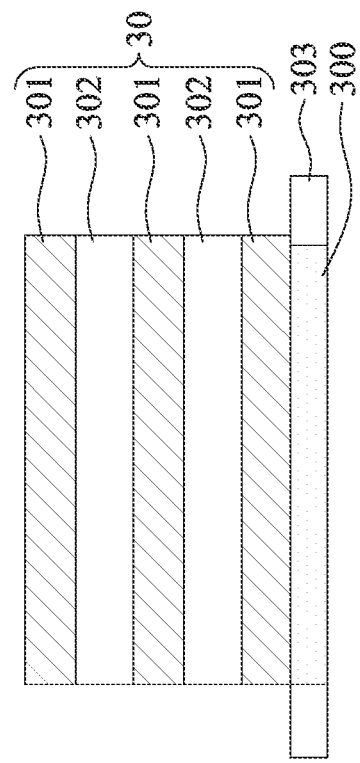
Fig. 2B
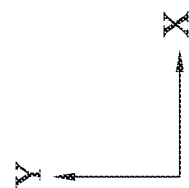

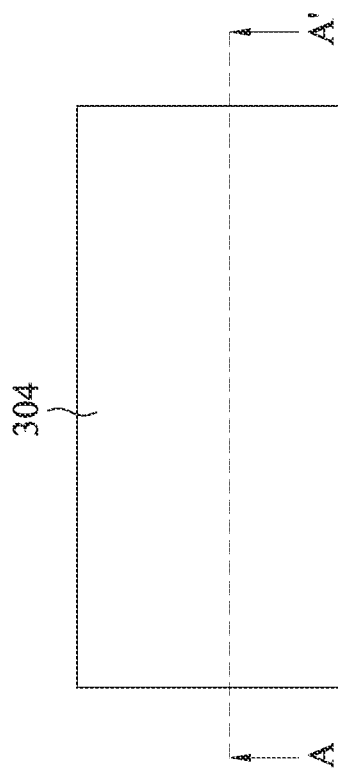
Fig. 3A
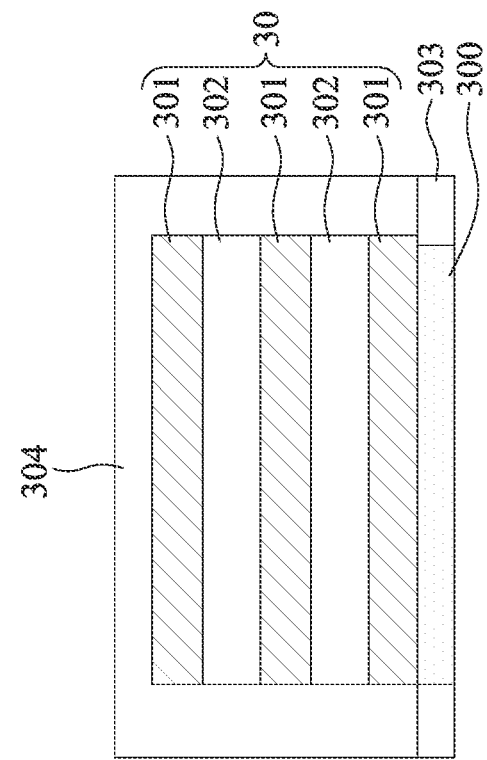
Fig. 3B
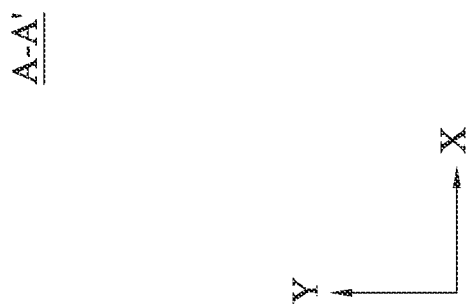

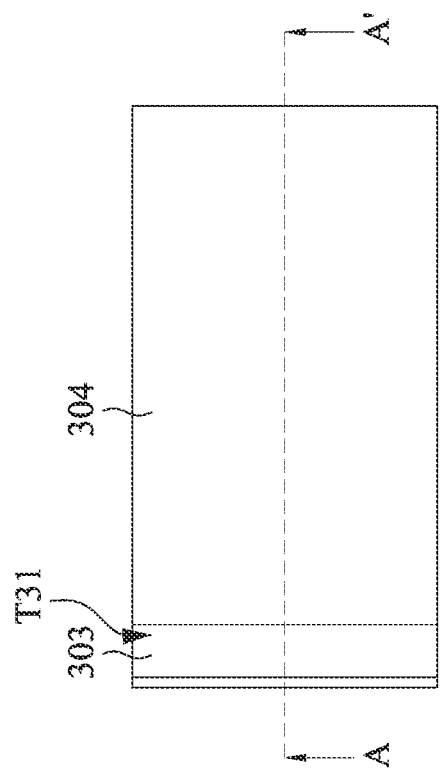
Fig. 4A
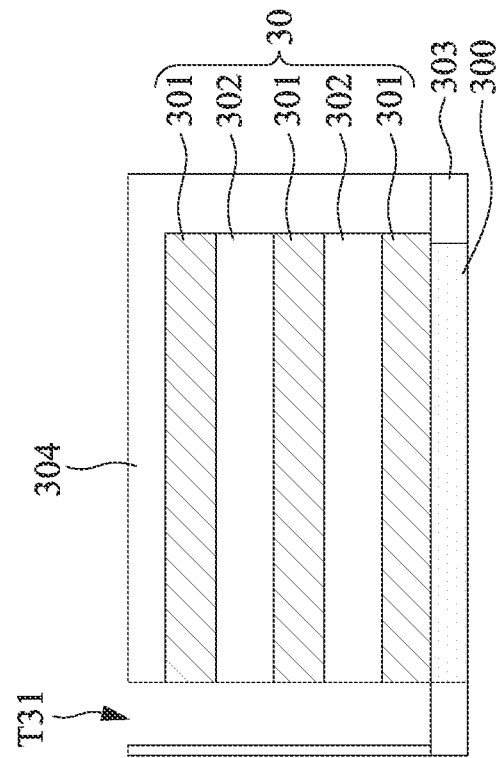
Fig. 4B
A-A'
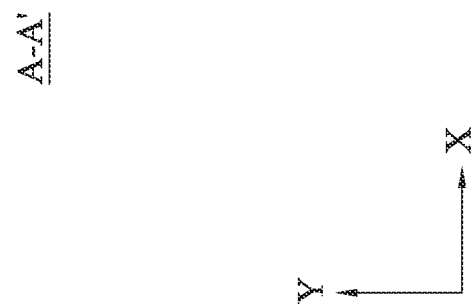

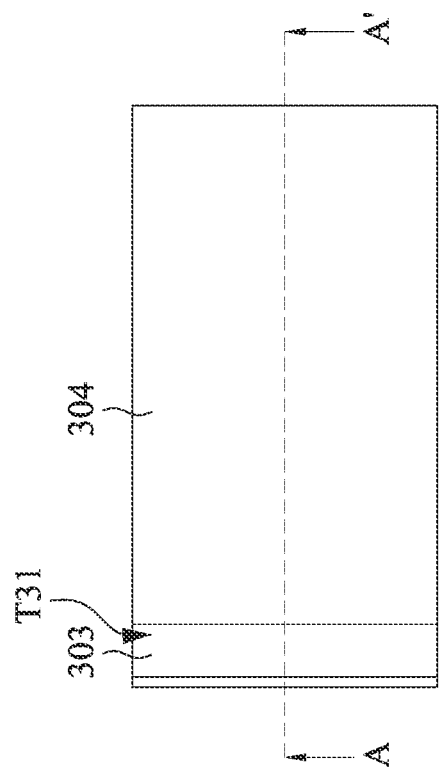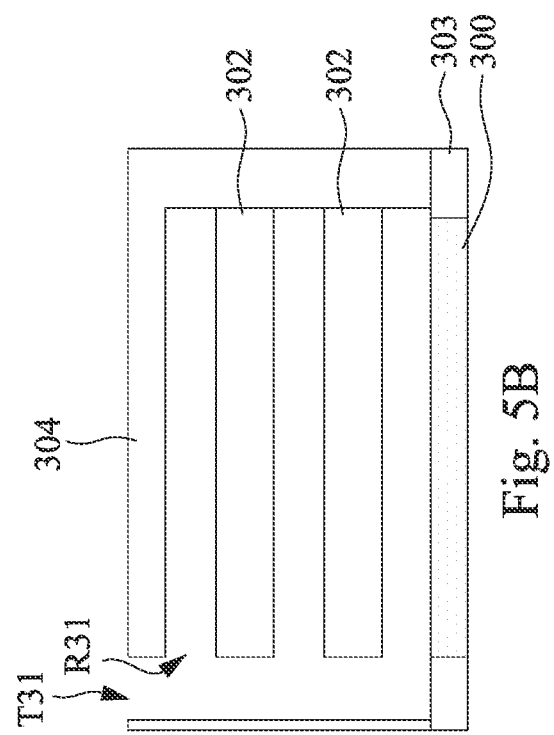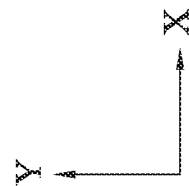

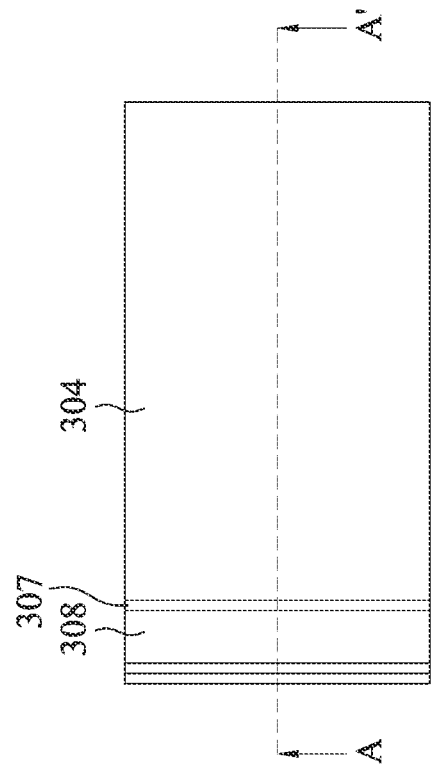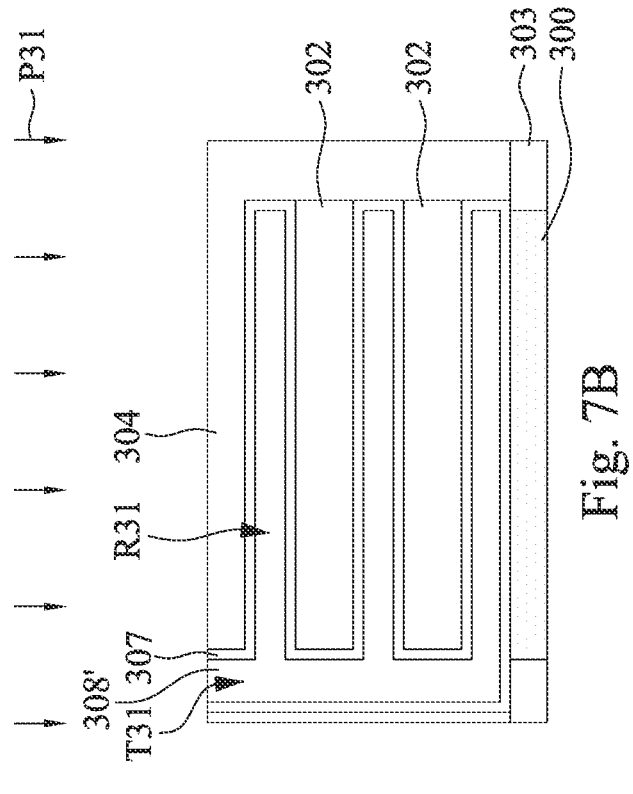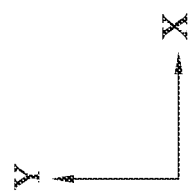

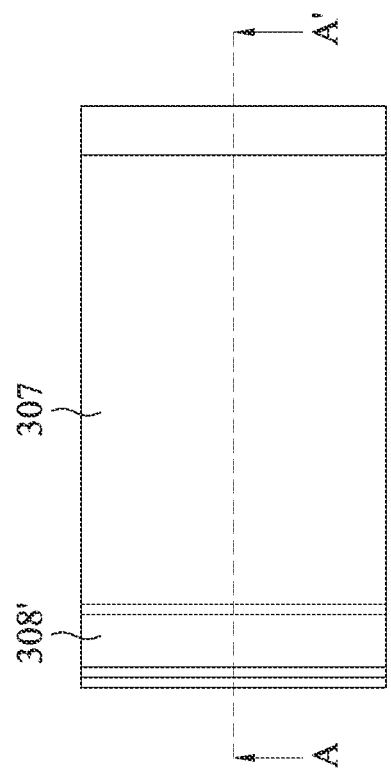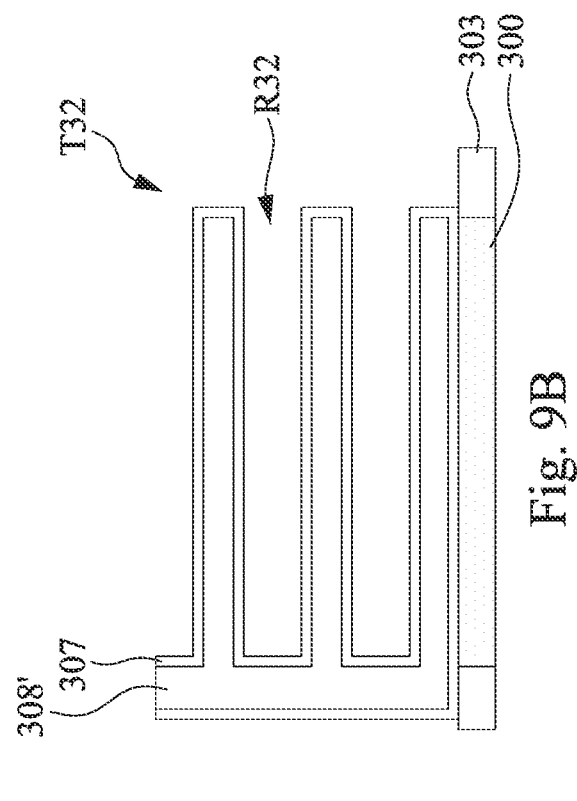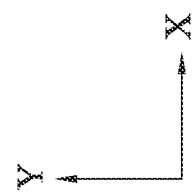

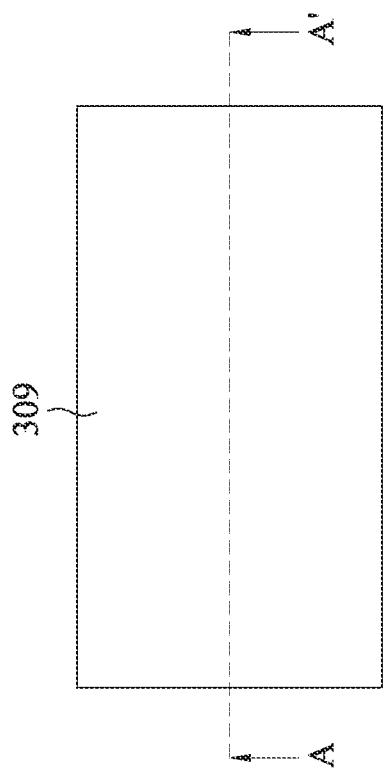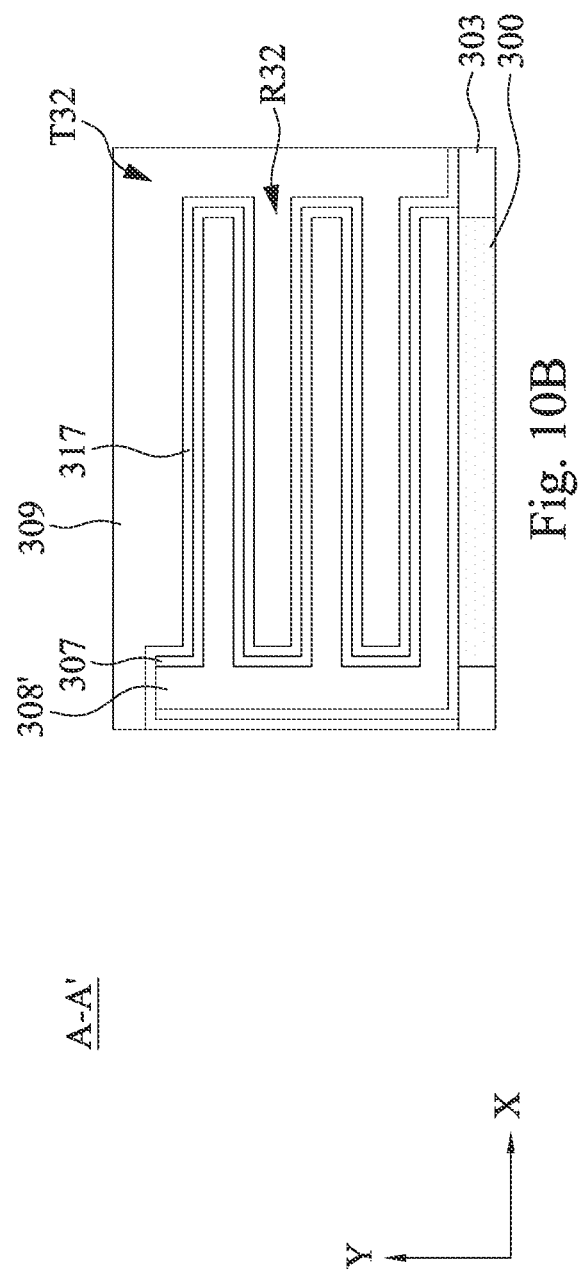

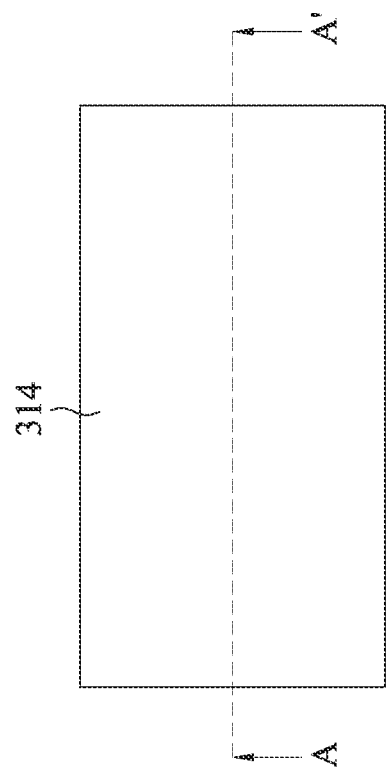
Fig. 12A
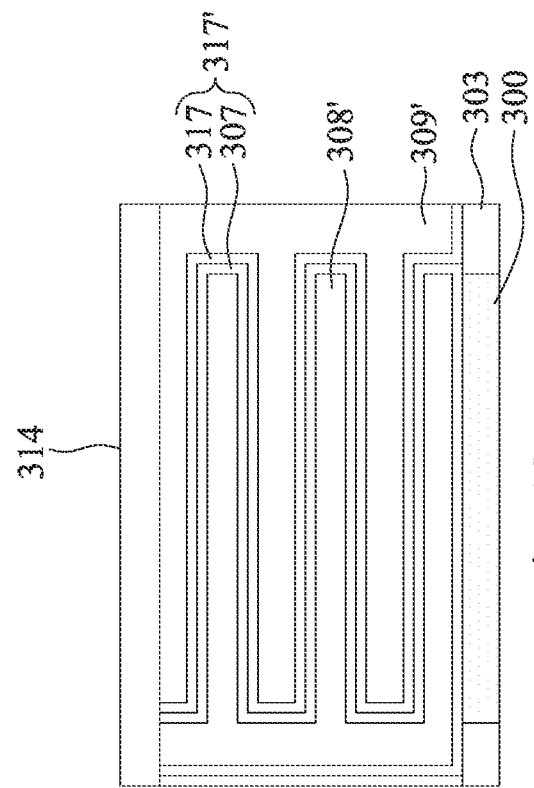
Fig. 12B
A-A'
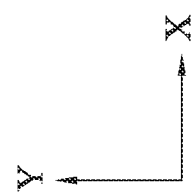

A-A'

M2

| removing the first sacrificial layers in the sacrificial multi-layer stack to form first capacitor recesses over the capacitor region through the first capacitor trench, and removing the dummy gate to form a gate trench over the device region | ~S211 |

| blanket forming a first dielectric layer in the gate trench, the first capacitor trench, and the first capacitor recesses, and then depositing a first conductive material over first the dielectric layer | ~S212 |

| performing a second planarization process is performed to remove the excessive first dielectric layer and the first conductive material above the top surface of the first dielectric material to form a replacement gate structure in the gate trench and a first electrode of a vertically stacked multi-layer metal-insulator-metal (MIM) capacitor in the first capacitor trench and the first capacitor recesses | ~S213 |

| removing the first dielectric material over the capacitor region to form a second capacitor trench that exposes the second sacrificial layers | ~S214 |

| removing the second sacrificial layers to form second capacitor recesses over the capacitor region through the second capacitor trench | ~S215 |

| blanket forming a second dielectric layer over the substrate and in the second capacitor trench and the second capacitor recesses, and depositing a second conductive material over the second dielectric layer | ~S216 |

Fig. 14B

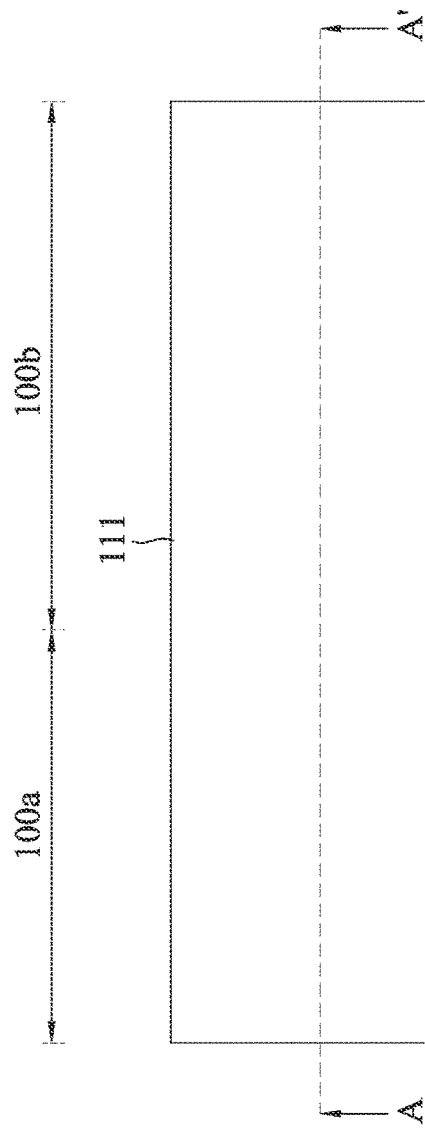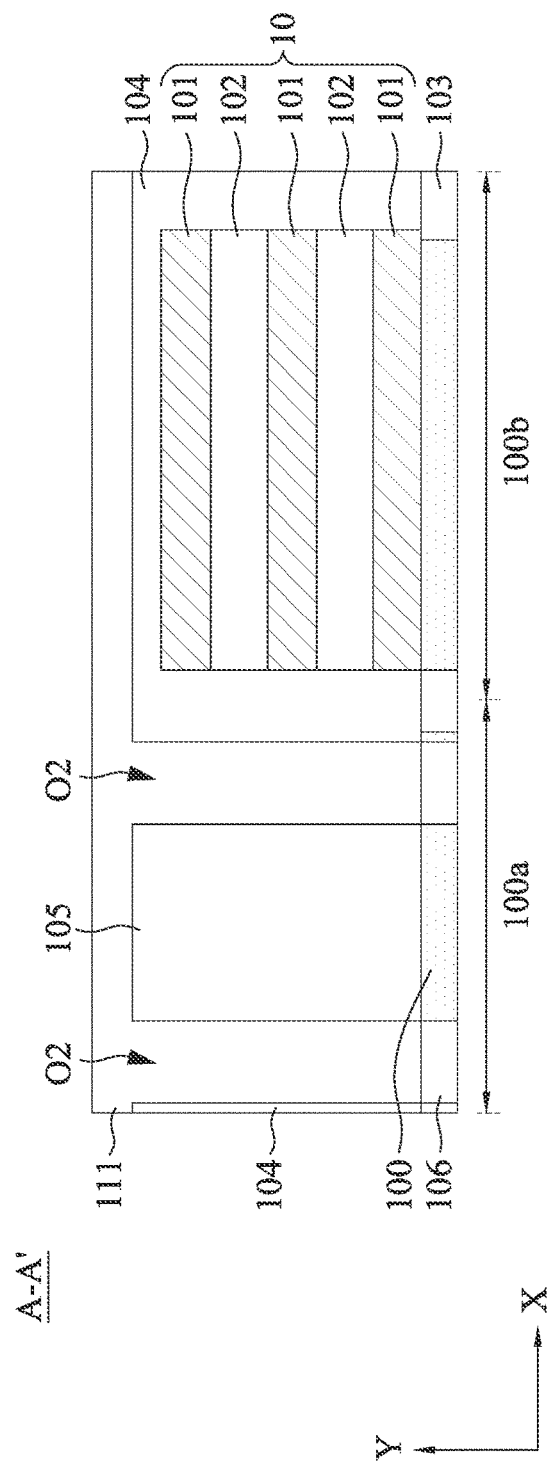

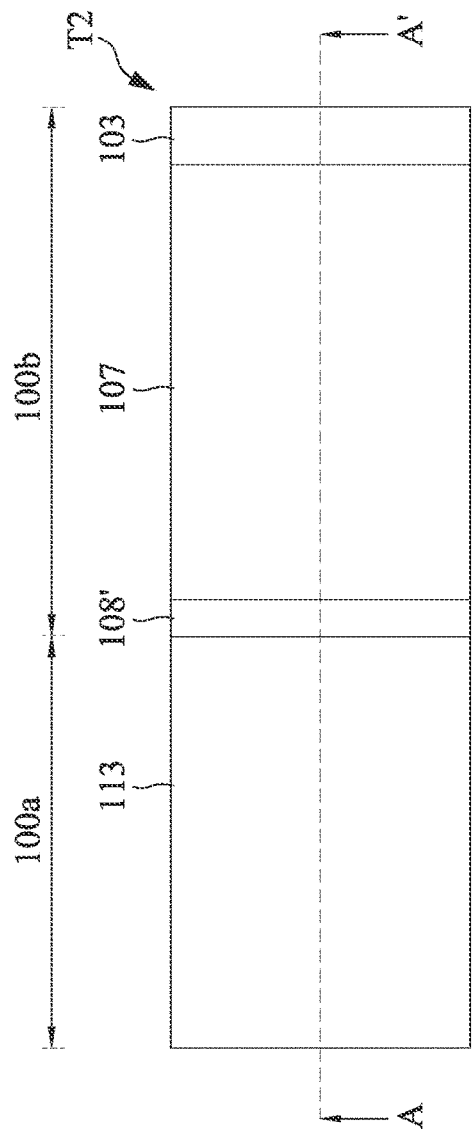
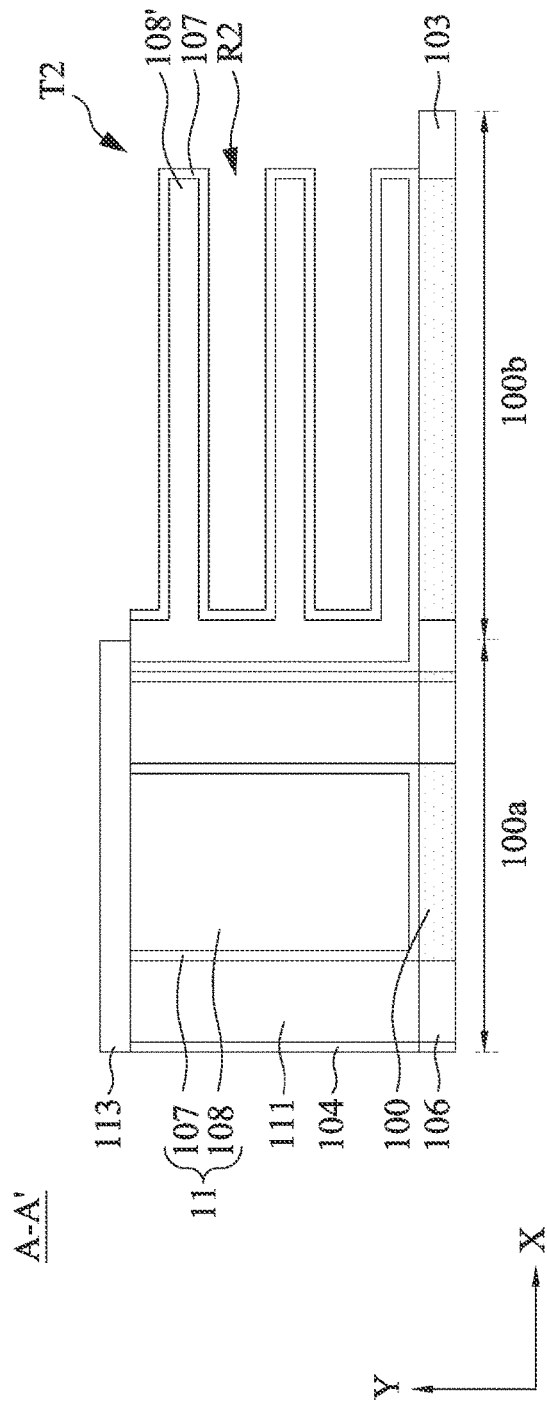

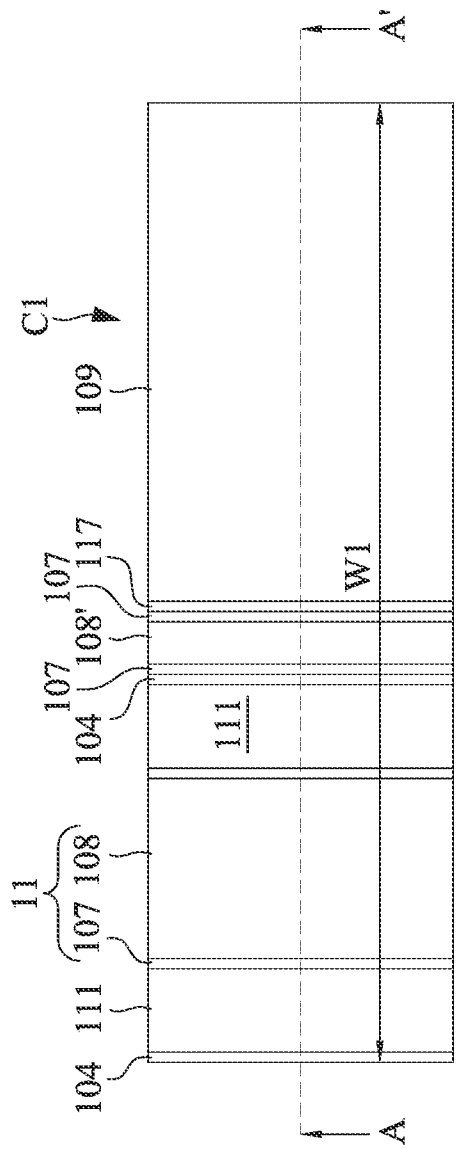
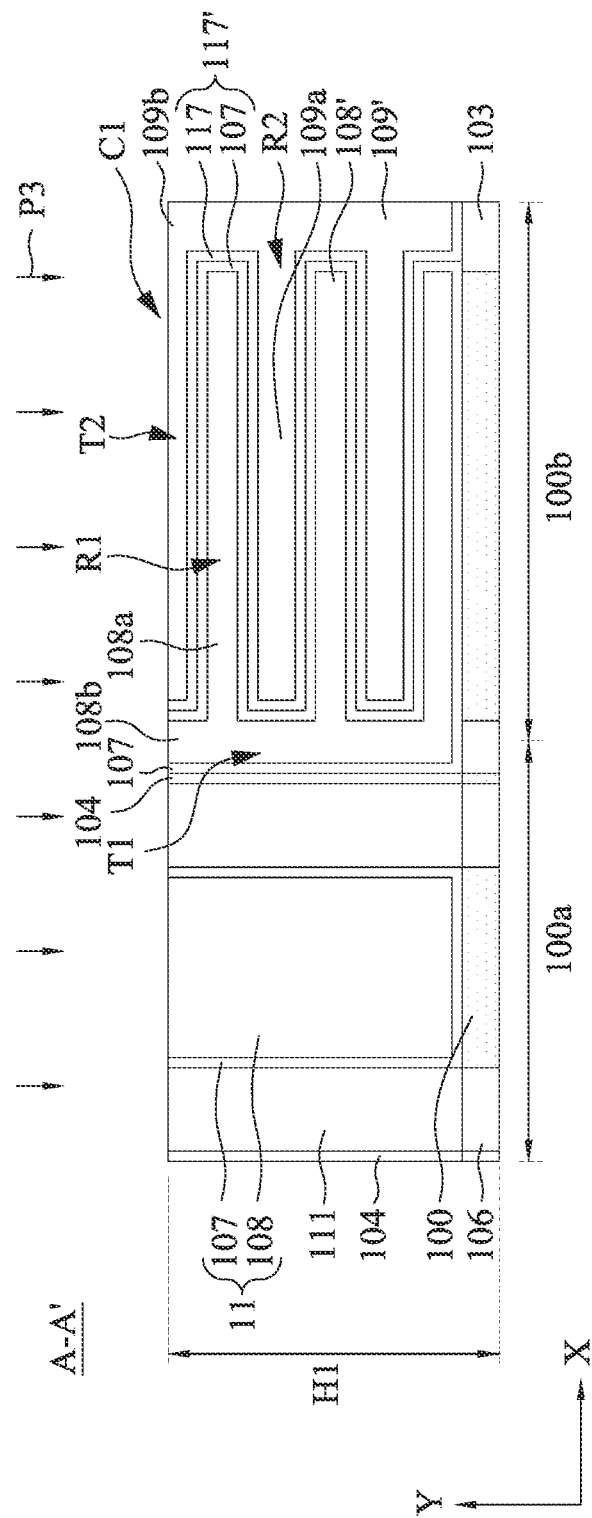
Fig. 30A
Fig. 30B

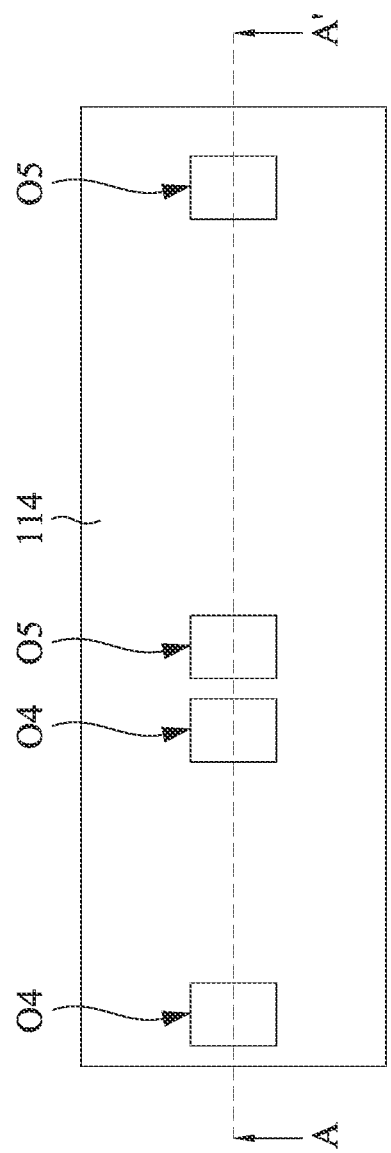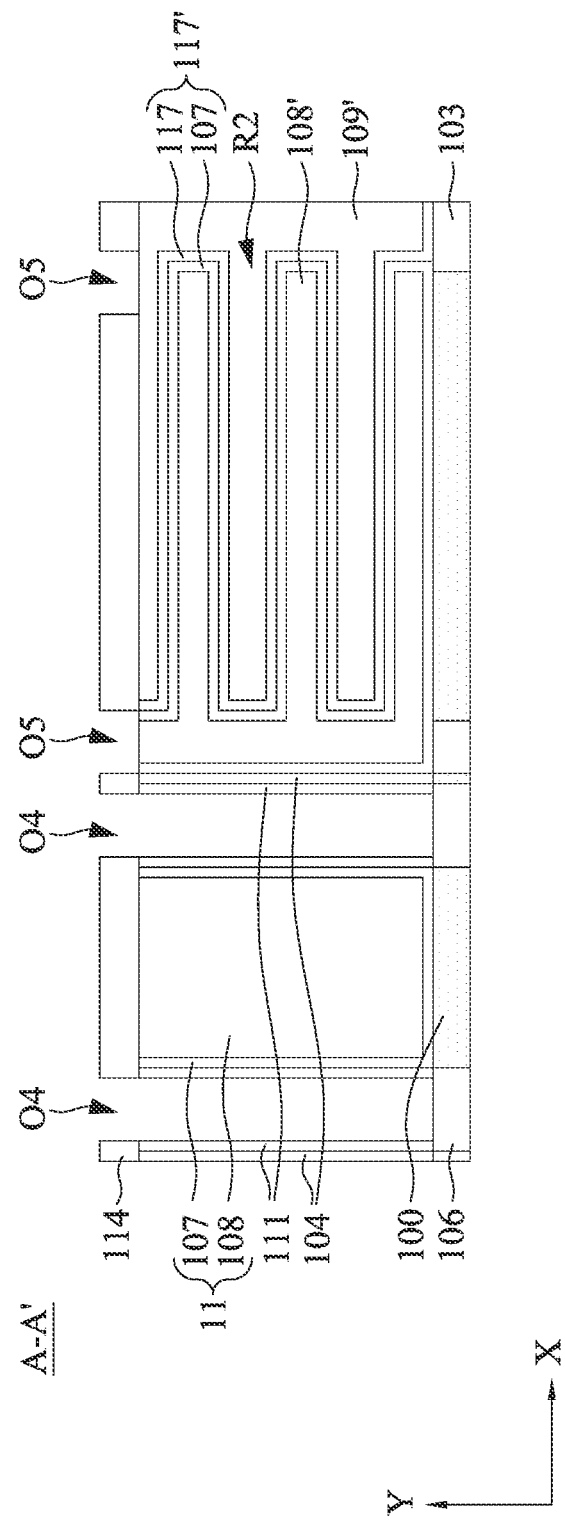

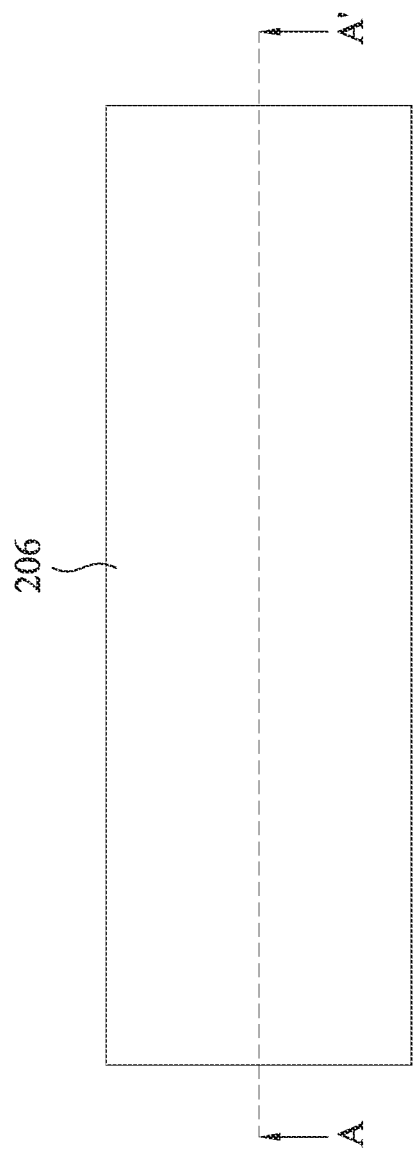

CAPACITOR AND METHOD FOR FORMING THE SAME

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 13B illustrate schematic views of intermediate stages in the formation of a vertically stacked multi-layer MIM capacitor in an integrated circuit in accordance with some embodiments of the present disclosure.

FIGS. 14A, 14B, and 14C are a method M2 of manufacturing an integrated circuit including a vertically stacked multi-layer metal-insulator-metal (MIM) capacitor in front end of the line (FEOL) in accordance with some embodiments of the present disclosure.

FIGS. 15A to 32B illustrate schematic views of intermediate stages in the formation of a vertically stacked multi-layer MIM capacitor in an integrated circuit in accordance with some embodiments of the present disclosure.

DETAILED DESCRIPTION

Figure 1A:
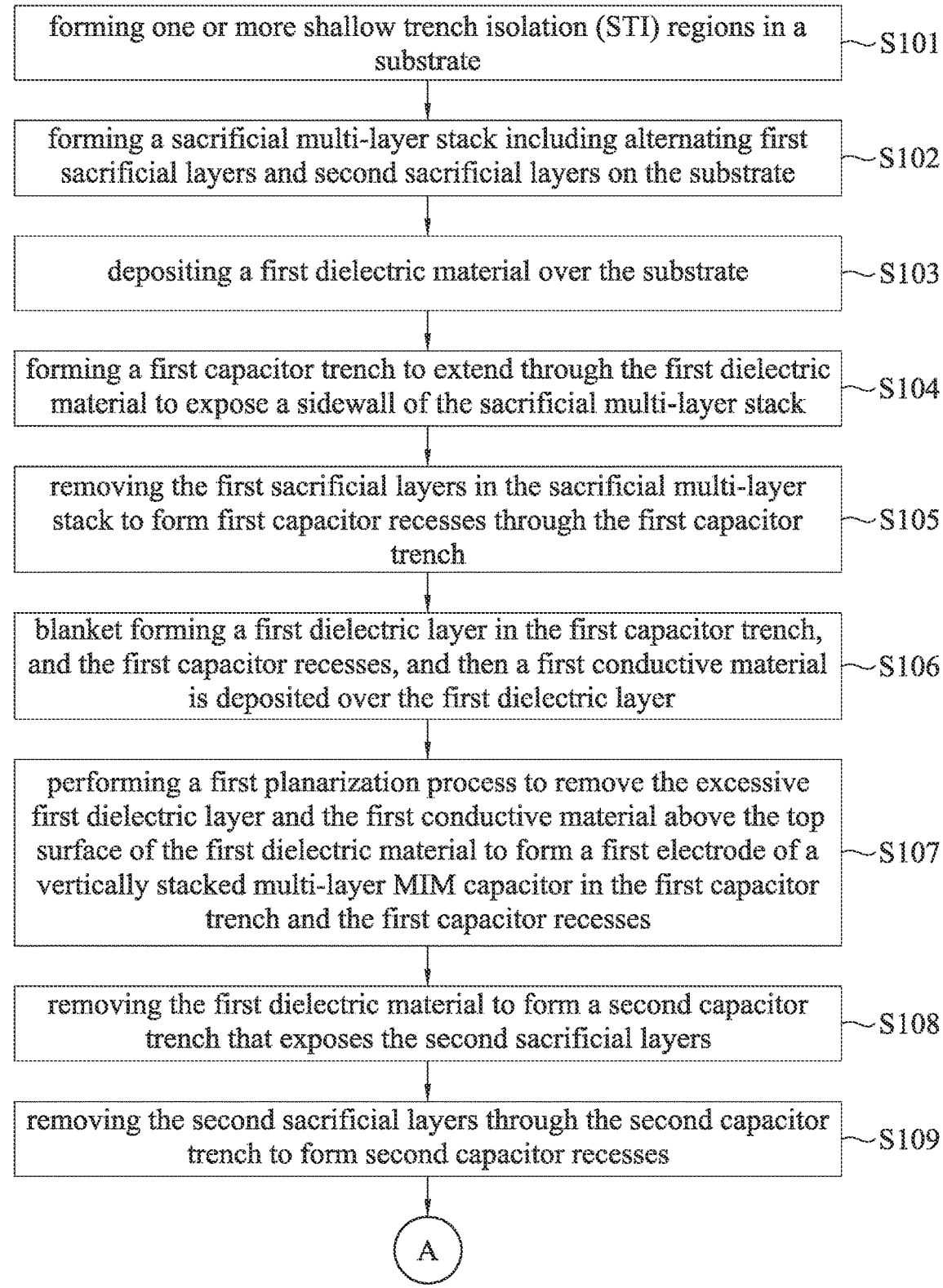
FIGS. 1A and 1B are a method M1 of manufacturing an integrated circuit including a vertically stacked multi-layer metal-insulator-metal (MIM) capacitor in a semiconductor substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to improving the capacitance of a metal-insulator-metal (MIM) capacitor in the integrated circuit (IC) structure, the MIM capacitor may be in the form of a high aspect ratio (AR) cylinder structure or in the form of a multi-layer structure with a plurality of through vias penetrating thereof to increase the capacitance. However, the MIM capacitor in the form of the high AR cylinder structure needs high uniformities of electrodes and insulator to achieve high AR and a cap supporter to prevent the high AR cylinder structure from toppling, and the MIM capacitor in the form of the multi-layer structure with the through vias penetrating thereof may need additional through vias to connect the electrode layers therein, which will result in additional costs and increase the space occupied by the related components in the MIM capacitor.

Therefore, the present disclosure in various embodiments provides a vertically stacked multi-layer MIM capacitor that includes vertically stacked interleaved electrodes. An advantage is that the capacitor of the present disclosure does not require a high AR trench etch process and high uniformity depositions for electrodes and insulator or an additional cap supporter as the high AR cylinder structure and additional through vias as the multi-layer structure, which in turn allows for reducing the manufacturing cost and decreasing the space occupied by the related components in the capacitor. Another advantage is that the vertically stacked interleaved electrodes of the capacitor can increase the overlap area therebetween, such that the capacitance of the capacitor can be improved.

Figure 1B:
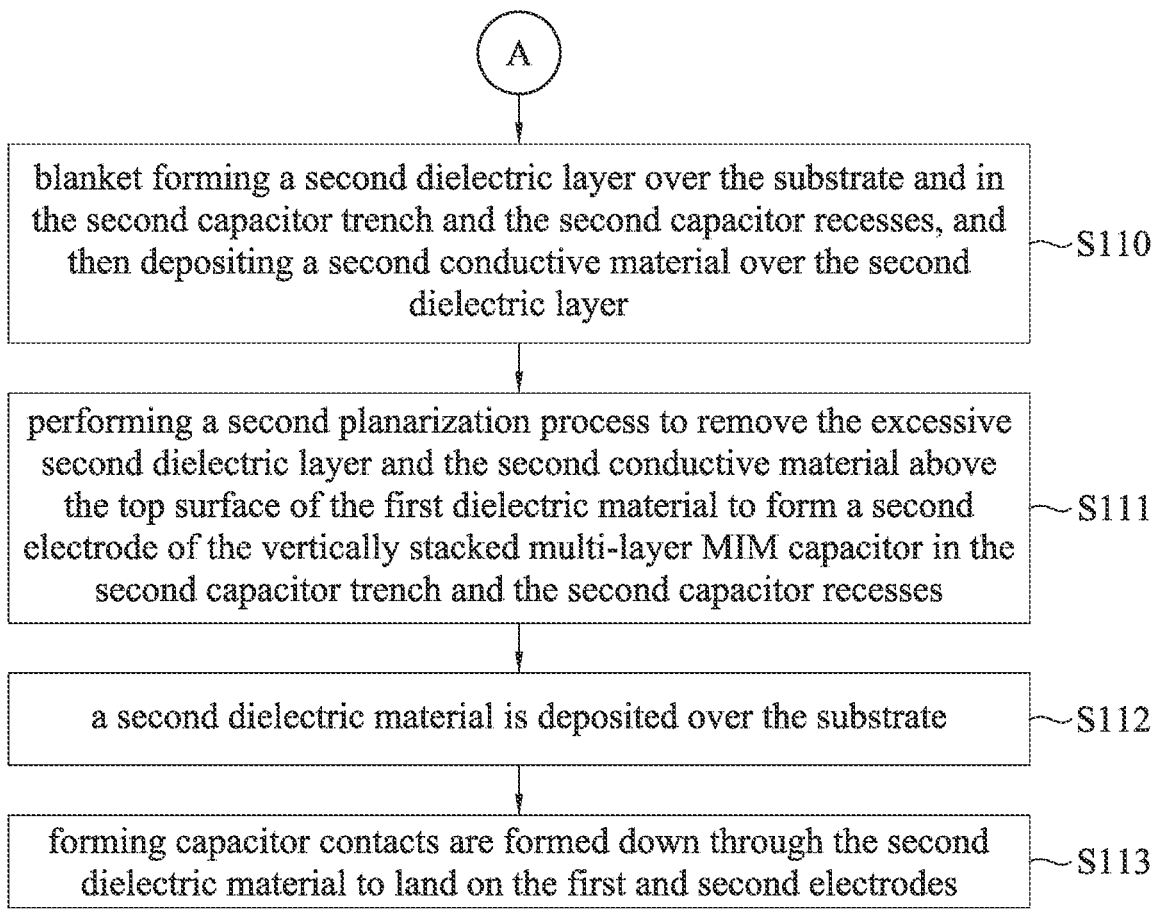

Referring now to FIGS. 1A and 1B, illustrated is a flowchart of an exemplary method M1 for fabrication of an integrated circuit including a vertically stacked multi-layer MIM capacitor on a semiconductor substrate in accordance with some embodiments. The method M1 includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M1 includes fabrication of a semiconductor device. However, the fabrication of the semiconductor device is merely an example for describing the manufacturing process according to some embodiments of the present disclosure.

FIGS. 2A to 13B illustrate schematic views of intermediate stages in the formation of a vertically stacked multi-layer MIM capacitor C0 in an integrated circuit in accordance with some embodiments of the present disclosure. FIGS. 2A, 3A, 4A, 5A, 6A, 7A, 8A, 9A, 10A, 11A, 12A, and 13A are top views of the integrated circuit in accordance with some embodiments of the present disclosure. FIGS. 2B, 3B, 4B, 5B, 6B, 7B, 8B, 9B, 10B, 11B, 12B, and 13B are cross-sectional views obtained from a vertical plane corresponding to line A-A' in FIGS. 2A, 3A, 4A, 5A, 6A, 7A, 8A, 9A, 10A, 11A, 12A, and 13A.

The method M1 begins at block S101 where one or more shallow trench isolation (STI) regions are formed in a substrate. With reference to FIGS. 2A and 2B, in some embodiments of block S101, a STI region is formed in a substrate 300. Formation of the STI region 303 includes, by way of example and not limitation, etching the substrate 300 to form one or more trenches, depositing one or more dielectric materials (e.g., silicon oxide) to overfill the trenches in the substrate 300, followed by a CMP process to planarize the one or more STI region 303 with the substrate 300.

In some embodiments, the substrate 300 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 300 may include an epitaxial layer (epi-layer), which may be strained for performance enhancement, and/or may include a silicon-on-insulator (SOI) structure.

Referring back to FIG. 1A, the method M1 then proceeds to block S102 where a sacrificial multi-layer stack including alternating first sacrificial layers and second sacrificial layers is form on the substrate. With reference to FIGS. 2A and 2B, in some embodiments of block S102, a sacrificial multi-layer stack 30 is formed over the substrate 300. The sacrificial multi-layer stack 30 includes alternating first sacrificial layers 301 and second sacrificial layers 302. In some embodiments, as will be subsequently described in greater detail, the first sacrificial layers 301 and the second sacrificial layers 302 will be removed in sequence as shown in FIGS. 5B and 9B. The second semiconductor material of the second sacrificial layers 302 may be a material that has a different etching selectivity than the etching of the first sacrificial layers 301. The first sacrificial layers 301 are formed of a different material than the second sacrificial layers 302. For example, the first sacrificial layers 301 are formed of a first semiconductor material, and the second sacrificial layers 302 are formed of a second semiconductor material different than the first sacrificial layers 301. The first and second semiconductor materials may each be selected from the candidate semiconductor materials of the substrate 300.

In some embodiments, the first semiconductor material of the first sacrificial layers 301 may be a material, such as silicon, germanium, stannum, silicon carbide, silicon germanium, germanium stannum, silicon germanium stannum, a III-V compound semiconductor, a II-VI compound semiconductor, or the like. The second semiconductor material of the second sacrificial layers 302 may be a material, such as silicon germanium (e.g., $Si_xGe_{1-x}$, where x can be in the range of 0 to 1), pure germanium, a III-V compound semiconductor, a II-VI compound semiconductor, or the like. The first semiconductor material and the second semiconductor material may have a high etching selectivity from the etching of one another. By way of example but not limiting the present disclosure, the first semiconductor material of the first sacrificial layers 301 may be silicon, and the second semiconductor material of the second sacrificial layers 302 may be silicon germanium (e.g., $Si_xGe_{1-x}$) and have a germanium atomic concentration in a range from about 15% to about 35%, such as about 15, 20, 25, 30, or 35%. In some embodiments, the sacrificial multi-layer stack 30 includes three layers of the first sacrificial layers 301 and two layers of the second sacrificial layers 302. It should be appreciated that the sacrificial multi-layer stack 30 may include any number of the first sacrificial layers 301 and the second sacrificial layers 302. By way of example but not limiting the present disclosure, a number of the first sacrificial layers 301 and the second sacrificial layers 302 may be in a range from about 1 to about 1000.

In some embodiments, each of the layers of the sacrificial multi-layer stack 30 may be grown by a process such as vapor phase epitaxy (VPE) or molecular beam epitaxy (MBE), deposited by a process such as chemical vapor deposition (CVD) or atomic layer deposition (ALD), or the like. Subsequently, the sacrificial multi-layer stack 30 is patterned by using suitable photolithography and etching techniques, resulting in a fin-like stack.

Referring back to FIG. 1A, the method M1 then proceeds to block S103 where a first dielectric material is deposited over the substrate. With reference to FIGS. 3A and 3B, in some embodiments of block S103, a dielectric material 304 is deposited over the substrate 300. In some embodiments, the dielectric material 304 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bisbenzocyclobutenes (BCB), or polyimide. In some embodiments, the dielectric materials used to form the dielectric material 304 may be deposited using any suitable method, such as CVD, physical vapor deposition (PVD), ALD, PEALD, PECVD, SACVD, FCVD, spin-on, and/or the like, or a combination thereof. In some embodiments, the dielectric material 304 can be interchangeably referred to a hard mask layer.

Referring back to FIG. 1A, the method M1 then proceeds to block S104 where a first capacitor trench is formed to extend through the first dielectric material to expose a sidewall of the sacrificial multi-layer stack. With reference to FIGS. 4A and 4B, in some embodiments of block S104, a first capacitor trench T31 is formed to extend through the dielectric material 304 to expose a sidewall of the sacrificial multi-layer stack 30. For example, a patterned mask (not shown) may be formed over the dielectric material 304 and used to etch the first capacitor trench T31 that extend through the dielectric material 304 by using photolithography and etching techniques to expose the sidewall of the sacrificial multi-layer stack 30. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). After the formation of the first capacitor trench T31, the patterned mask can be removed by a suitable technique, such as a wet clean process, an ashing process, or the like. In some embodiments, the first capacitor trench T31 can be interchangeably referred to a first capacitor opening.

Referring back to FIG. 1A, the method M1 then proceeds to block S105 where the first sacrificial layers in the sacrificial multi-layer stack are removed to form first capacitor recesses through the first capacitor trench. With reference to FIGS. 5A and 5B, in some embodiments of block S105, the first sacrificial layers 101 (see FIG. 4B) in the sacrificial multi-layer stack 30 (see FIG. 4B) are removed in one or more etching process, so that the first capacitor recesses R31 are formed over the substrate 300. The first capacitor recesses R31 expose three side surfaces of each of the second sacrificial layers 302. In some embodiments, the first sacrificial layers 101 are removed by an anisotropic dry etch process. For example, the etching process may include a dry etch process using reaction gas(es) that selectively etch the first sacrificial layers 301 at a faster rate than the dielectric material 304 and the second sacrificial layers 302. In some embodiments, when the first sacrificial layers 301 as shown in FIG. 4B are formed of silicon, the second sacrificial layers 302 may be formed of silicon germanium. In some embodiments, the first capacitor recesses R31 can be interchangeably referred to capacitor electrode spaces inheriting the shapes of the first sacrificial layers 301.

Figure 6A:
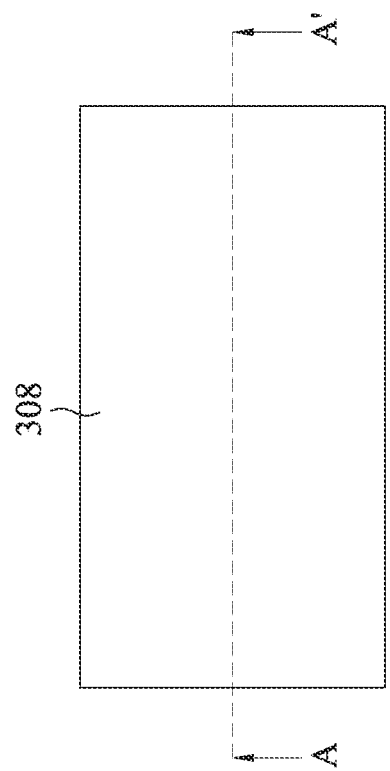
Figure 6B:
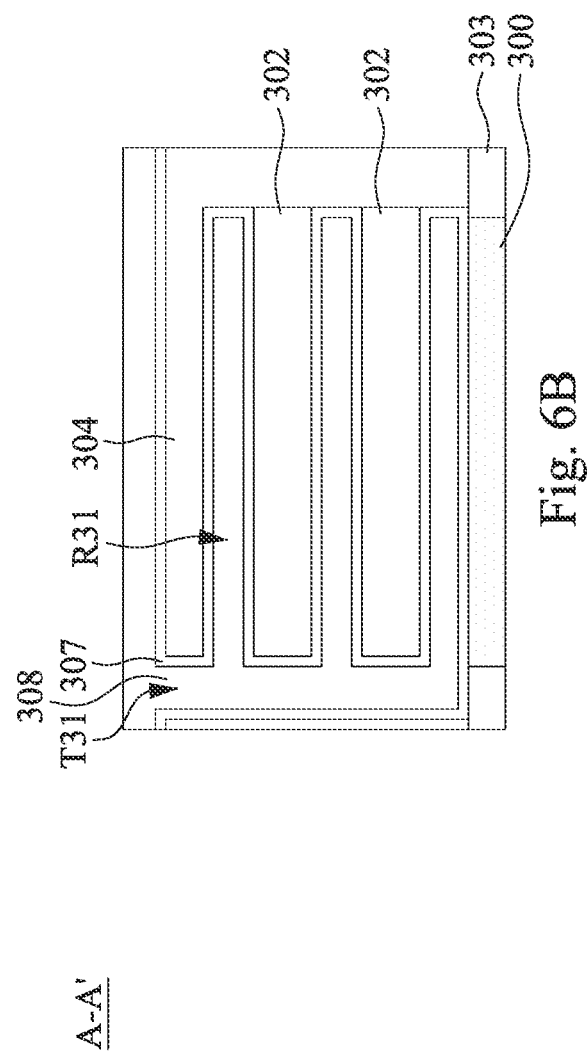

Referring back to FIG. 1A, the method M1 then proceeds to block S106 where a first dielectric layer is blanket formed in the first capacitor trench, and the first capacitor recesses, and then a first conductive material is deposited over the dielectric layer. With reference to FIGS. 6A and 6B, in some embodiments of block S106, a dielectric layer 307 is blanket formed over the substrate 300 and in the first capacitor trench T31, and the first capacitor recesses R31. Subsequently, a conductive material 308 is deposited over the dielectric layer 307. In some embodiments, an interface between the dielectric layer 307 and the conductive material 308 can be smooth or rough.

In some embodiments, the dielectric layer 307 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 307 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 307 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 307 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 307 may be deposited using any suitable method, such as CVD, physical vapor deposition (PVD), ALD, PEALD, PECVD, SACVD, FCVD, spin-on, and/or the like, or a combination thereof.

In some embodiments, the conductive material 308 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC), aluminides, and/or other suitable materials. In alternative embodiments, the conductive material 308 may include, but are not limited to, titanium nitride (TiN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the conductive material 308 may be deposited using any suitable method, such as CVD, physical vapor deposition (PVD), ALD, PEALD, PECVD, SACVD, FCVD, spin-on, and/or the like, or a combination thereof.

Referring back to FIG. 1A, the method M1 then proceeds to block S107 where a first planarization process is performed to remove the excessive first dielectric layer and the first conductive material above the top surface of the first dielectric material to form a first electrode of a vertically stacked multi-layer MIM capacitor in the first capacitor trench and the first capacitor recesses. With reference to FIGS. 7A and 7B, in some embodiments of block S107, a planarization process P31 is performed to remove the excessive dielectric layer 307 and the conductive material 308 (see FIG. 6B) above the top surface of the dielectric material 304 to form a first electrode 308' of a vertically stacked multi-layer MIM capacitor C0 (see FIG. 11B) in the first capacitor trench T31 and the first capacitor recesses R31.

Figure 8A:
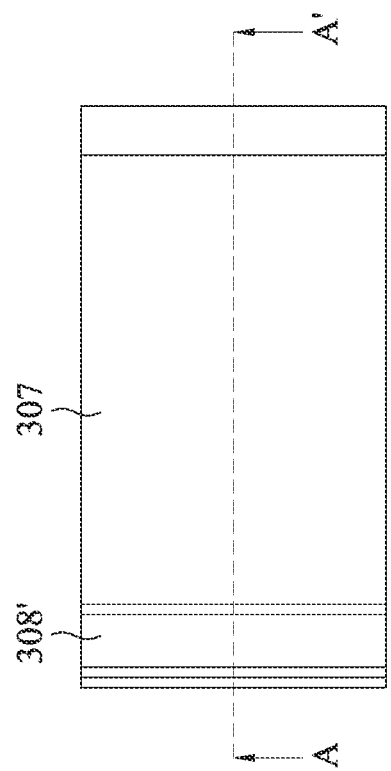
Figure 8B:
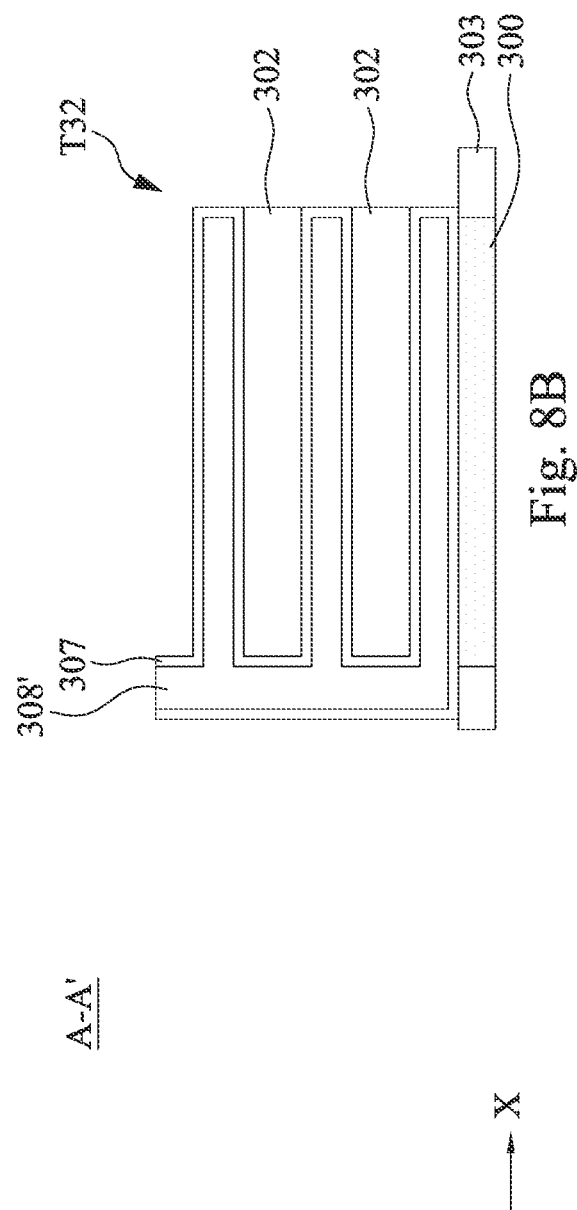

Referring back to FIG. 1B, the method M1 then proceeds to block S108 where the first dielectric material is removed to form a second capacitor trench that exposes the second sacrificial layers. With reference to FIGS. 8A and 8B, in some embodiments of block S108, the first dielectric material 304 (see FIG. 7B) is removed to form a second capacitor trench T32 that exposes the second sacrificial layers 302 by an etching process. The etching process may include dry etching, wet etching, and/or other etching methods (e.g., reactive ion etching). For example, the etching process may include a dry etch process using reaction gas(es) that selectively etch the dielectric material 304 at a faster rate than the dielectric layer 307 and the first electrode 308'. In some embodiments, the second capacitor trench T32 can be interchangeably referred to a second capacitor opening.

Referring back to FIG. 1A, the method M1 then proceeds to block S109 where the second sacrificial layers are moved through the second capacitor trench to form second capacitor recesses. With reference to FIGS. 9A and 9B, in some embodiments of block S109, the second sacrificial layers 302 (see FIG. 8B) are moved in one or more etching process through the second capacitor trench T32, so that second capacitor recesses R32 are formed. For example, the second sacrificial layers 302 are removed by a suitable etching techniques, such as dry etching, wet etching, and/or other etching methods (e.g., reactive ion etching). In some embodiments, the second sacrificial layers 302 are removed by an anisotropic dry etch process. For example, the etching process may include a dry etch process using reaction gas(es) that selectively etch the second sacrificial layers 302 at faster rates than the dielectric layer 307 and the conductive material 308. In some embodiments, the second capacitor recesses R32 can be interchangeably referred to capacitor electrode spaces inheriting the shapes of the second sacrificial layers 302.

Referring back to FIG. 1A, the method M1 then proceeds to block S110 where a second dielectric layer is blanket formed over the substrate and in the second capacitor trench and the second capacitor recesses, and then a second conductive material is deposited over the second dielectric layer. With reference to FIGS. 10A and 10B, in some embodiments of block S110, a dielectric layer 317 is blanket formed over the substrate 300 and in the second capacitor trench T32 and the second capacitor recesses R32. Subsequently, a conductive material 309 is deposited over the dielectric layer 317. In some embodiments, an interface between the dielectric layer 317 and the conductive material 309 can be smooth or rough.

In some embodiments, the dielectric layer 317 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 317 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 317 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 317 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 317 may be made of the same material as the dielectric layer 307. In some embodiments, the dielectric layer 317 may be made of a different material than the dielectric layer 307. In some embodiments, the dielectric layer 307 may be deposited using any suitable method, such as CVD, physical vapor deposition (PVD), ALD, PEALD, PECVD, SACVD, FCVD, spin-on, and/or the like, or a combination thereof.

In some embodiments, the conductive material 309 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the conductive material 309 may include, but are not limited to, titanium nitride (TiN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the conductive material 309 may be made of the same material as the conductive material 308. In some embodiments, the conductive material 309 may be made of a different material than the first electrode 308'. In some embodiments, the conductive material 309 may be deposited using any suitable method, such as CVD, physical vapor deposition (PVD), ALD, PEALD, PECVD, SACVD, FCVD, spin-on, and/or the like, or a combination thereof.

Figure 11A:
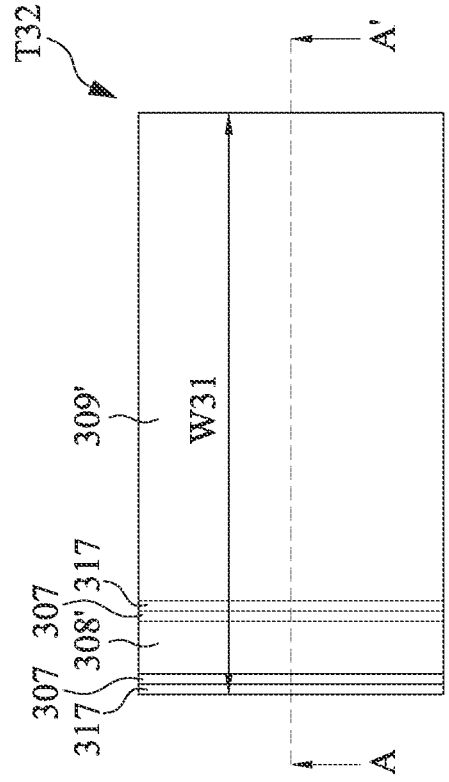
Figure 11B:
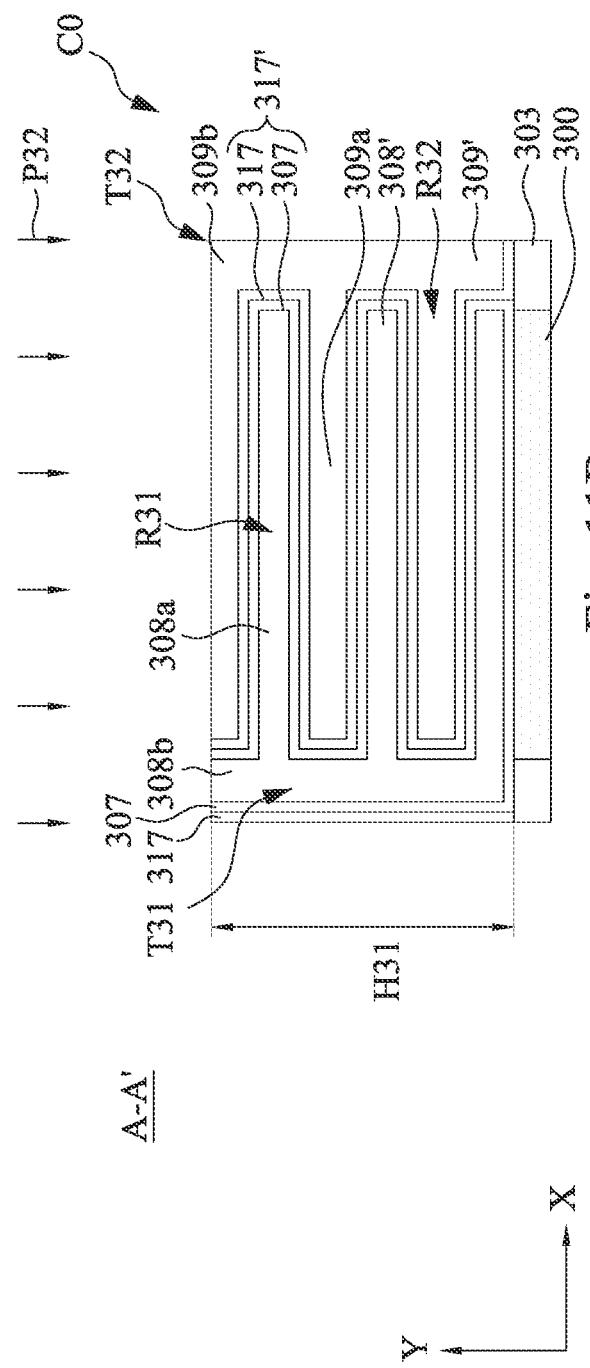

Referring back to FIG. 1B, the method M1 then proceeds to block S111 where a second planarization process is performed to remove the excessive second dielectric layer and the second conductive material above the top surface of the first dielectric material to form a second electrode of the vertically stacked multi-layer MIM capacitor in the second capacitor trench and the second capacitor recesses. With reference to FIGS. 11A and 11B, in some embodiments of block S111, a planarization process P32 (e.g., CMP) is performed to remove the excessive dielectric layer 317 and the conductive material 309 above the top surface of the dielectric material 304 to form a second electrode 309' of the vertically stacked multi-layer MIM capacitor C0 in the second capacitor trench T32 and the second capacitor recesses R32. In some embodiments, the dielectric layers 307 and 317 can be collectively referred to as an insulator 317' of the vertically stacked multi-layer MIM capacitor C0. As a result of this method, the vertically stacked multi-layer MIM capacitor C0 may include the first and second electrode 308' and 309' and the insulator 317' sandwiched between the first and second electrode 308' and 309'.

This is described in greater detail with reference to FIG. 11B, after the planarization process P32, the first electrode 308' of the capacitor C0 can include three lateral portions 308a in, and the second electrode 309' can include three lateral portions 309a interleaving with the lateral portions 308a, by way of example but not limiting the present disclosure. In some embodiments, the capacitor C0 may have a capacitor width W31 in a range from about 45 to about 70 nm, such as about 45, 48, 50, 52, 54, 56, 58, 60, 62, 64, 66, 68, or 70 nm, and a capacitor height H31 in a range from about 1000 to about 2000 nm, such as 1000, 1200, 1400, 1600, 1800, or 2000 nm.

The first electrode 308' of the vertically stacked multi-layer MIM capacitor C0 incudes the first lateral portions 308a formed in the first capacitor recesses R31 and a first vertical portion 308b formed in the first capacitor trench T31. The first lateral portions 308a extend in X-direction, and the first vertical portion 308b extends in Y-direction and connects the first lateral portion 308a. In some embodiments, at least two of the first lateral portions 308a may have different thicknesses. In some embodiments, the first lateral portions 308a may have a thickness in a range from about 0.1 nm to about 1 µm, such as about 0.1, 1, 10, 15, 100, or 1000 nm. The second electrode 309' of the vertically stacked multi-layer MIM capacitor C0 incudes the second lateral portions 309a formed in the second capacitor recesses R32 and a second vertical portion 309b formed in the second capacitor trench T32. The second lateral portions 309a extend in X-direction, and the second vertical portion 309b extends in Y-direction and connects the second lateral portions 309a. The first lateral portions 308a interleave with the second lateral portions 309a. In some embodiments, at least two of the second lateral portions 309a may have different thicknesses. In some embodiments, the second lateral portions 309a may have a thickness in a range from about 0.1 nm to about 1 µm, such as about 0.1, 1, 10, 15, 100, or 1000 nm. In some embodiments, the first and second lateral portions 308a and 309a each may have a length in a range from about 30 nm to about 40 nm, such as 30, 32, 34, 36, 38, or 40 nm.

As shown in FIG. 11B, the first electrode 308' is spaced apart from the second electrode 309' by the insulator 317'. In some embodiments, the insulator 317' may have a thickness in a range from about 0.1 nm to about 100 nm. In some embodiments, a combination of the first lateral portions 308a and the insulator 317' may have a thickness in a range from about 10 to about 30 nm, such as about 10, 15, 20, 25, or 30 nm. In some embodiments, the vertically stacked multi-layer MIM capacitor C0 may be a cylinder, cuboid, thin film, or any suitable geometry, with or without rounded corners. In some embodiments, when viewed from a top view, the vertically stacked multi-layer MIM capacitor C0 may have a dimension (e.g., diameter, width, or length) in a range from about 1 nm to about 10 mm, such as about 1, 10, 100, 1000, 10000, 100000, 1000000, or 1000000 nm.

In some embodiments of the MIM capacitor C0 that has the capacitor height H31 at about 1600 nm and an equivalent oxide thickness (EOT) at about 1 nm, if the first lateral and vertical portions 308a and 308b of the first electrode 308' and the second lateral and vertical portions 309a and 309b of the second electrode 309' each has thickness about 5, 7, or 9 nm, then the capacitance of the capacitor may be about 12.6, 15.2, or 18.9 fF, the capacitance per area may be about 3360, 2700, or 2240 fF/µm². In some embodiments, the capacitance per footprint of one layer of the MIM capacitor C0 may be about 34.5 fF/µm². Therefore, the present disclosure in various embodiments provides a vertically stacked multi-layer MIM capacitor C0 that includes vertically stacked interleaved lateral portions 308a and 309a. An advantage is that the capacitor C0 including vertically stacked interleaved electrodes can increase the overlap area therebetween, such that the capacitance of the capacitor C0 can be improved.

Referring back to FIG. 1B, the method M1 then proceeds to block S112 where a second dielectric material is deposited over the substrate. With reference to FIGS. 12A and 12B, in some embodiments of block S112, a dielectric material 314 is deposited over the substrate 300. In some embodiments, the dielectric material 314 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 314 may be deposited using any suitable method, such as CVD, physical vapor deposition (PVD), ALD, PEALD, PECVD, SACVD, FCVD, spin-on, and/or the like, or a combination thereof. In some embodiments, the dielectric material 314 can be interchangeably referred to a hard mask layer. In some embodiments, the dielectric material 314 may be made of the same material as the dielectric material 304. In some embodiments, the dielectric material 314 may be made of a different material than the dielectric material 304.

Figure 13A:
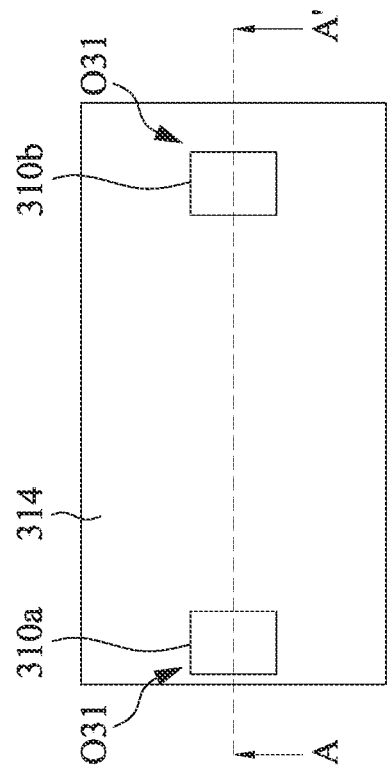
Figure 13B:
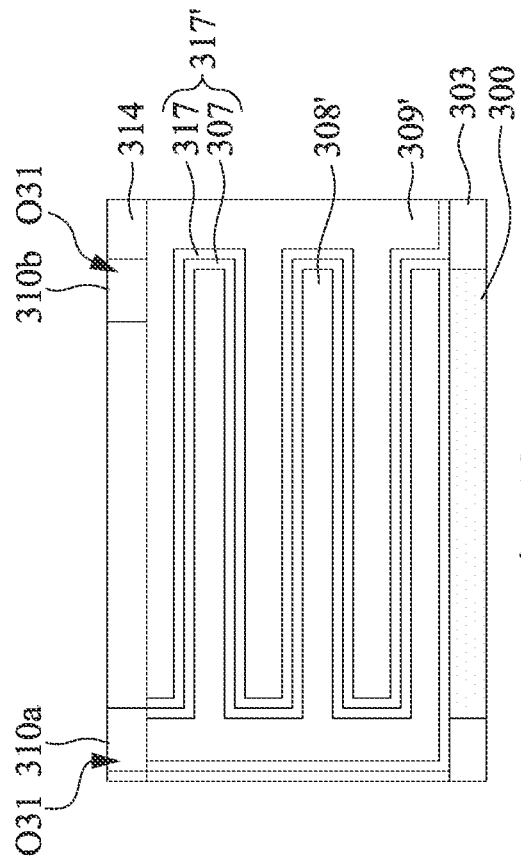

Referring back to FIG. 1B, the method M1 then proceeds to block S113 where capacitor contacts are formed down through the second dielectric material to land on the first and second electrodes. With reference to FIGS. 13A and 13B, in some embodiments of block S113, a plurality of source/drain contact openings O31 are formed down through the dielectric material 314 to expose the first and second electrodes 308' and 309'. Subsequently, a conductive material is deposited over the dielectric material 314 to fill the capacitor contact openings O31. Subsequently, a planarization process (e.g., CMP) is performed to remove the excess conductive material from above a top surface of the dielectric material 314. The remaining conductive material fills the capacitor contact openings O31 and serves as first and second capacitor contacts 310a and 310b. The capacitor contacts 310a and 310b land on the first and second electrodes 108' and 109' of the vertically stacked multi-layer MIM capacitor C1. The capacitor contact 310a may be used to provide the first voltage potential to the first electrode 308', and the capacitor contact 310b may be used to provide the second voltage potential to the second electrode 309' of the vertically stacked multi-layer MIM capacitor C0, the second voltage potential is different than the first voltage potential. In some embodiments, the conductive material may be deposited using any suitable method, such as CVD, physical vapor deposition (PVD), ALD, PEALD, PECVD, SACVD, FCVD, spin-on, and/or the like, or a combination thereof. In some embodiments, the conductive material may include TiN, TaN, Ti, Ta, Cu, Al, Ag, W, Ir, Ru, Pt, combinations thereof, or other suitable conductive materials.

In some embodiments, the vertically stacked multi-layer MIM capacitor can be integrated in FEOL or arbitrary metal layers of BEOL. Specifically, the IC fabrication process can be divided into three modules, in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, various transistors are formed. For example, FEOL includes the formation of source/drain regions, a gate structure, and spacers on sides of the gate structure. The source/drain regions can be doped substrate regions formed with an implantation process after the gate structure formation. The gate structure includes a metal gate electrode, which can include two or more metal layers. The gate dielectric can include a high dielectric constant (high-k) material (e.g., greater than 3.9, which is the dielectric constant of silicon oxide). The metals in the gate electrode set the work function of the gate, in which the work functions can be different between P-type transistors and N-type transistors. The gate dielectric provides electrical isolation between the metal gate electrode and a channel formed between the source and the drain regions when the transistor is in operation.

In MEOL, low level interconnects (contacts) are formed and may include two layers of contacts on top of each other. The MEOL interconnects can have smaller critical dimensions (CDs; e.g., line width) and are spaced closer together compared to their BEOL counterparts. The MEOL contact layers serve to electrically connect the various regions of the transistors, i.e., the source/drain and metal gate electrode, to higher level interconnects in BEOL. A first layer of contacts in MEOL, known as "trench silicide (TS)" or "trench contacts (TC)," are formed over the source and drain regions on either side of the gate structure. In the TS, or TC, configuration, the silicide is formed in the trench and after the trench formation. The silicide lowers the resistance between the source and drain regions and the metal contacts. The gate structure and the first layer of contacts are considered to be on the same "level." The second layers of contacts are formed over the gate electrode and TS. MEOL contacts are embedded in a dielectric material, or a dielectric stack of materials, that ensures their electrical isolation.

In BEOL, an interlayer dielectric (ILD) layer is deposited over the MEOL contacts. The formation of high level interconnects in BEOL involves patterning a hard mask (HM) layer and subsequently etching through the HM layer to form holes and trenches in the ILD layer. The ILD layer can be a low-k material. Low-k materials can have a dielectric constant below 3.9, which is the dielectric constant of silicon oxide (SiO2). Low-k materials in BEOL can reduce unwanted parasitic capacitance and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. An interconnect layer can have one or more vias and one or more lines. BEOL may include multiple interconnect layers (e.g., up to 9 or more) with vias and lines of increasing CD size (e.g., line width) and line pitch. Each interconnect layer is aligned to the previous interconnect layer to ensure proper via and line connectivity.

Figure 14A:
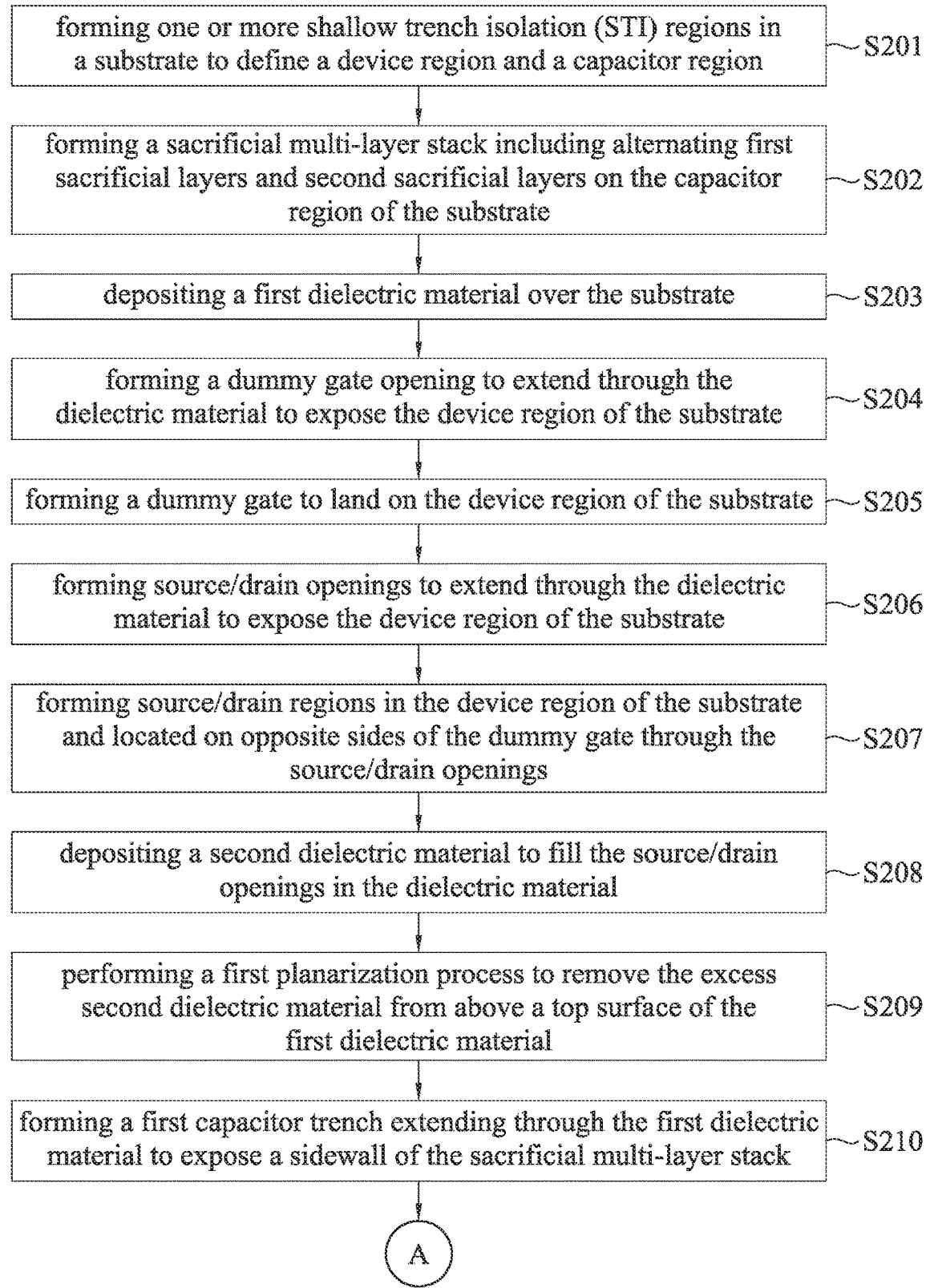
Figure 14C:
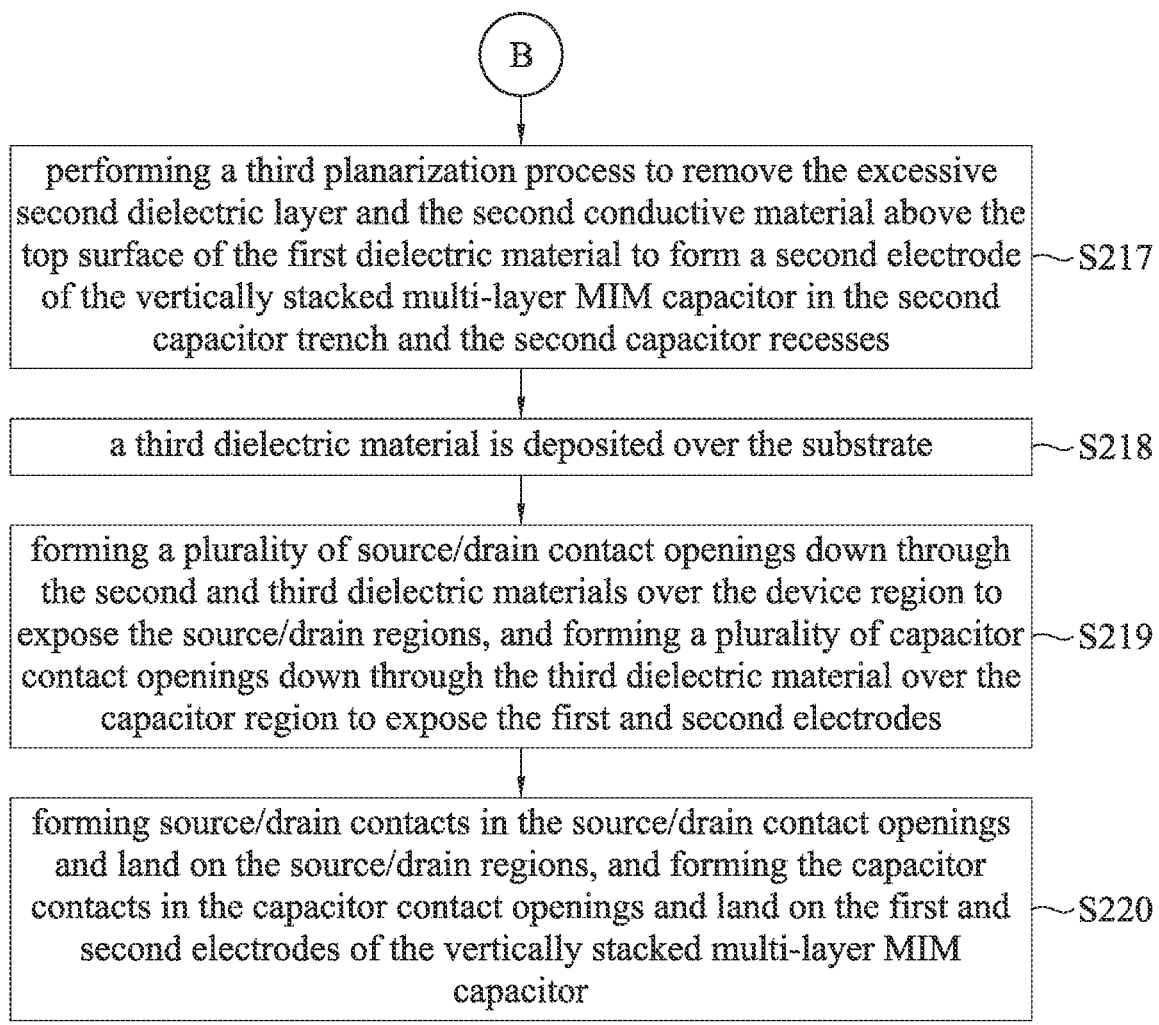

Referring now to FIGS. 14A, 14B, and 14C, illustrated is a flowchart of an exemplary method M2 for fabrication of an integrated circuit including a vertically stacked multi-layer MIM capacitor in FEOL in accordance with some embodiments. The method M2 includes a relevant part of the entire manufacturing process. It is understood that additional operations may be provided before, during, and after the operations shown by FIGS. 14A, 14B, and 14C, and some of the operations described below can be replaced or eliminated for additional embodiments of the method. The order of the operations/processes may be interchangeable. The method M2 includes fabrication of a semiconductor device. However, the fabrication of the semiconductor device is merely an example for describing the manufacturing process according to some embodiments of the present disclosure.

FIGS. 15A to 32B illustrate schematic views of intermediate stages in the formation of a vertically stacked multi-layer MIM capacitor C1 in an integrated circuit in accordance with some embodiments of the present disclosure. FIGS. 15A, 16A, 17A, 18A, 19A, 20A, 21A, 22A, 23A, 24A, 25A, 26A, 27A, 28A, 29A, 30A, 31A, and 32A are top views of the integrated circuit in accordance with some embodiments of the present disclosure. FIGS. 15B, 16B, 17B, 18B, 19B, 20B, 21B, 22B, 23B, 24B, 25B, 26B, 27B, 28B, 29B, 30B, 31B, and 32B are cross-sectional views obtained from a vertical plane corresponding to line A-A' in FIGS. 15A, 16A, 17A, 18A, 19A, 20A, 21A, 22A, 23A, 24A, 25A, 26A, 27A, 28A, 29A, 30A, 31A, and 32A.

Figure 15A:
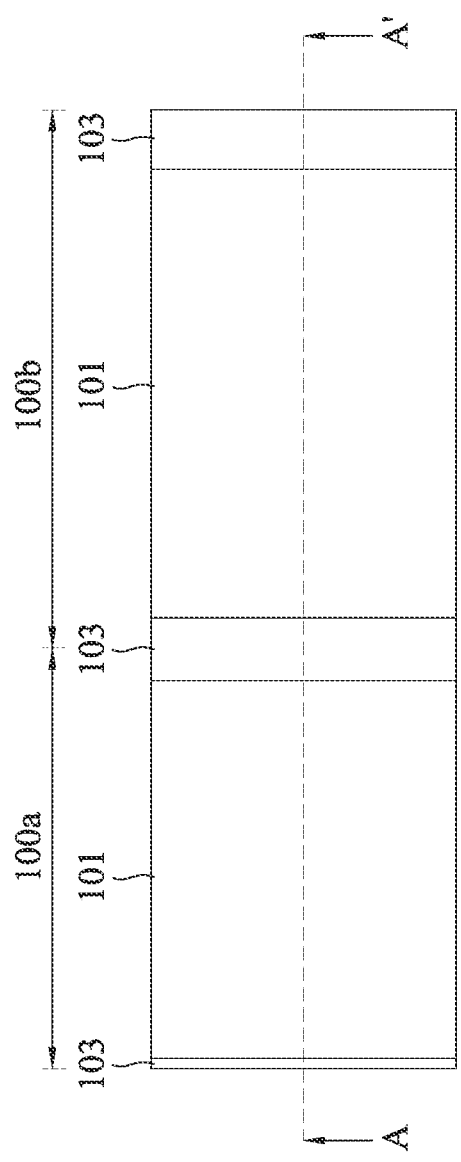
Figure 15B:
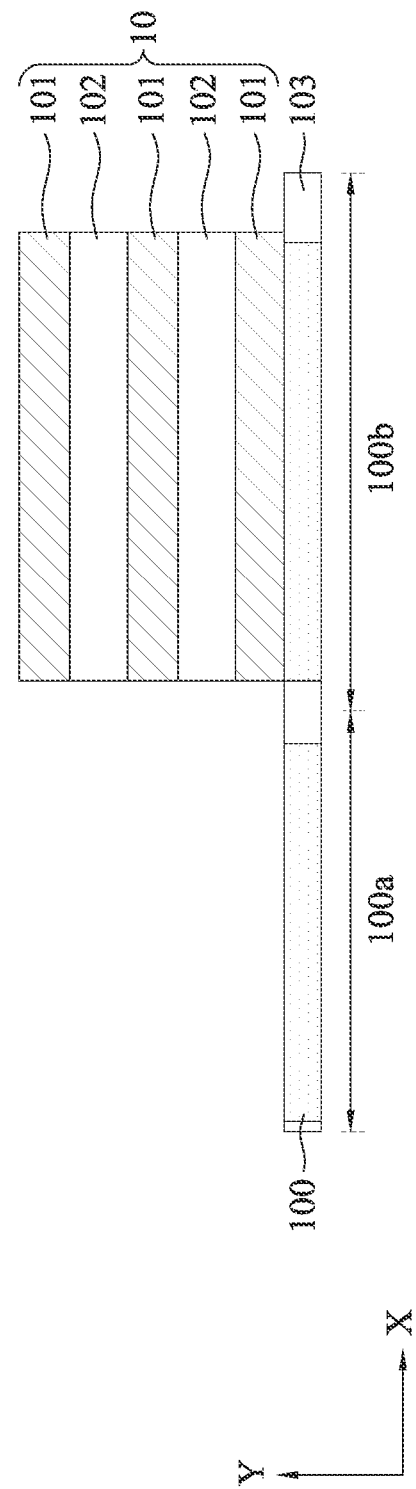

The method M2 begins at block S201 where one or more shallow trench isolation (STI) regions are formed in a substrate to define a device region and a capacitor region. With reference to FIGS. 15A and 15B, in some embodiments of block S201, a STI region 103 are formed in a substrate 100 to define a device region 100a and a capacitor region 100b. Formation of the STI regions includes, by way of example and not limitation, etching the substrate 100 to form one or more trenches that define the device region 100a and the capacitor region 100b, depositing one or more dielectric materials (e.g., silicon oxide) to overfill the trenches in the substrate 100, followed by a CMP process to planarize the one or more STI regions 103 with the substrate 100.

In some embodiments, the substrate 100 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 100 may include an epitaxial layer (epi-layer), which may be strained for performance enhancement, and/or may include a silicon-on-insulator (SOI) structure.

Figure 24A:
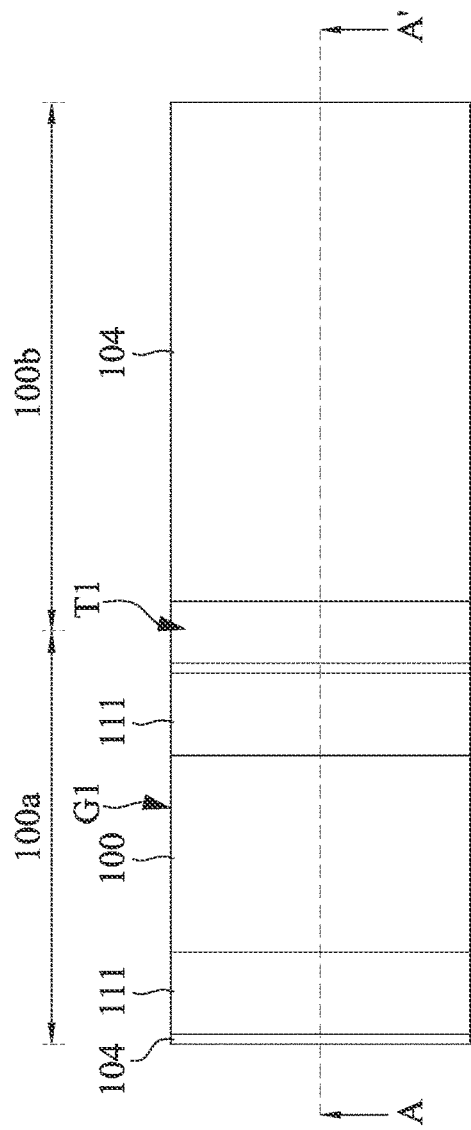
Figure 24B:
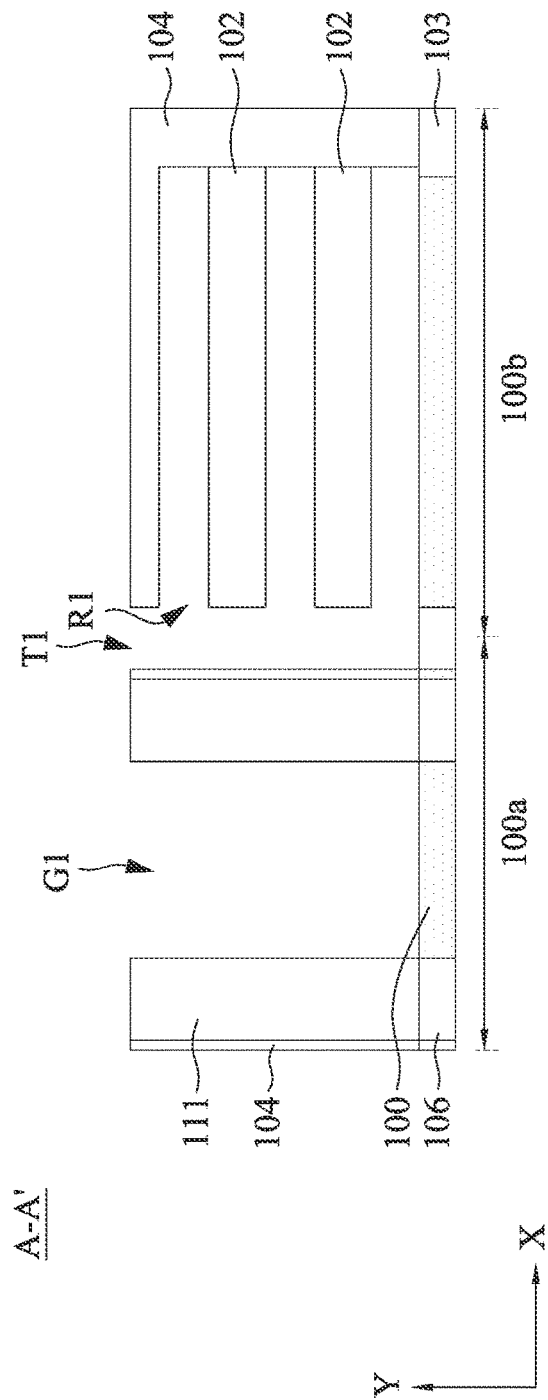

Referring back to FIG. 14A, the method M2 then proceeds to block S202 where a sacrificial multi-layer stack including alternating first sacrificial layers and second sacrificial layers is form on the capacitor region of the substrate. With reference to FIGS. 15A and 15B, in some embodiments of block S202, a sacrificial multi-layer stack 10 is formed over the capacitor region 100b of the substrate 100. The sacrificial multi-layer stack 10 includes alternating first sacrificial layers 101 and second sacrificial layers 102. In some embodiments, as will be subsequently described in greater detail, the first sacrificial layers 101 and the second sacrificial layers 102 will be removed in sequence as shown in FIGS. 24B and 28B. The second semiconductor material of the second sacrificial layers 102 may be a material that has a different etching selectivity than the etching of the first sacrificial layers 101. The first sacrificial layers 101 are formed of a different material than the second sacrificial layers 102. For example, the first sacrificial layers 101 are formed of a first semiconductor material, and the second sacrificial layers 102 are formed of a second semiconductor material different than the first sacrificial layers 101. The first and second semiconductor materials may each be selected from the candidate semiconductor materials of the substrate 100.

In some embodiments, the first semiconductor material of the first sacrificial layers 101 may be a material, such as silicon, germanium, stannum, silicon carbide, silicon germanium, germanium stannum, silicon germanium stannum, a III-V compound semiconductor, a II-VI compound semiconductor, or the like. The second semiconductor material of the second sacrificial layers 102 may be a material, such as silicon germanium (e.g., $Si_xGe_{1-x}$, where x can be in the range of 0 to 1), pure germanium, a III-V compound semiconductor, a II-VI compound semiconductor, or the like. The first semiconductor material and the second semiconductor material may have a high etching selectivity from the etching of one another. By way of example but not limiting the present disclosure, the first semiconductor material of the first sacrificial layers 101 may be silicon, and the second semiconductor material of the second sacrificial layers 102 may be silicon germanium (e.g., $Si_xGe_{1-x}$) and have a germanium atomic concentration in a range from about 15% to about 35%, such as about 15, 20, 25, 30, or 35%. In some embodiments, the sacrificial multi-layer stack 10 includes three layers of the first sacrificial layers 101 and two layers of the second sacrificial layers 102. It should be appreciated that the sacrificial multi-layer stack 10 may include any number of the first sacrificial layers 101 and the second sacrificial layers 102. By way of example but not limiting the present disclosure, a number of the first sacrificial layers 101 and the second sacrificial layers 102 may be in a range from about 1 to about 1000.

In some embodiments, each of the layers of the sacrificial multi-layer stack 10 may be grown by a process such as vapor phase epitaxy (VPE) or molecular beam epitaxy (MBE), deposited by a process such as chemical vapor deposition (CVD) or atomic layer deposition (ALD), or the like. Subsequently, the sacrificial multi-layer stack 10 is patterned by using suitable photolithography and etching techniques, resulting in a fin-like stack having a same width as the underlying substrate 100 in the capacitor region 100b.

Figure 16A:
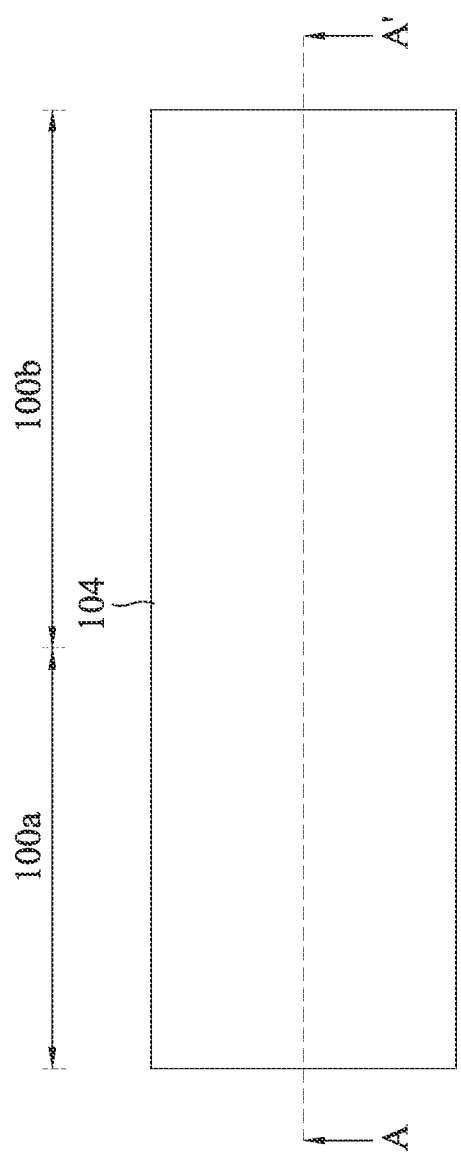
Figure 16B:
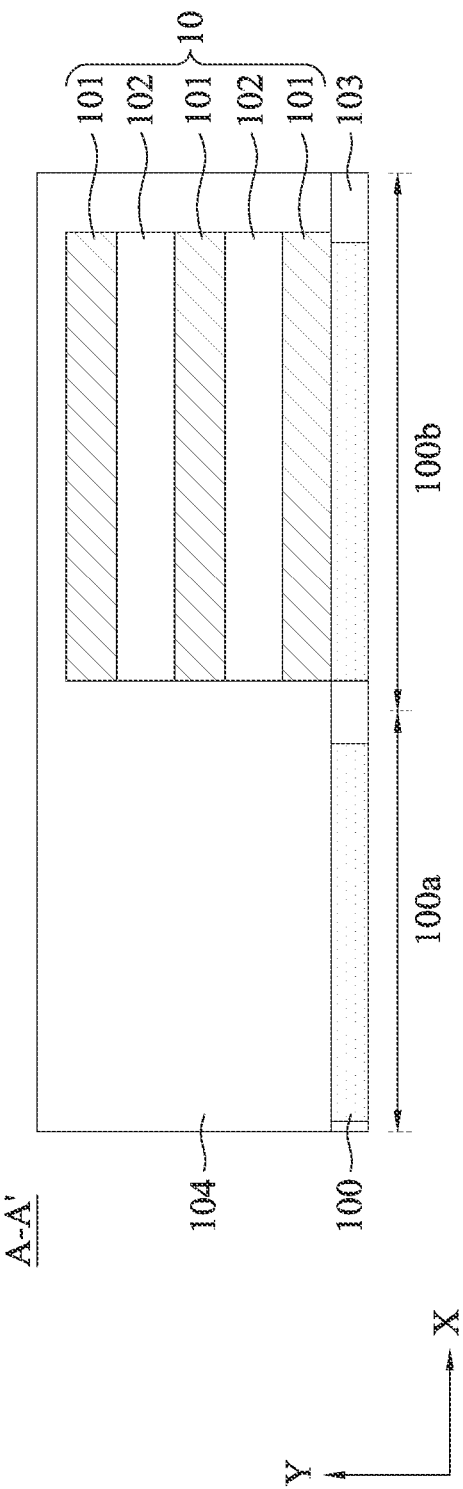

Referring back to FIG. 14A, the method M2 then proceeds to block S203 where a first dielectric material is deposited over the substrate. With reference to FIGS. 16A and 16B, in some embodiments of block S203, a dielectric material 104 is deposited over the substrate 100. In some embodiments, the dielectric material 104 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 104 may be deposited using any suitable method, such as CVD, physical vapor deposition (PVD), ALD, PEALD, PECVD, SACVD, FCVD, spin-on, and/or the like, or a combination thereof. In some embodiments, the dielectric material 104 can be interchangeably referred to a hard mask layer.

Figure 17A:
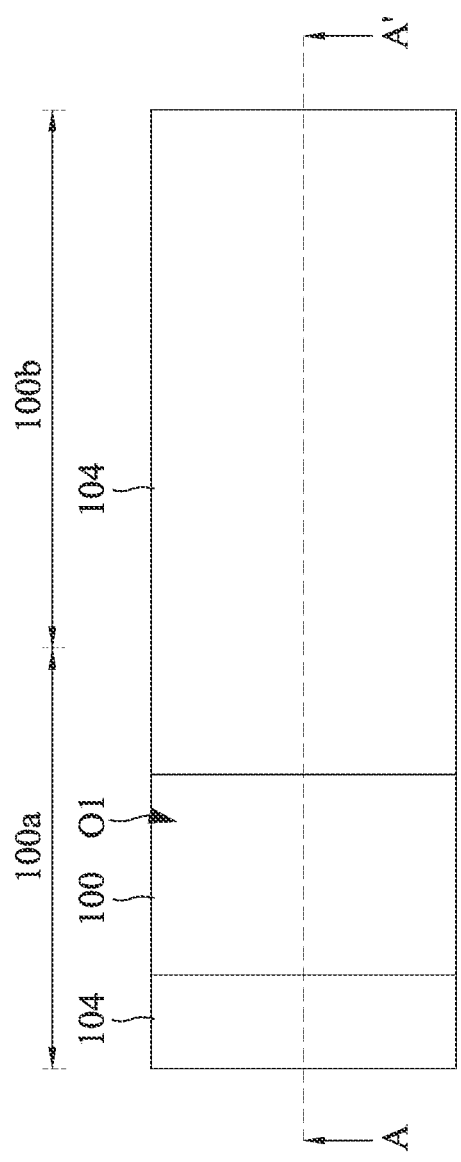
Figure 17B:
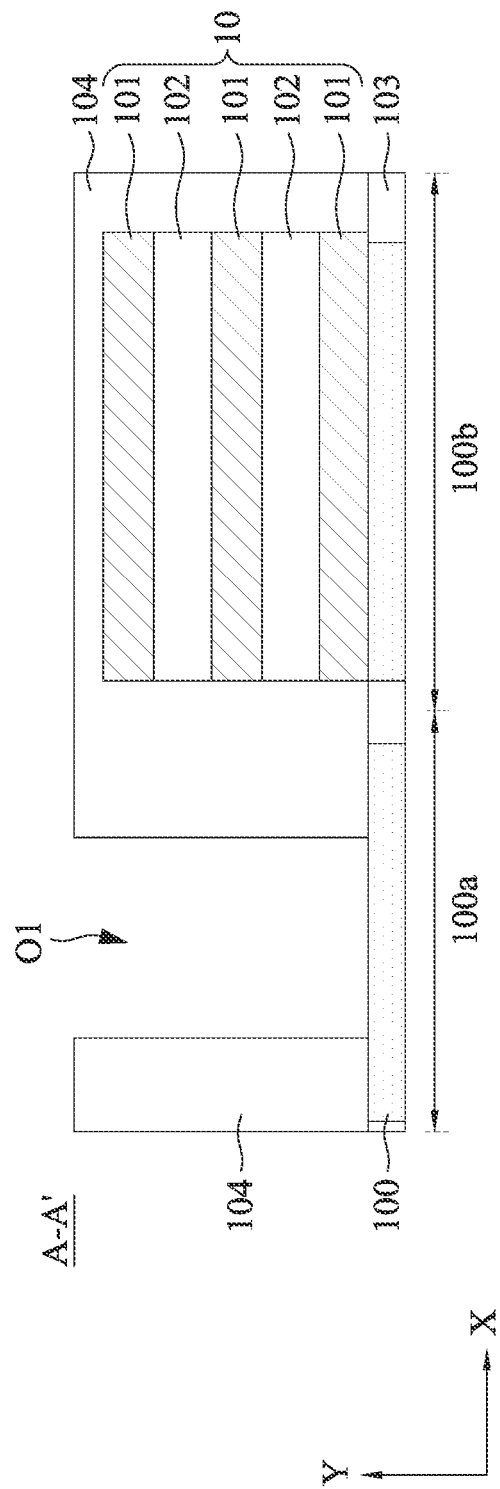

Referring back to FIG. 14A, the method M2 then proceeds to block S204 where a dummy gate opening is formed to extend through the dielectric material to expose the device region of the substrate. With reference to FIGS. 17A and 17B, in some embodiments of block S204, a dummy gate opening O1 is formed to extend through the dielectric material 104 to expose the device region 100a of the substrate 100. For example, a patterned mask may be formed over the dielectric material 104 and used to etch the dummy gate opening O1 that extend through the dielectric material 104 by using photolithography and etching techniques to expose the device region 100a of the substrate 100. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). After the formation of the dummy gate opening O1, the patterned mask can be removed with a wet clean process, an ashing process, or the like.

Figure 18A:
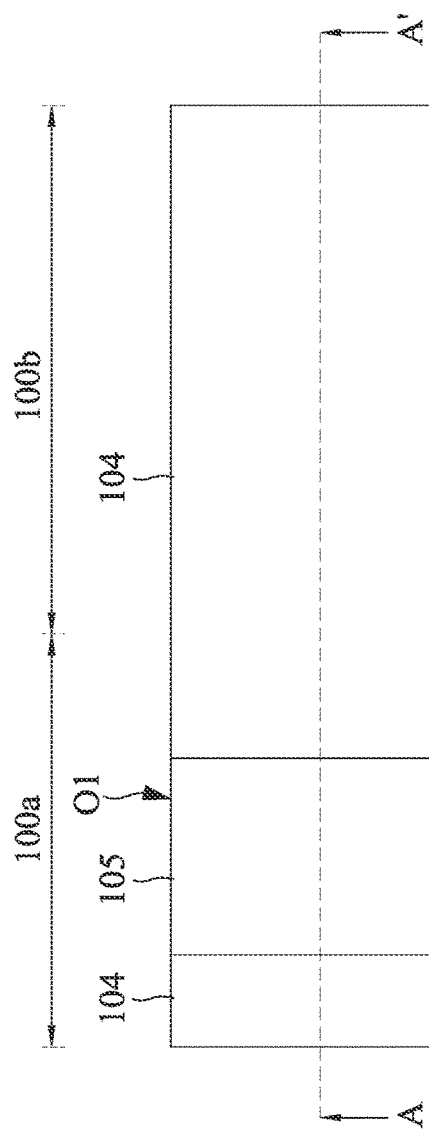
Figure 18B:
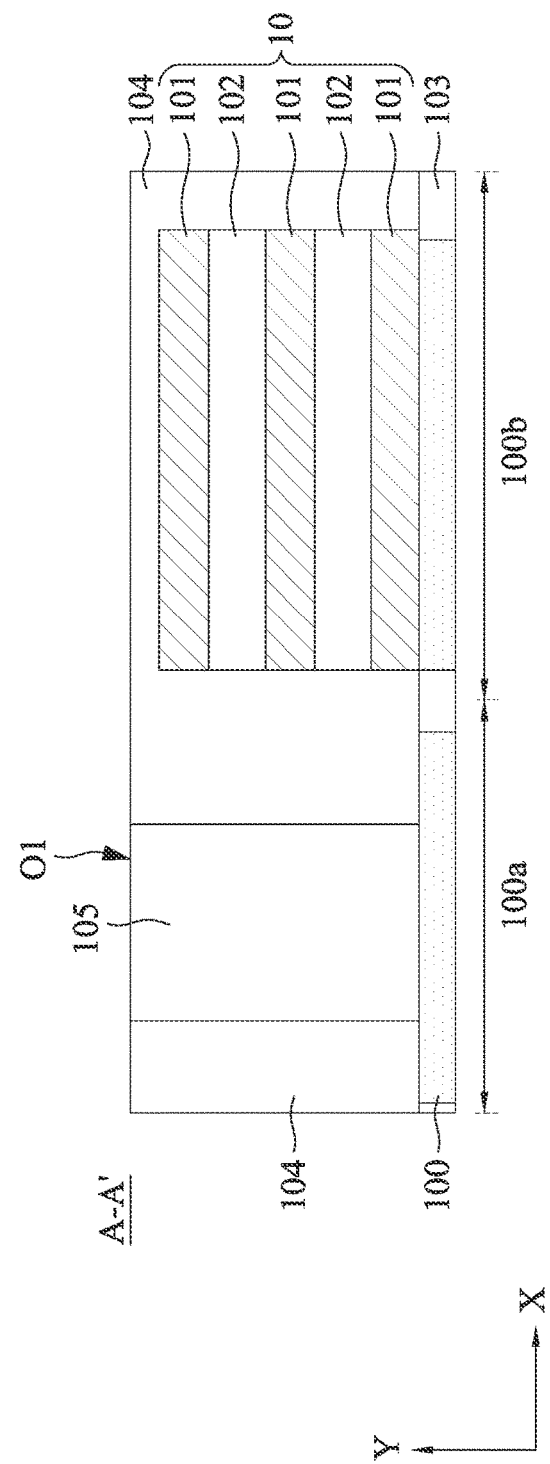
Figure 26A:
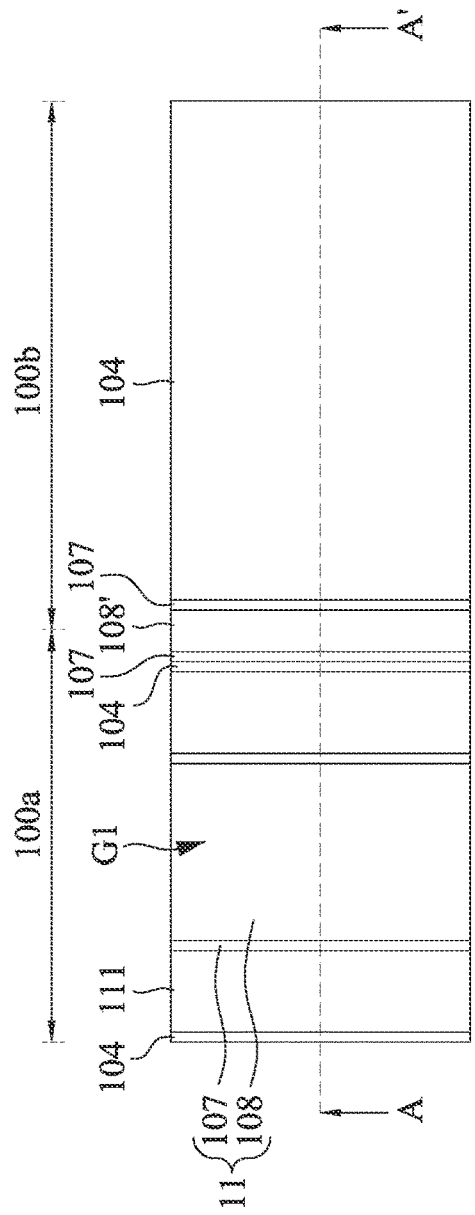
Figure 26B:
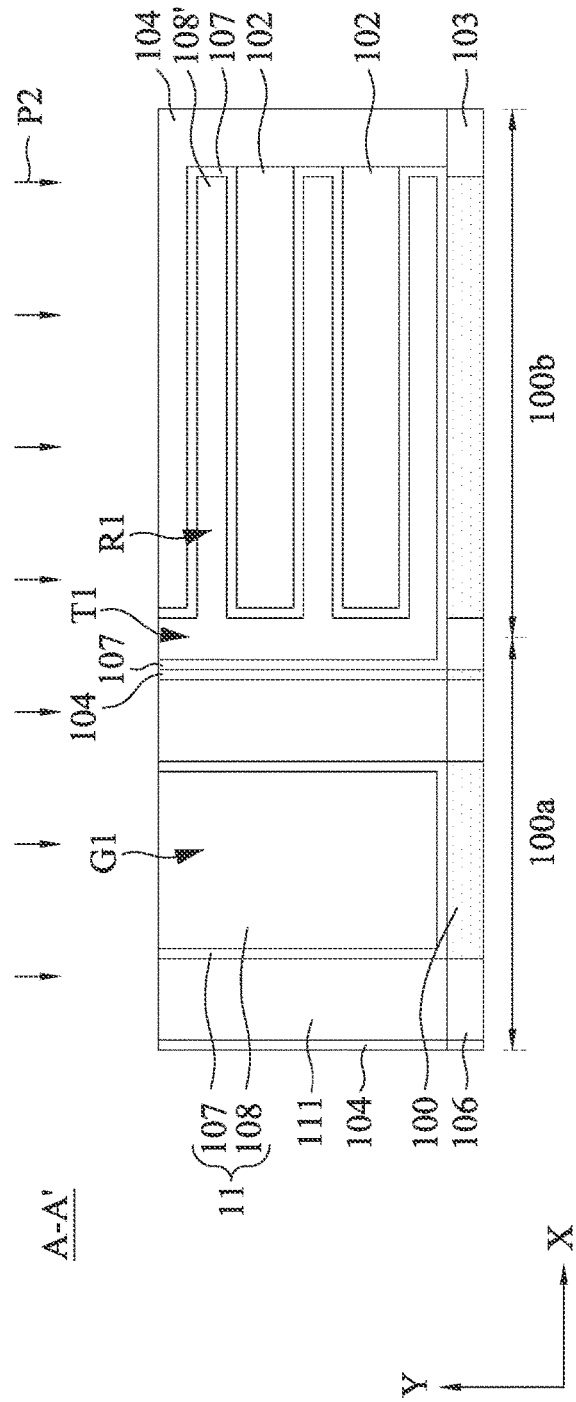

Referring back to FIG. 14A, the method M2 then proceeds to block S205 where a dummy gate is formed to land on the device region of the substrate. With reference to FIGS. 18A and 18B, in some embodiments of block S105, a dummy gate 105 is deposited to fill the dummy gate opening O1 in the dielectric material 104 and land on the device region 100a of the substrate 100. In some embodiments, the dummy gate 105 (which will be replaced with a replacement gate structure 11 as shown in FIGS. 26A and 26B) may include polycrystalline silicon (polysilicon), as an example. The dummy gate 105 can be formed by using any acceptable deposition technique. For example, the dummy electrode of the dummy gate 105 may be deposited by a suitable technique, such as CVD. Subsequently, a planarization process (e.g., CMP) may be used to remove the excess dummy gate 105 from above the top surface of the dielectric material 104 to form the structure as shown in FIGS. 18A and 18B. In some embodiments, the dummy gate 105 may be made of the same material as the second sacrificial layers 102.

Figure 19A:
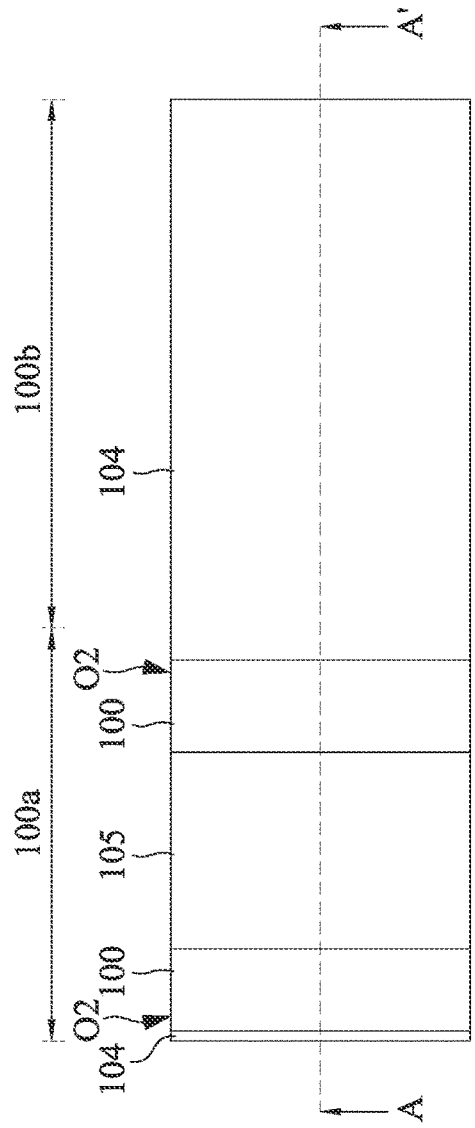
Figure 19B:
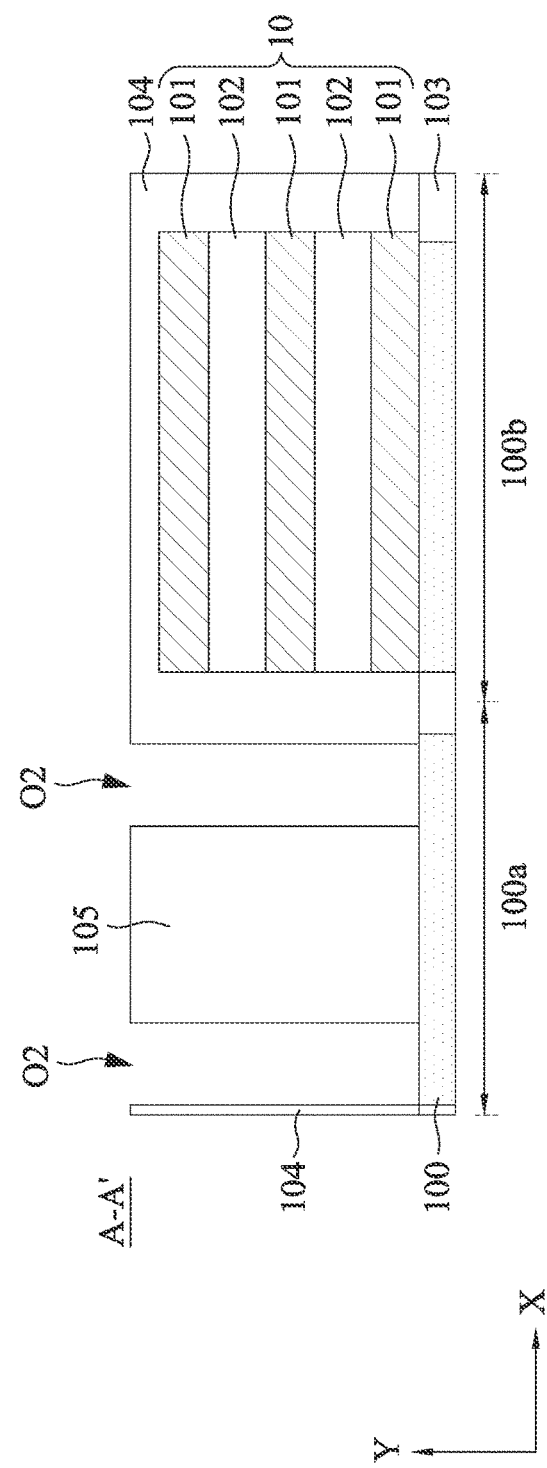

Referring back to FIG. 14A, the method M2 then proceeds to block S206 where source/drain openings are formed to extend through the dielectric material to expose the device region of the substrate. With reference to FIGS. 19A and 19B, in some embodiments of block S206, source/drain openings O2 are formed to extend through the dielectric material 104 to expose the device region 100a of the substrate 100. For example, a patterned mask may be formed over the dielectric material 104 and used to etch the source/drain openings O2 that extend through the dielectric material 104 by using photolithography and etching techniques to expose the device region 100a of the substrate 100. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). After the formation of the source/drain openings O2, the patterned mask can be removed with a wet clean process, an ashing process, or the like.

Figure 20A:
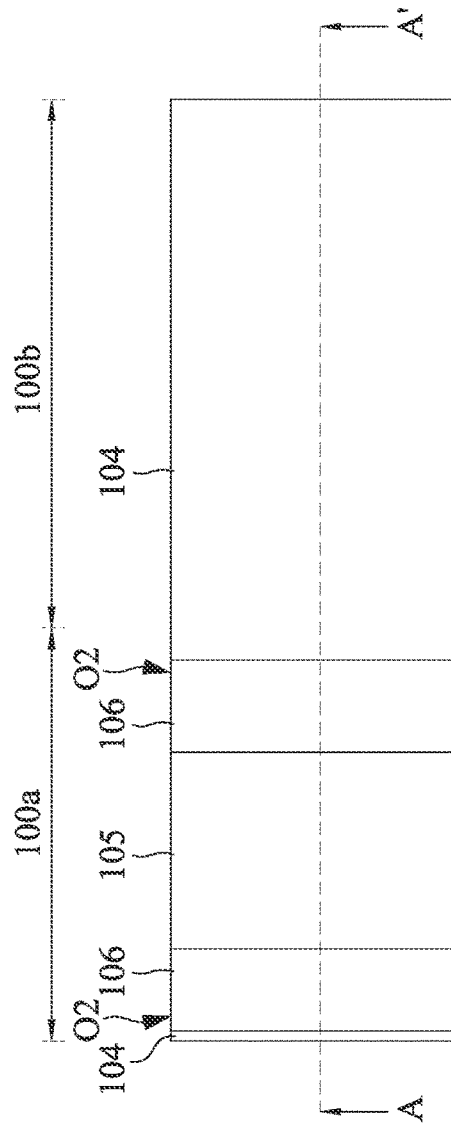
Figure 20B:
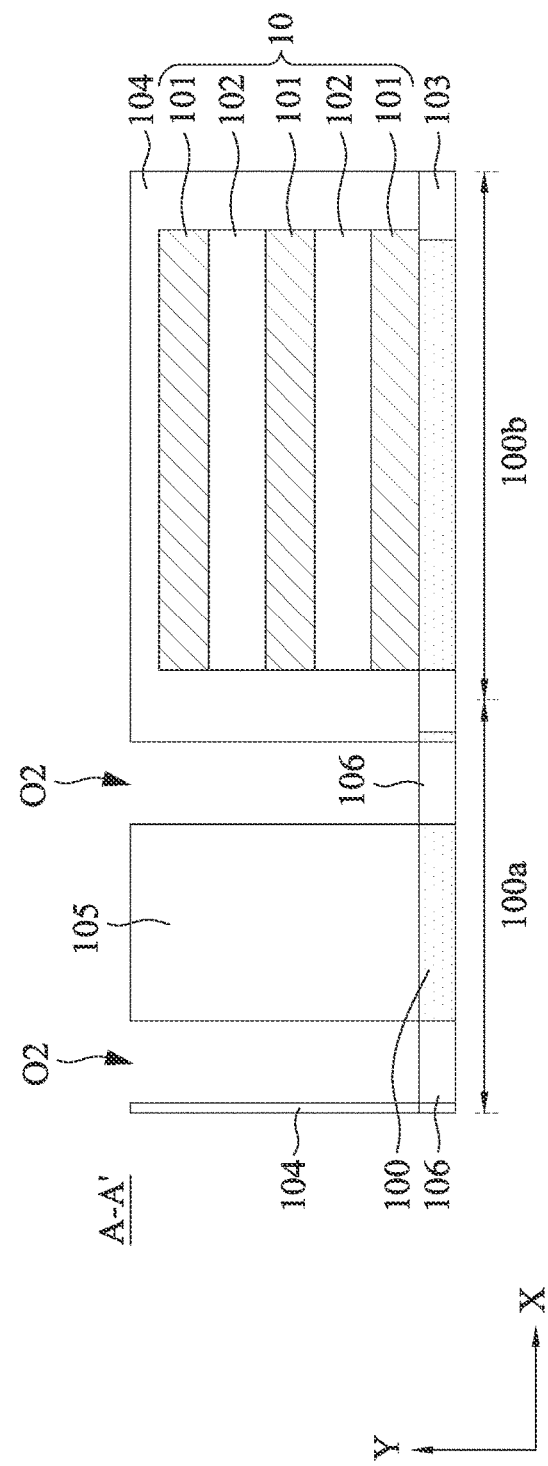

Referring back to FIG. 14A, the method M2 then proceeds to block S207 where source/drain regions are formed in the device region of the substrate and located on opposite sides of the dummy gate through the source/drain openings. With reference to FIGS. 20A and 20B, in some embodiments of block S207, the source/drain regions 106 are formed in the device region 100a of the substrate 100 and located on opposite sides of the dummy gate 105 through the source/drain openings O2. In some embodiments, the source/drain regions 106 include p-type dopants or impurities such as boron for forming functional p-type FETs in the device region 100a. In some other embodiments, the source/drain regions 106 include n-type dopants or impurities such as phosphorus for forming functional n-type FETs in the device region 100a. In some embodiments, the source/drain regions 106 may be epitaxially grown regions. For example, the source/drain regions 106 may be formed self-aligned to the dummy gate 105 by first etching the device region 100a of the substrate 100 to form recesses, and then depositing a crystalline semiconductor material in the recesses by a selective epitaxial growth (SEG) process that may fill the recesses in the device region 100a and may extend further beyond the original surface of the device region 100a to form raised source/drain epitaxy structures in some embodiments. The crystalline semiconductor material may be an elemental semiconductor (e.g., Si, or Ge, or the like), or an alloy semiconductor (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of n-type or p-type dopants may be introduced into source/drain regions S/D either in situ during SEG, or by an ion implantation process performed after the SEG, or by a combination thereof.

Referring back to FIG. 14A, the method M2 then proceeds to block S208 where a second dielectric material is deposited to fill the source/drain openings in the first dielectric material. With reference to FIGS. 21A and 21B, in some embodiments of block S208, a dielectric material 111 is deposited over the substrate 100 to fill the source/drain openings O2 in the dielectric material 104. In some embodiments, the dielectric material 111 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 111 may be deposited using any suitable method, such as CVD, physical vapor deposition (PVD), ALD, PEALD, PECVD, SACVD, FCVD, spin-on, and/or the like, or a combination thereof. In some embodiments, the dielectric material 111 can be interchangeably referred to a hard mask layer. In some embodiments, the dielectric material 111 may be made of the same material as the dielectric material 104. In some embodiments, the dielectric material 111 may be made of a different material than the dielectric material 104.

Figure 22A:
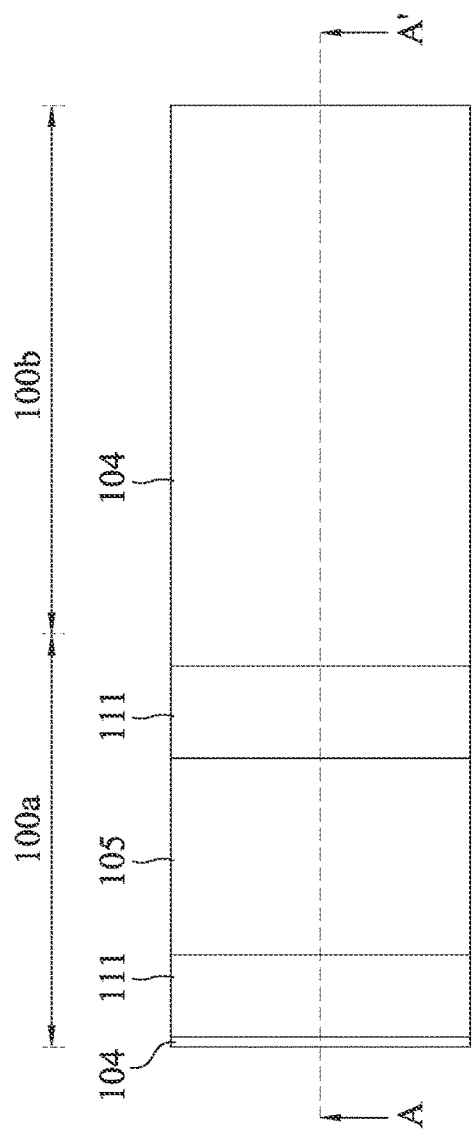
Figure 22B:
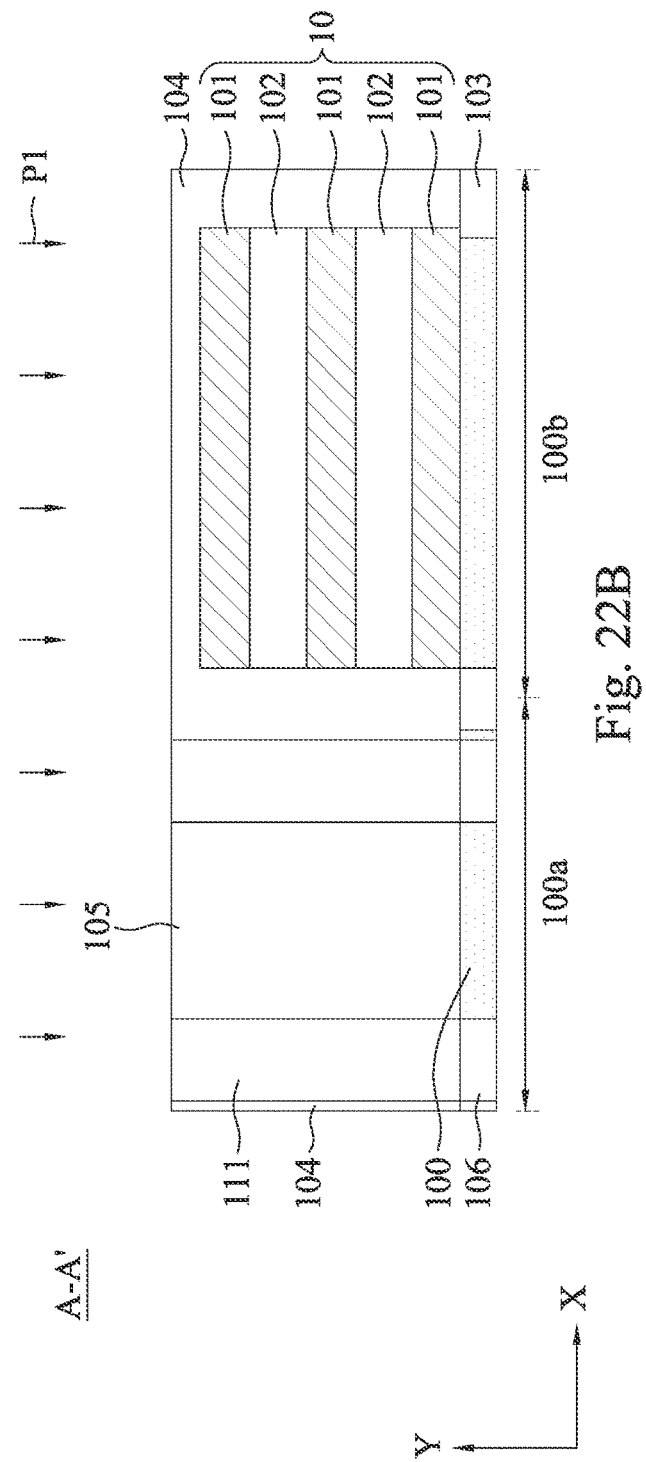

Referring back to FIG. 14A, the method M2 then proceeds to block S209 where a first planarization process is performed to remove the excess second dielectric material from above a top surface of the first dielectric material. With reference to FIGS. 22A and 22B, in some embodiments of block S209, a planarization process P1 (e.g., CMP) may be used to remove excess second dielectric material 111 from above a top surface of the dielectric material 104. The resulting structure is illustrated in FIGS. 22A and 22B.

Figure 23A:
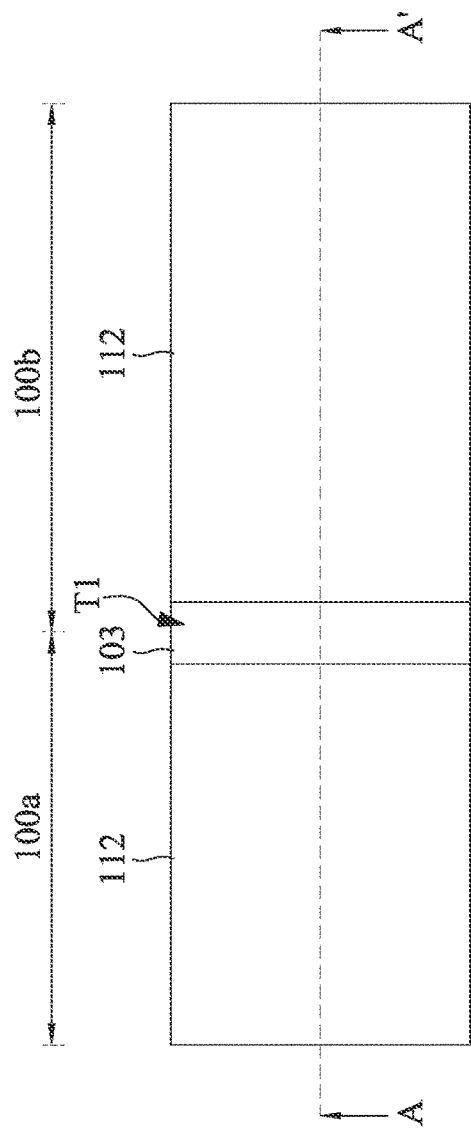
Figure 23B:
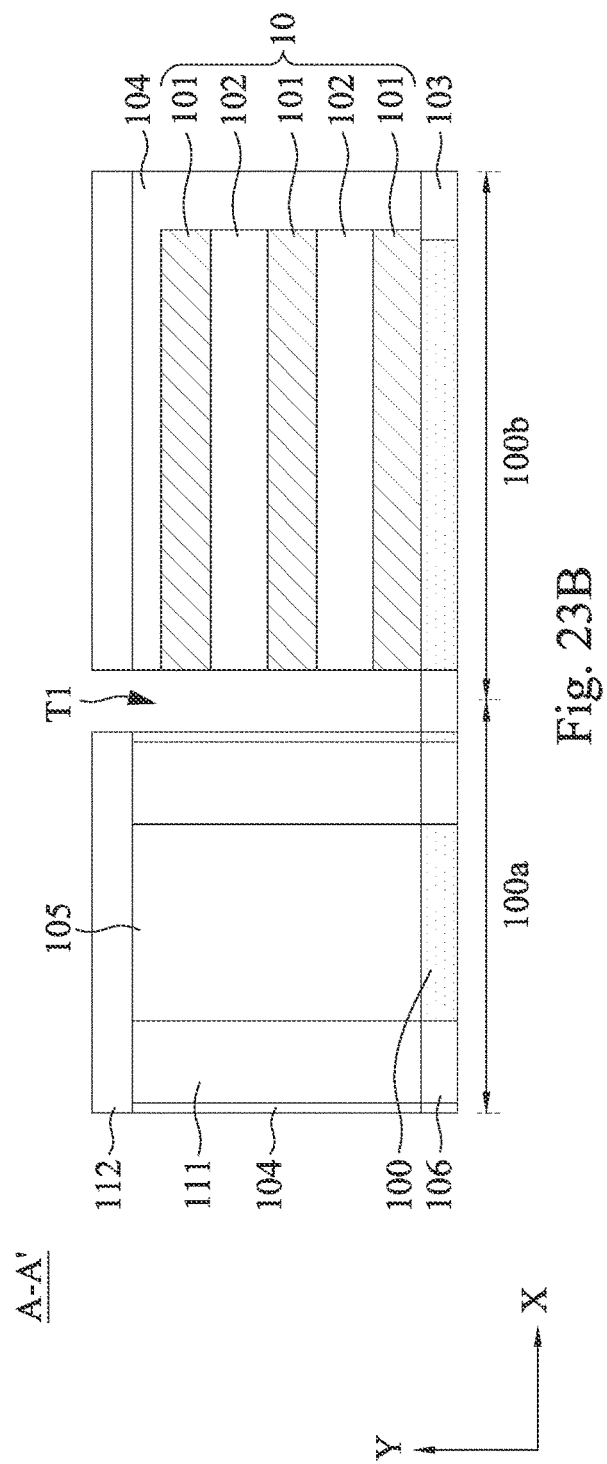

Referring back to FIG. 14A, the method M2 then proceeds to block S210 where a first capacitor trench is formed to extend through the first dielectric material to expose a sidewall of the sacrificial multi-layer stack. With reference to FIGS. 23A and 23B, in some embodiments of block S210, a first capacitor trench T1 is formed to extend through the dielectric material 104 to expose a sidewall of the sacrificial multi-layer stack 10. For example, a patterned mask 112 may be formed over the dielectric material 104 and used to etch the first capacitor trench T1 that extend through the dielectric material 104 by using photolithography and etching techniques to expose the sidewall of the sacrificial multi-layer stack 10. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). In some embodiments, the patterned mask 112 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the patterned mask 112 may be made of the same material as the dielectric material 104, and therefore after the formation of the first capacitor trench T1, the patterned mask 112 can be removed by a suitable technique, such a planarization process (e.g., CMP). In some embodiments, the patterned mask 112 may be made of a different material than the dielectric material 104, and therefore after the formation of the first capacitor trench T1, the patterned mask 112 can be removed by a suitable technique, such as a wet clean process, an ashing process, or the like. In some embodiments, the first capacitor trench T1 can be interchangeably referred to a first capacitor opening.

Referring back to FIG. 14B, the method M2 then proceeds to block S211 where the first sacrificial layers in the sacrificial multi-layer stack are removed to form first capacitor recesses over the capacitor region through the first capacitor trench, and the dummy gate is removed to form a gate trench over the device region. With reference to FIGS. 24A and 24B, in some embodiments of block S211, the first sacrificial layers 101 (see FIG. 23B) in the sacrificial multi-layer stack 10 and the dummy gate 105 (see FIG. 23B) are removed in one or more etching process, so that the gate trench G1 is formed over the device region 100a and the first capacitor recesses R1 are formed over the capacitor region 100b. The gate trench G1 exposes and/or overlies portions of the device region 100a of the substrate 100, and the first capacitor recesses R1 expose three side surfaces of each of the second sacrificial layers 102. In some embodiments, the dummy gate 105 and the first sacrificial layers 101 are removed by an anisotropic dry etch process. For example, the etching process may include a dry etch process using reaction gas(es) that selectively etch the dummy gate 105 and the first sacrificial layers 101 at faster rates than the dielectric materials 104 and 111 and the second sacrificial layers 102. In some embodiments, when the first sacrificial layers 101 and the dummy gate 105 as shown in FIG. 23B are formed of silicon, the second sacrificial layers 102 may be formed of silicon germanium. In some embodiments, the first capacitor recesses R1 can be interchangeably referred to capacitor electrode spaces inheriting the shapes of the first sacrificial layers 101.

Figure 25A:
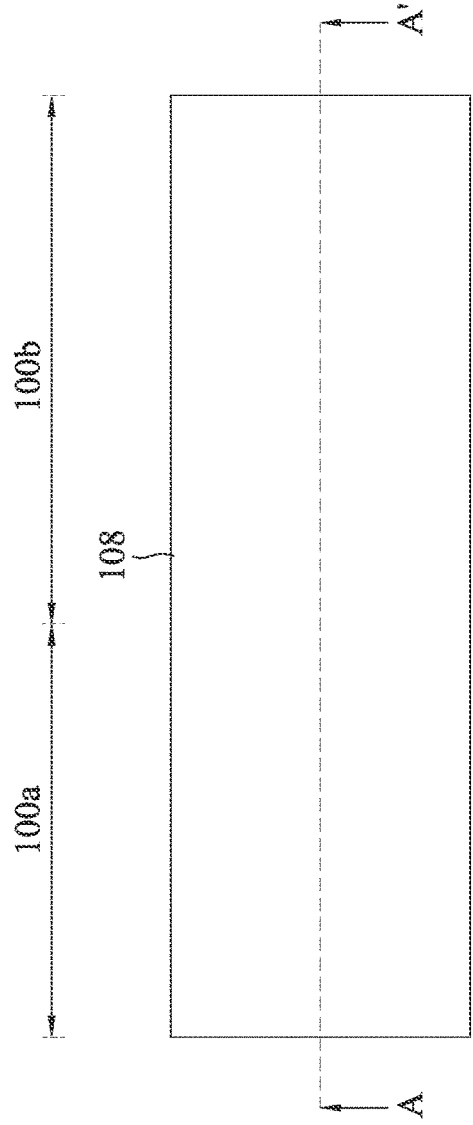
Figure 25B:
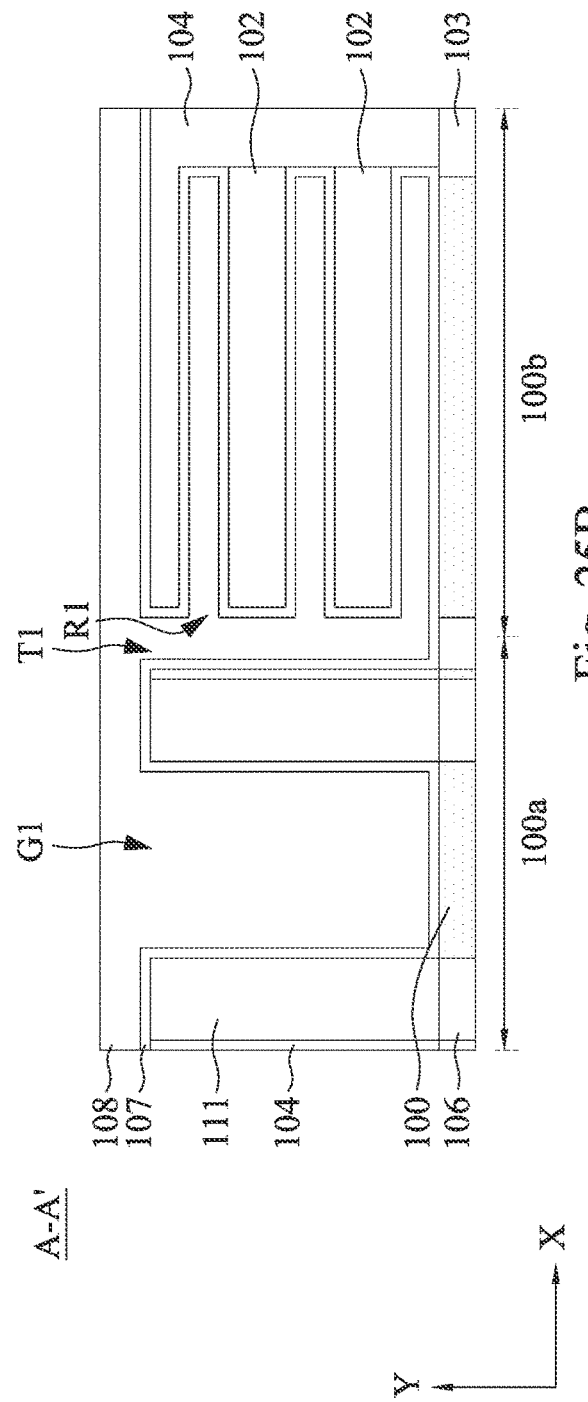

Referring back to FIG. 14B, the method M2 then proceeds to block S212 where a first dielectric layer is blanket formed in the gate trench, the first capacitor trench, and the first capacitor recesses, and a first conductive material is deposited over the dielectric layer. With reference to FIGS. 25A and 25B, in some embodiments of block S212, a dielectric layer 107 is blanket formed over the substrate 100 and in the gate trench G1, the first capacitor trench T1, and the first capacitor recesses R1.

Subsequently, a conductive material 108 is deposited over the dielectric layer 107. In some embodiments, an interface between the dielectric layer 107 and the conductive material 108 can be smooth or rough.

In some embodiments, the dielectric layer 107 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 107 may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 107 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 107 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 107 may be deposited using any suitable method, such as CVD, physical vapor deposition (PVD), ALD, PEALD, PECVD, SACVD, FCVD, spin-on, and/or the like, or a combination thereof.

In some embodiments, the conductive material 108 may include suitable work function metals to provide a suitable work function for the replacement gate structure 11 (see FIGS. 26A and 26B) which will be formed in the gate trench G1. In some embodiments, the conductive material 108 may include one or more n-type work function metals (N-metal) for forming an n-type transistor on the device region 100a of the substrate 100. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the conductive material 108 may include one or more p-type work function metals (P-metal) for forming a p-type transistor on the device region 100a of the substrate 100. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. At least two of the work function metals in the conductive material 108 may be made of different work function metals so as to achieve suitable work functions in some embodiments. In some embodiments, an entirety of the conductive material 108 is a work function metal of a same material. In some embodiments, the conductive material 108 may be deposited using any suitable method, such as CVD, physical vapor deposition (PVD), ALD, PEALD, PECVD, SACVD, FCVD, spin-on, and/or the like, or a combination thereof.

Referring back to FIG. 14B, the method M2 then proceeds to block S213 where a second planarization process is performed to remove the excessive first dielectric layer and the first conductive material above the top surface of the first dielectric material to form a replacement gate structure in the gate trench and a first electrode of a vertically stacked multi-layer MIM capacitor in the first capacitor trench and the first capacitor recesses. With reference to FIGS. 26A and 26B, in some embodiments of block S213, a planarization process P2 is performed to remove the excessive dielectric layer 107 and the conductive material 108 (see FIG. 25B) above the top surface of the dielectric material 104 to form a replacement gate structure 11 in the gate trench G1 and a first electrode 108' of a vertically stacked multi-layer MIM capacitor C1 (see FIG. 30B) in the first capacitor trench T1 and the first capacitor recesses R1. As a result of this method, the replacement gate structures 11 may include the conductive material 108 and the dielectric layer 107 which wraps around the conductive material 108. In some embodiments, the dielectric layer 107 formed in the gate trench G1 can be interchangeably referred to as a gate dielectric layer, and the conductive material 108 formed in the gate trench G1 can be interchangeably referred to as a gate electrode. In some embodiments, the replacement gate structures 11 can be interchangeably referred to as a gate stack or a gate strip.

Figure 27A:
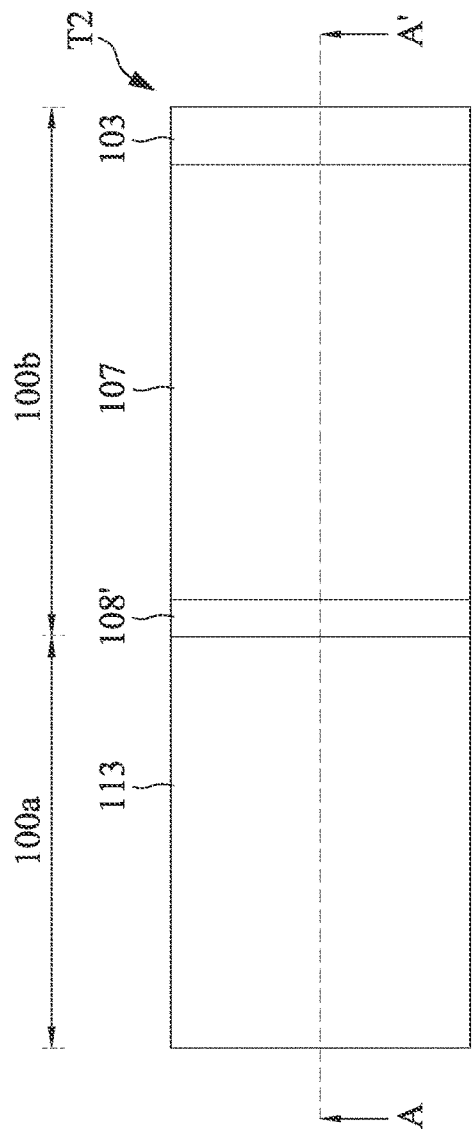
Figure 27B:
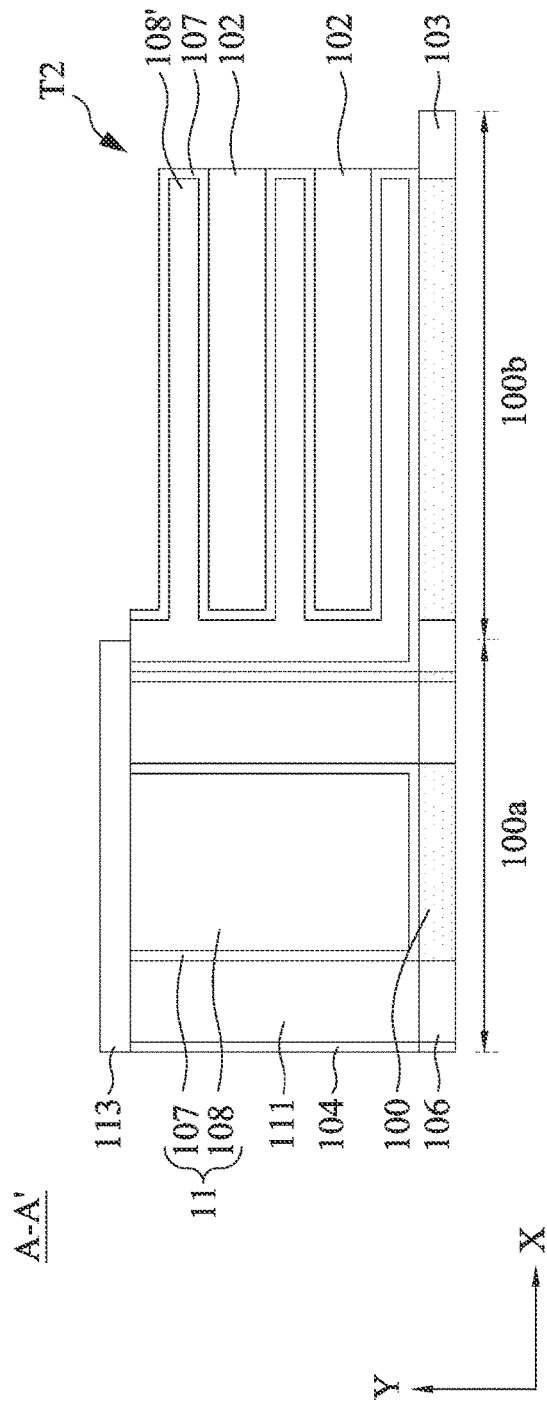

Referring back to FIG. 14B, the method M2 then proceeds to block S214 where the first dielectric material over the capacitor region is removed to form a second capacitor trench that exposes the second sacrificial layers. With reference to FIGS. 27A and 27B, in some embodiments of block S214, the first dielectric material 104 over the capacitor region 100b (see FIG. 26B) is removed to form a second capacitor trench T2 that exposes the second sacrificial layers 102. For example, a patterned mask 113 may be formed over the replacement gate structure 11 and the dielectric materials 104 and 111 on the device region 100a while remains the dielectric layer 107, the first electrode 108', and the dielectric material 104 (see FIG. 26B) on the capacitor region 100b uncovered. The patterned mask 113 can be used to etch the second capacitor trench T2 that extend through the dielectric material 104 over the capacitor region 100b by using photolithography and etching techniques to expose the second sacrificial layers 102. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). For example, the etching process may include a dry etch process using reaction gas(es) that selectively etch the dielectric material 104 at a faster rate than the dielectric layer 107 and the first electrode 108'. In some embodiments, the patterned mask 113 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the patterned mask 113 may be made of the same material as the dielectric material 104 and/or the dielectric material 111. In some embodiments, the patterned mask 113 may be made of a different material than the dielectric material 104 and/or the dielectric material 111. In some embodiments, the second capacitor trench T2 can be interchangeably referred to a second capacitor opening.

Referring back to FIG. 14B, the method M2 then proceeds to block S215 where the second sacrificial layers are moved through the second capacitor trench to form second capacitor recesses over the capacitor region. With reference to FIGS. 28A and 28B, in some embodiments of block S215, the second sacrificial layers 102 (see FIG. 27B) are moved in one or more etching process through the second capacitor trench T2, so that second capacitor recesses R2 are formed over the capacitor region 100b. For example, the second sacrificial layers 102 are removed by a suitable etching techniques, such as dry etching, wet etching, and/or other etching methods (e.g., reactive ion etching). In some embodiments, the second sacrificial layers 102 are removed by an anisotropic dry etch process. For example, the etching process may include a dry etch process using reaction gas(es) that selectively etch the second sacrificial layers 102 at faster rates than the dielectric layer 107 and the conductive material 108. In some embodiments, the second capacitor recesses R2 can be interchangeably referred to capacitor electrode spaces inheriting the shapes of the second sacrificial layers 102.

Figure 29A:
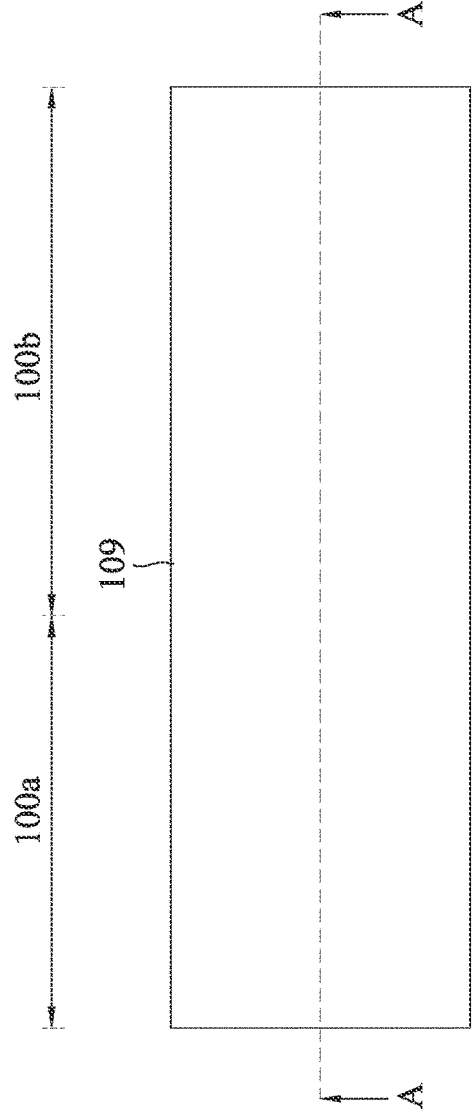
Figure 29B:
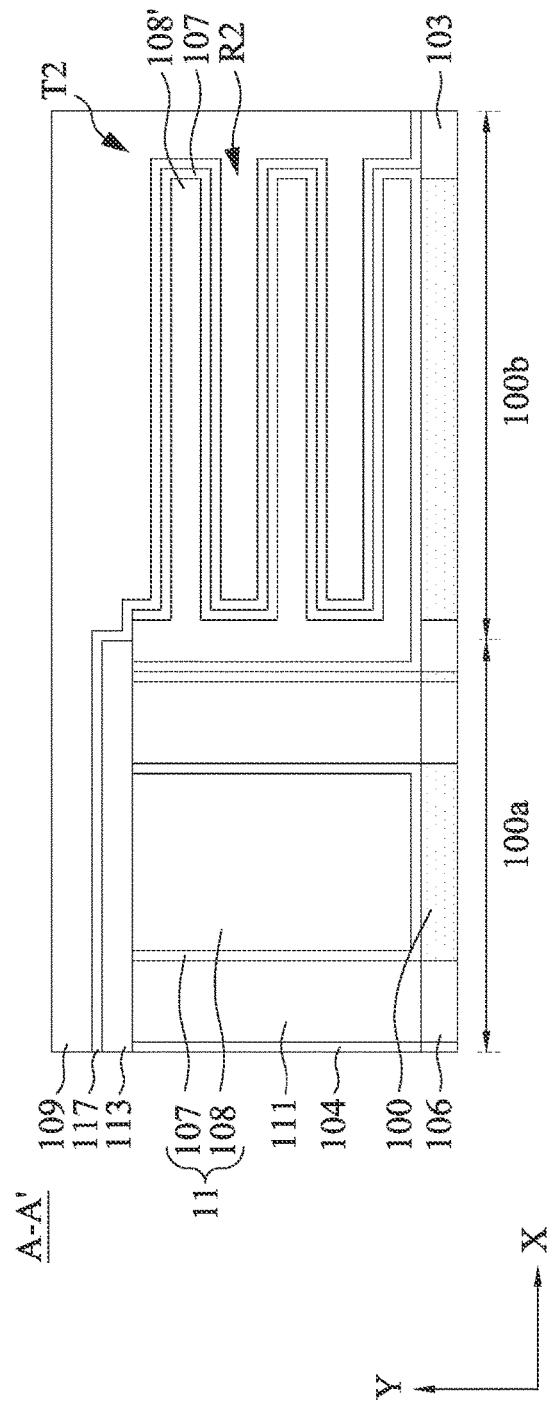

Referring back to FIG. 14B, the method M2 then proceeds to block S216 where a second dielectric layer is blanket formed over the substrate and in the second capacitor trench and the second capacitor recesses, and a second conductive material is deposited over the second dielectric layer. With reference to FIGS. 29A and 29B, in some embodiments of block S216, a dielectric layer 117 is blanket formed over the substrate 100 and in the second capacitor trench T2 and the second capacitor recesses R2. Subsequently, a conductive material 109 is deposited over the dielectric layer 117. In some embodiments, an interface between the dielectric layer 117 and the conductive material 109 can be smooth or rough.

In some embodiments, the dielectric layer 117 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 117 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 117 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 117 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 117 may be made of the same material as the dielectric layer 107. In some embodiments, the dielectric layer 117 may be made of a different material than the dielectric layer 107. In some embodiments, the dielectric layer 107 may be deposited using any suitable method, such as CVD, physical vapor deposition (PVD), ALD, PEALD, PECVD, SACVD, FCVD, spin-on, and/or the like, or a combination thereof.

In some embodiments, the conductive material 109 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the conductive material 109 may include, but are not limited to, titanium nitride (TiN), tungsten nitride (WN), tungsten (W), ruthenium (Ru), palladium (Pd), platinum (Pt), cobalt (Co), nickel (Ni), argentum (Ag), Aurum (Au), conductive metal oxides, and/or other suitable materials. In some embodiments, the conductive material 109 may be made of the same material as the conductive material 108. In some embodiments, the conductive material 109 may be made of a different material than the first electrode 108'. In some embodiments, the conductive material 109 may be deposited using any suitable method, such as CVD, physical vapor deposition (PVD), ALD, PEALD, PECVD, SACVD, FCVD, spin-on, and/or the like, or a combination thereof.

Referring back to FIG. 14B, the method M2 then proceeds to block S217 where a third planarization process is performed to remove the excessive second dielectric layer and the second conductive material above the top surface of the first dielectric material to form a second electrode of the vertically stacked multi-layer MIM capacitor in the second capacitor trench and the second capacitor recesses. With reference to FIGS. 30A and 30B, in some embodiments of block S217, a planarization process P3 (e.g., CMP) is performed to remove the excessive dielectric layer 117 and the conductive material 109 above the top surface of the dielectric material 104 to form a second electrode 109' of the vertically stacked multi-layer MIM capacitor C1 in the second capacitor trench T2 and the second capacitor recesses R2. In some embodiments, the dielectric layers 107 and 117 can be collectively referred to as an insulator 117' of the vertically stacked multi-layer MIM capacitor C1. As a result of this method, the vertically stacked multi-layer MIM capacitor C1 may include the first and second electrode 108' and 109' and the insulator 117' sandwiched between the first and second electrode 108' and 109'.

This is described in greater detail with reference to FIG. 30B, after the planarization process P3, the first electrode 108' of the capacitor C1 can include three lateral portions 108a in, and the second electrode 109' can include three lateral portions 109a interleaving with the lateral portions 108a, by way of example but not limiting the present disclosure. In some embodiments, the capacitor C1 may have a capacitor width W1 in a range from about 45 to about 70 nm, such as about 45, 48, 50, 52, 54, 56, 58, 60, 62, 64, 66, 68, or 70 nm, and a capacitor height H1 in a range from about 1000 to about 2000 nm, such as 1000, 1200, 1400, 1600, 1800, or 2000 nm.

The first electrode 108' of the vertically stacked multi-layer MIM capacitor C1 incudes the first lateral portions 108a formed in the first capacitor recesses R1 and a first vertical portion 108b formed in the first capacitor trench T1. The first lateral portions 108a extend in X-direction, and the first vertical portion 108b extends in Y-direction and connects the first lateral portion 108a. In some embodiments, at least two of the first lateral portions 108a may have different thicknesses. In some embodiments, the first lateral portions 108a may have a thickness in a range from about 0.1 nm to about 1 μm, such as about 0.1, 1, 10, 15, 100, or 1000 nm. The second electrode 109' of the vertically stacked multi-layer MIM capacitor C1 incudes the second lateral portions 109a formed in the second capacitor recesses R2 and a second vertical portion 109b formed in the second capacitor trench T2. The second lateral portions 109a extend in X-direction, and the second vertical portion 109b extends in Y-direction and connects the second lateral portions 109a. The first lateral portions 108a interleave with the second lateral portions 109a. In some embodiments, at least two of the second lateral portions 109a may have different thicknesses. In some embodiments, the second lateral portions 109a may have a thickness in a range from about 0.1 nm to about 1 μm, such as about 0.1, 1, 10, 15, 100, or 1000 nm. In some embodiments, the first and second lateral portions 108a and 109a each may have a length in a range from about 30 nm to about 40 nm, such as 30, 32, 34, 36, 38, or 40 nm.

As shown in FIG. 30B, the first electrode 108' is spaced apart from the second electrode 109' by the insulator 117'. In some embodiments, the insulator 117' may have a thickness in a range from about 0.1 nm to about 100 nm. In some embodiments, a combination of the first lateral portions 108a and the insulator 117' may have a thickness in a range from about 10 to about 30 nm, such as about 10, 15, 20, 25, or 30 nm. In some embodiments, the vertically stacked multi-layer MIM capacitor C1 may be a cylinder, cuboid, thin film, or any suitable geometry, with or without rounded corners. In some embodiments, when viewed from a top view, the vertically stacked multi-layer MIM capacitor C1 may have a dimension (e.g., diameter, width, or length) in a range from about 1 nm to about 10 mm, such as about 1, 10, 100, 1000, 10000, 100000, 1000000, or 1000000 nm.

In some embodiments of the MIM capacitor C1 that has the capacitor height H1 at about 1600 nm and an equivalent oxide thickness (EOT) at about 1 nm, if the first lateral and vertical portions 108a and 108b of the first electrode 108' and the second lateral and vertical portions 109a and 109b of the second electrode 109' each has thickness about 5, 7, or 9 nm, then the capacitance of the capacitor may be about 12.6, 15.2, or 18.9 fF, the capacitance per area may be about 3360, 2700, or 2240 fF/$\mu m^2$. In some embodiments, the capacitance per footprint of one layer of the MIM capacitor C1 may be about 34.5 fF/$\mu m^2$. Therefore, the present disclosure in various embodiments provides a vertically stacked multi-layer MIM capacitor C1 that includes vertically stacked interleaved lateral portions 108a and 109a. An advantage is that the capacitor C1 including vertically stacked interleaved electrodes can increase the overlap area therebetween, such that the capacitance of the capacitor C1 can be improved.

Referring back to FIG. 14C, the method M2 then proceeds to block S218 where a third dielectric material is deposited over the substrate. With reference to FIGS. 31A and 31B, in some embodiments of block S218, a dielectric material 114 is deposited over the substrate 100. In some embodiments, the dielectric material 114 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 114 may be deposited using any suitable method, such as CVD, physical vapor deposition (PVD), ALD, PEALD, PECVD, SACVD, FCVD, spin-on, and/or the like, or a combination thereof. In some embodiments, the dielectric material 114 can be interchangeably referred to a hard mask layer. In some embodiments, the dielectric material 114 may be made of the same material as the dielectric material 104 and/or the dielectric material 111. In some embodiments, the dielectric material 114 may be made of a different material than the dielectric material 104 and/or the dielectric material 111.

Referring back to FIG. 14C, the method M2 then proceeds to block S219 where a plurality of source/drain contact openings are formed down through the second and third dielectric materials over the device region to expose the source/drain regions, and a plurality of capacitor contact openings are formed down through the third dielectric material over the capacitor region to expose the first and second electrodes. With reference to FIGS. 31A and 31B, in some embodiments of block S219, a plurality of source/drain contact openings O4 are formed down through the dielectric materials 111 and 114 over the device region 100a to expose the source/drain regions 106, and a plurality of capacitor contact openings O5 are formed down through the dielectric material 114 over the capacitor region 100b to expose the first and second electrodes 108' and 109'.

Figure 32A:
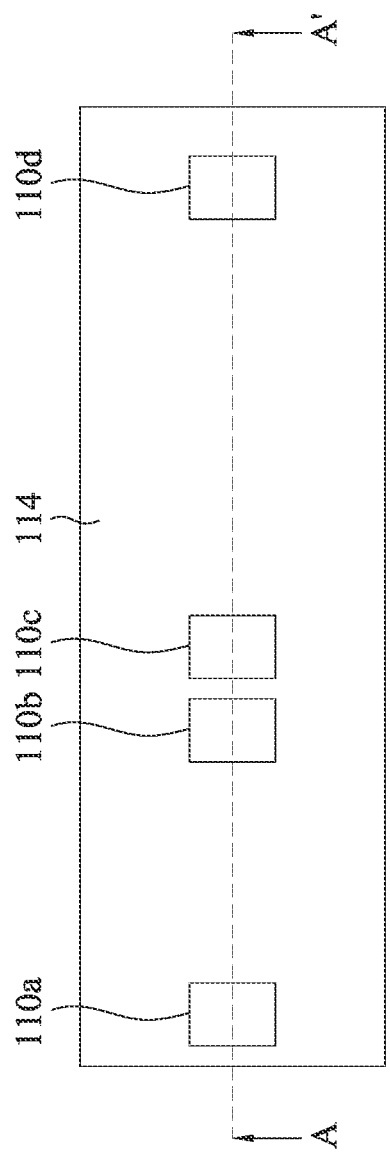
Figure 32B:
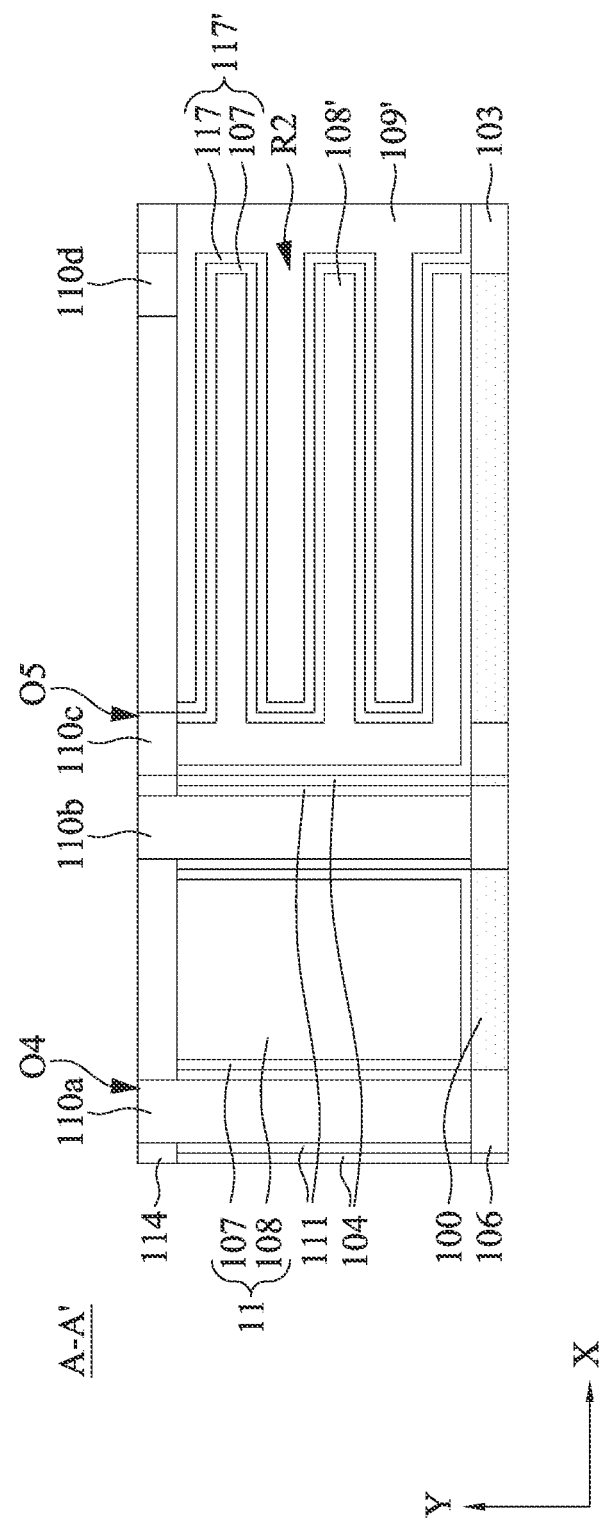

Referring back to FIG. 14C, the method M2 then proceeds to block S220 where source/drain contacts are formed in the source/drain contact openings and land on the source/drain regions, and the capacitor contacts are formed in the capacitor contact openings and land on the first and second electrodes of the vertically stacked multi-layer MIM capacitor. With reference to FIGS. 32A and 32B, in some embodiments of block S220, a conductive material is deposited over the dielectric material 114 to fill the source/drain contact openings O4 and the capacitor contact openings O5. Subsequently, a planarization process (e.g., CMP) is performed to remove the excess conductive material from above a top surface of the dielectric material 114. The remaining conductive material fills the source/drain contact openings O4 and serves as source/drain contacts 110a and 110b and fills the capacitor contact openings O5 and serves as first and second capacitor contacts 110c and 110d. The source/drain contacts 110a and 110b formed in the source/drain contact openings O4 land on the source/drain regions 106, and the capacitor contacts 110c and 110d formed in the capacitor contact openings O5 land on the first and second electrodes 108' and 109' of the vertically stacked multi-layer MIM capacitor C1. The capacitor contact 110c may be used to provide the first voltage potential to the first electrode 108', and the capacitor contact 110d may be used to provide the second voltage potential to the second electrode 109' of the vertically stacked multi-layer MIM capacitor C1, the second voltage potential is different than the first voltage potential.

In some embodiments, the conductive material may be deposited using any suitable method, such as CVD, physical vapor deposition (PVD), ALD, PEALD, PECVD, SACVD, FCVD, spin-on, and/or the like, or a combination thereof. In some embodiments, the conductive material may include TiN, TaN, Ti, Ta, Cu, Al, Ag, W, Ir, Ru, Pt, combinations thereof, or other suitable conductive materials.

Figure 33A:
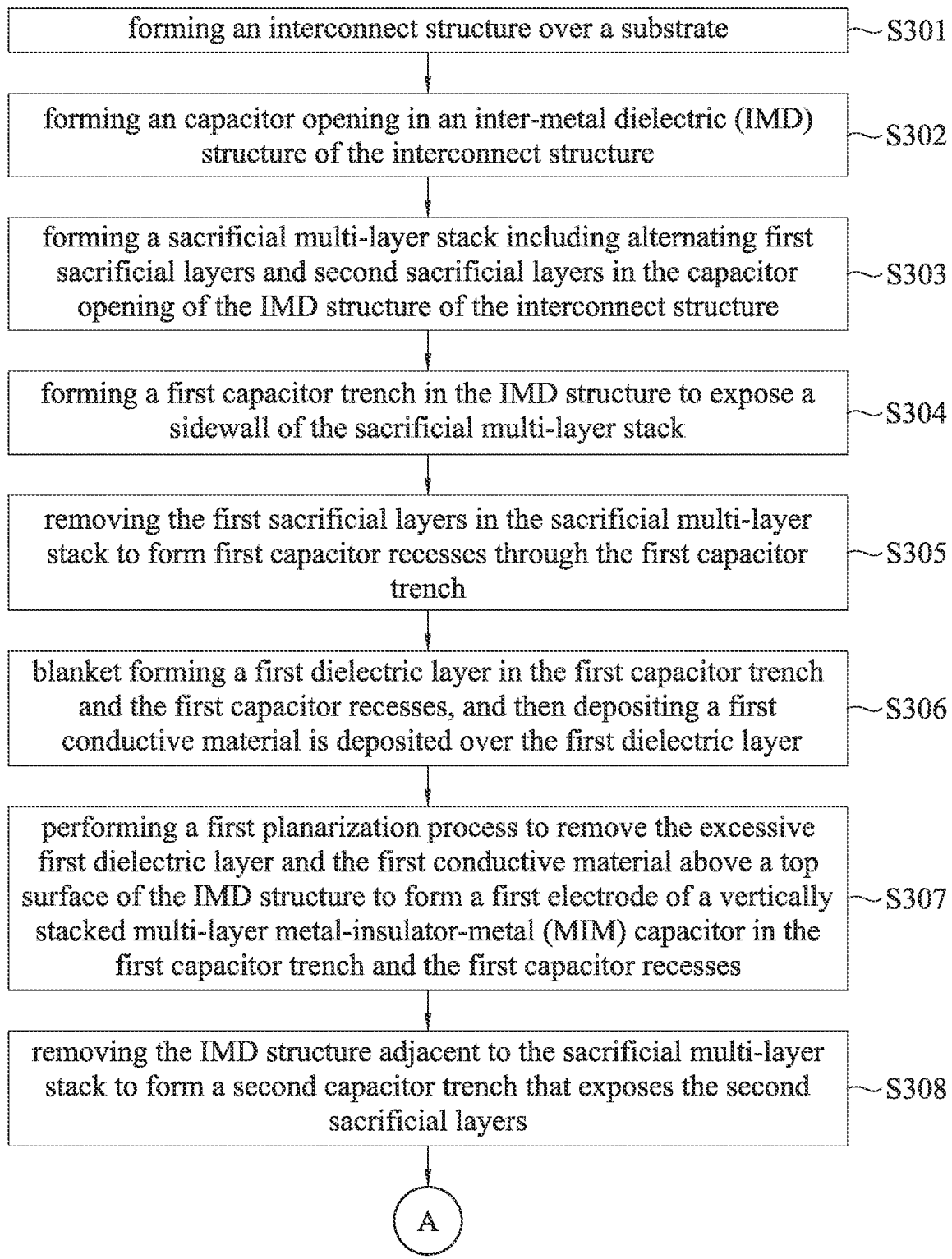
FIGS. 33A and 33B are a method M3 of manufacturing an integrated circuit including a vertically stacked multi-layer MIM capacitor in back end of the line (BEOL) in accordance with some embodiments of the present disclosure.
Figure 33B:
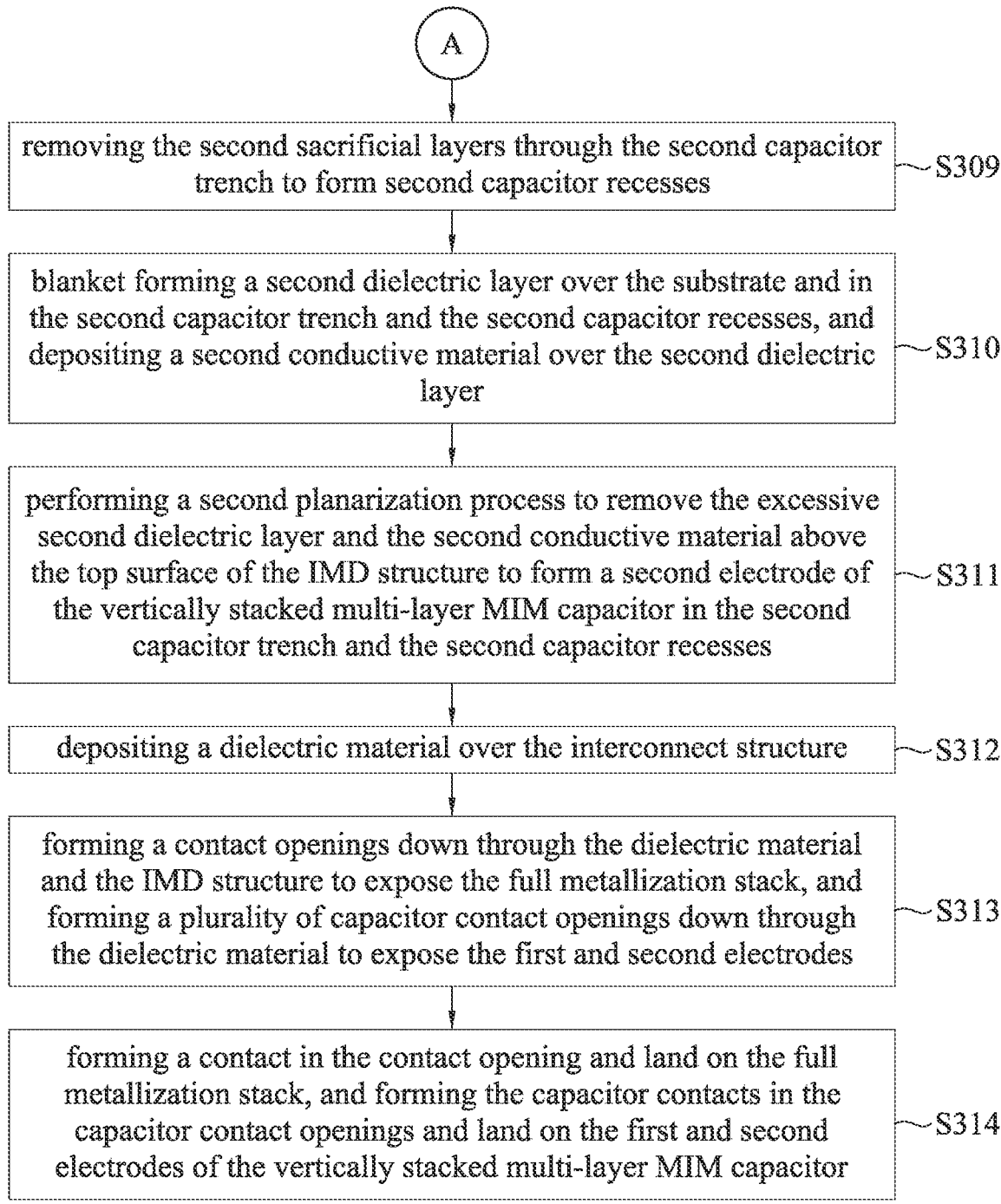
Figure 34A:
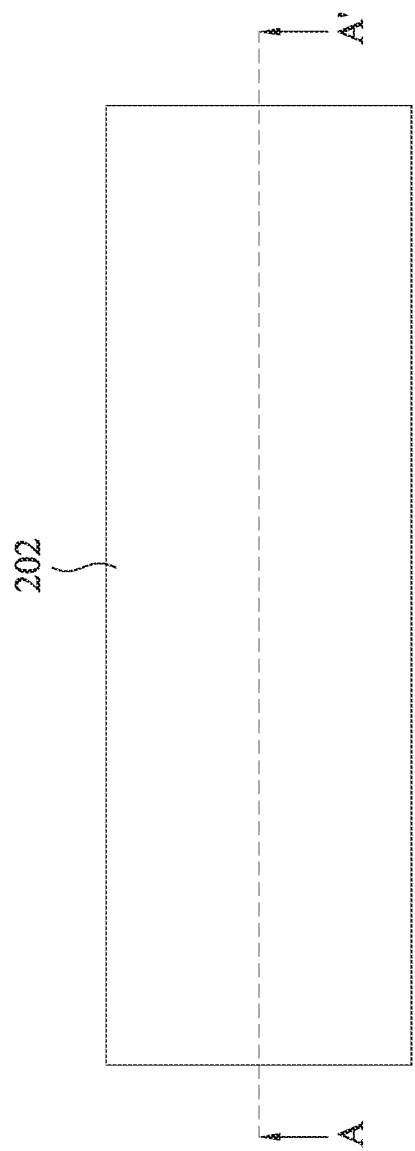
FIGS. 34A to 47B illustrate schematic views of intermediate stages in the formation of a vertically stacked multi-layer MIM capacitor in an integrated circuit in accordance with some embodiments of the present disclosure.
Figure 34B:
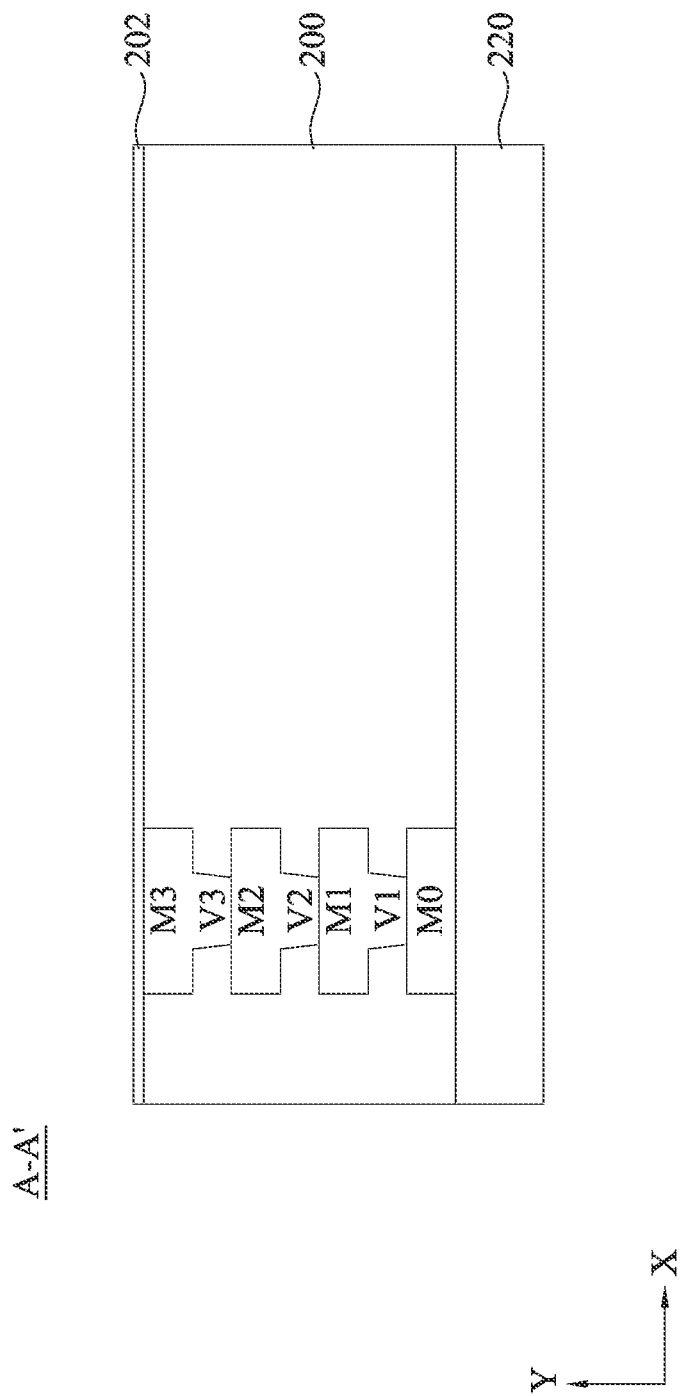

Referring now to FIGS. 33A and 33B, illustrated is a flowchart of an exemplary method M3 for fabrication of an integrated circuit including a capacitor in BEOL in accordance with some embodiments. The method M3 includes a relevant part of the entire manufacturing process. It is understood that additional operations may be provided before, during, and after the operations shown by FIGS. 33A and 33B, and some of the operations described below can be replaced or eliminated for additional embodiments of the method. The order of the operations/processes may be interchangeable. The method M3 includes fabrication of a semiconductor device. However, the fabrication of the semiconductor device is merely an example for describing the manufacturing process according to some embodiments of the present disclosure.

FIGS. 33A to 47B illustrate schematic views of intermediate stages in the formation of a capacitor in an integrated circuit in accordance with some embodiments of the present disclosure. FIGS. 34A, 35A, 36A, 37A, 38A, 39A, 40A, 41A, 42A, 43A, 44A, 45A, 46A, and 47A are top views of the integrated circuit in accordance with some embodiments of the present disclosure. FIGS. 34B, 35B, 36B, 37B, 38B, 39B, 40B, 41B, 42B, 43B, 44B, 45B, 46B, and 47B are cross-sectional views obtained from a vertical plane corresponding to line A-A' in FIGS. 34A, 35A, 36A, 37A, 38A, 39A, 40A, 41A, 42A, 43A, 44A, 45A, 46A, and 47A.

The method M3 begins at block S301 where an interconnect structure is formed over a substrate. Referring to FIGS. 34A, 34B, 35A, and 35B in some embodiments of block S301, a substrate 220 may include silicon. Alternatively, the substrate 220 may include germanium, silicon germanium, gallium arsenide or other appropriate semiconductor materials. Also alternatively, the substrate 220 may include an epitaxial layer. For example, the substrate 220 may have an epitaxial layer overlying a bulk semiconductor. Further, the substrate 220 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 220 may include a semiconductor-on-insulator (SOI) structure. Also alternatively, the substrate 220 may include a buried dielectric layer, such as a buried oxide (BOX) layer, such as that formed by separation by implantation of oxygen (SIMOX) technology, wafer bonding, SEG, or another appropriate method.

Figure 35A:
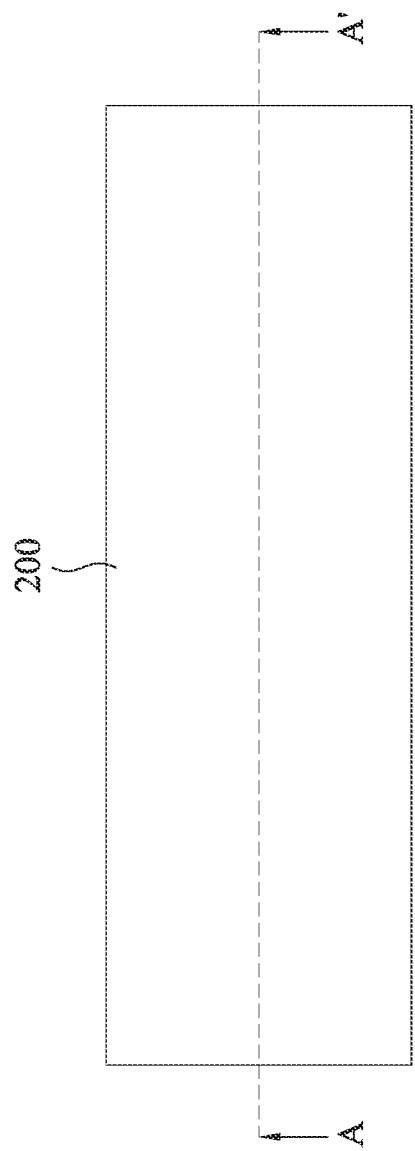
Figure 35B:
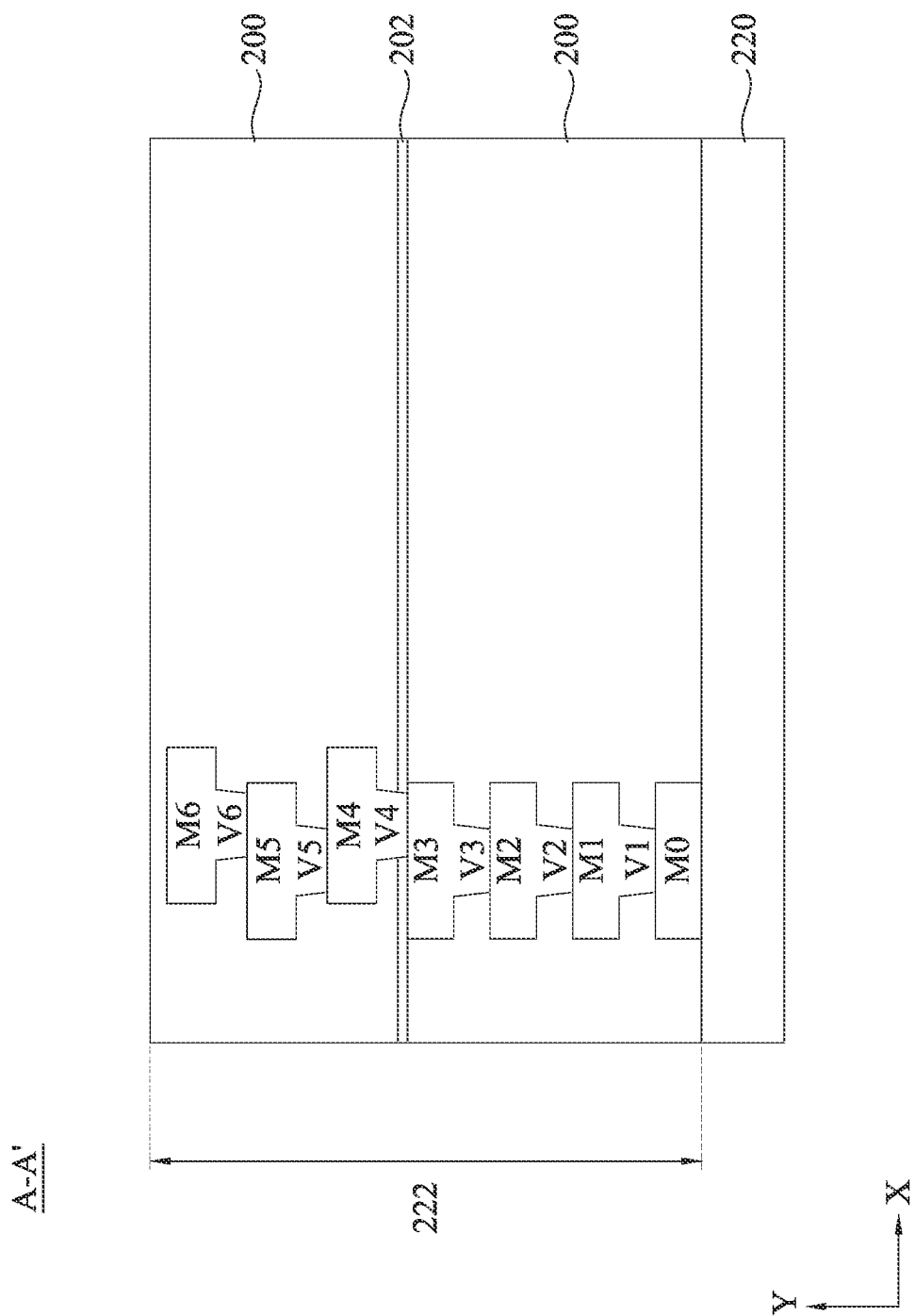

In some embodiments, an interconnect structure 222 is formed on the substrate 220 as shown in FIGS. 35A and 35B. The interconnect structure 222 may include, for example, seven metallization layers, labeled as M0 through M6, with six layers of metallization vias or interconnects, labeled as V1 through V6. Other embodiments may contain more or fewer metallization layers and corresponding more or fewer number of vias. The metal line illustrated here just for an example, and the metal line may be otherwise oriented (rotated 90 degrees or at other orientations). Each of metallization layers M0-M6 connected by interconnects V1-V6, with M0 connecting the stack to a source/drain contact of a transistor formed in the substrate 220. Also included in integrated circuit is a plurality of inter-metal dielectric (IMD) layers. In some embodiments, the plurality of IMD layers can be collectively referred to as an IMD structure 200. The IMD structure may provide electrical insulation as well as structural support for the various features of the integrated circuit during many fabrication process steps.

An etch stop layer 202 may be formed above one of the metallization layers, such as the metallization layer M3, prior to the forming of the interconnect V4. In some embodiments, the etch stop layer 202 may include $Si_3N_4$, $SiO_x$, SiON, SiC, SiBN, SiCBN, other suitable dielectric materials, or combinations thereof. In some embodiments, the etch stop layer 202 may be made of a different material than the IMD structure 200, the gate spacers 140, and/or the ILD layer 160. By way of example, if the IMD structure 200 is made of silicon oxide, the etch stop layer 202 may be made of a dielectric material different from silicon oxide, such as silicon nitride. In some embodiments, the etch stop layer 202 can be formed using, for example, plasma enhanced CVD, low pressure CVD, ALD or other suitable techniques.

Figure 36A:
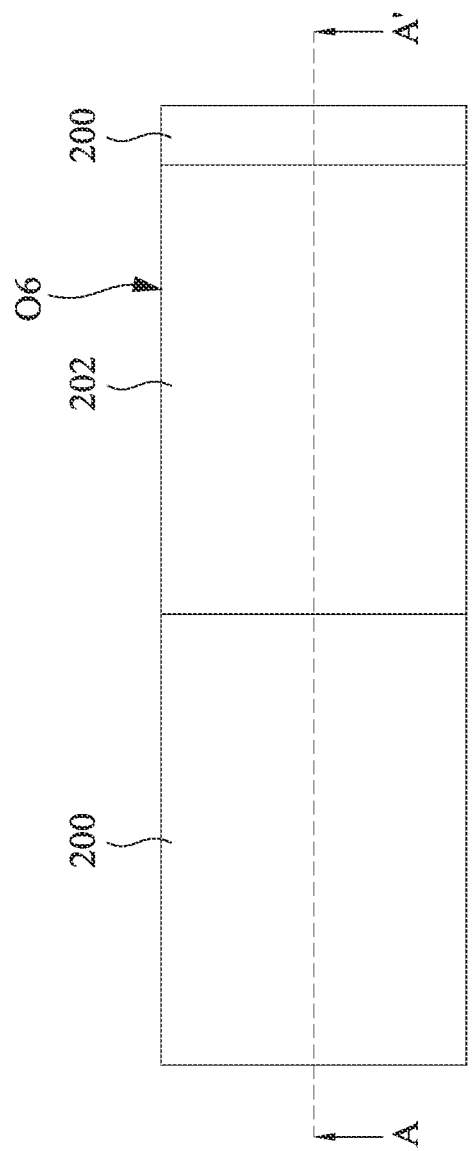
Figure 36B:
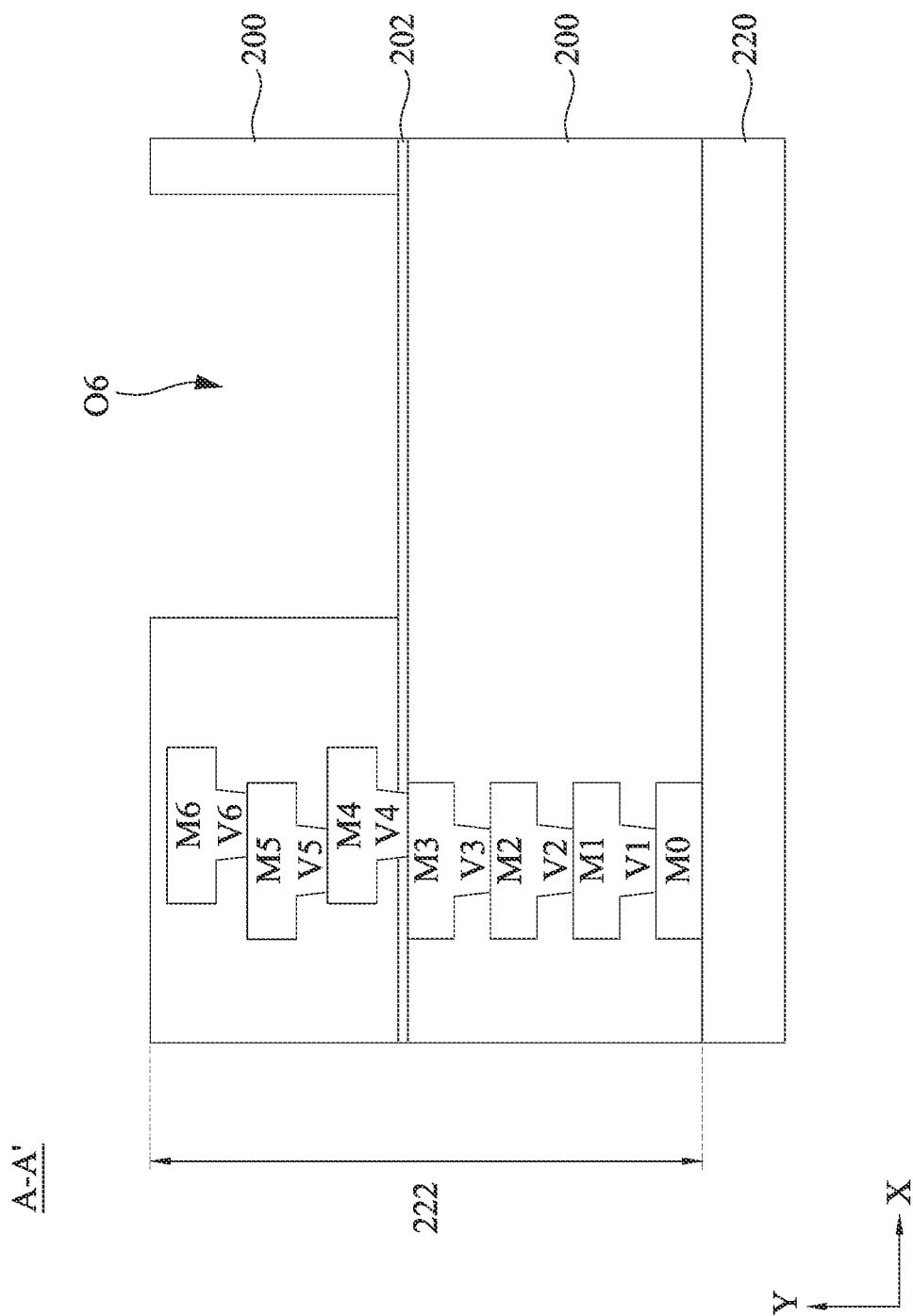

Referring back to FIG. 33A, the method M3 then proceeds to block S302 where an capacitor opening is form in an inter-metal dielectric (IMD) structure of the interconnect structure. With reference to FIGS. 36A and 36B, in some embodiments of block S302, a capacitor opening O6 where a vertically stacked multi-layer MIM capacitor C2 (see FIG. 35B) will be subsequently formed therein may be formed in the IMD structure 200. For example, a patterned mask (not shown) may be formed over the IMD structure 200 and used to etch the capacitor opening O6 that extend through the interconnect structure 222 by using photolithography and etching techniques until the etch stop layer 202 is exposed. In some embodiments, after the capacitor opening O6 is formed, the patterned mask can be removed by a suitable technique, such a wet clean process, an ashing process, or the like.

Figure 37A:
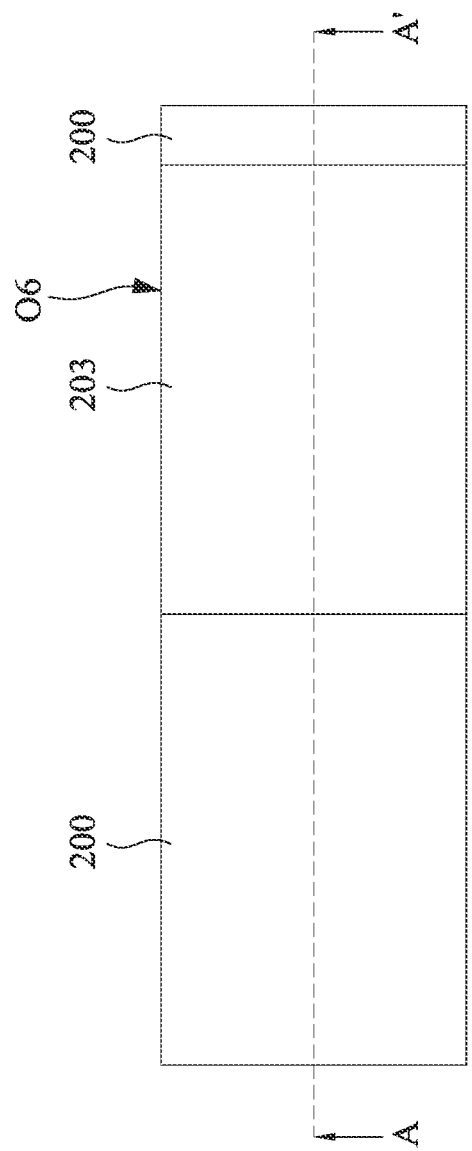
Figure 37B:
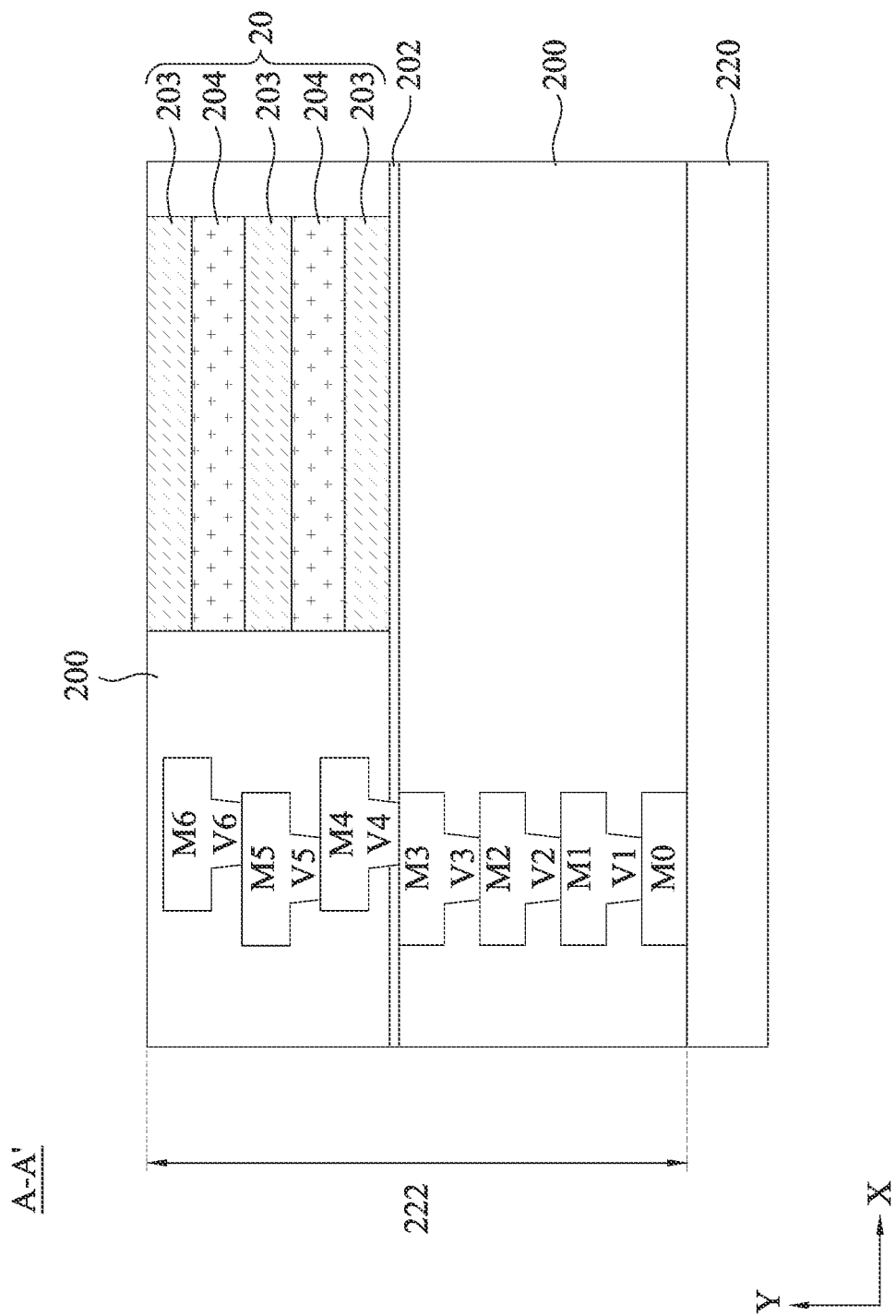
Figure 39A:
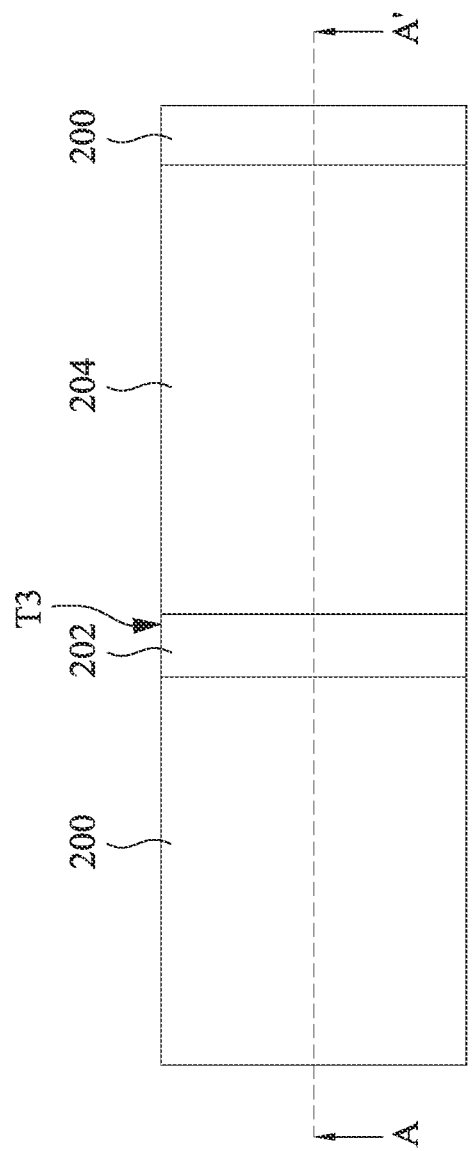
Figure 39B:
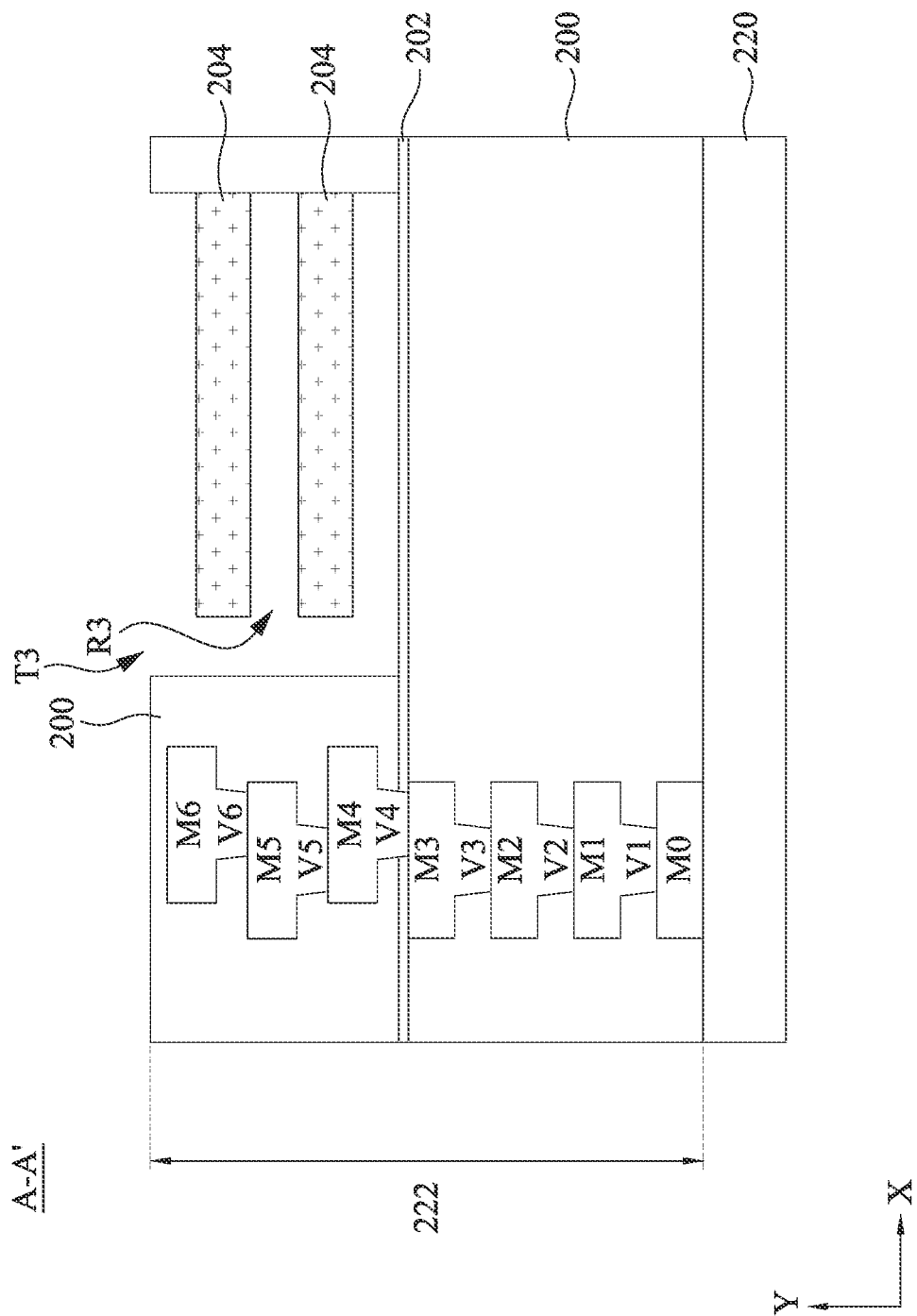
Figure 43A:
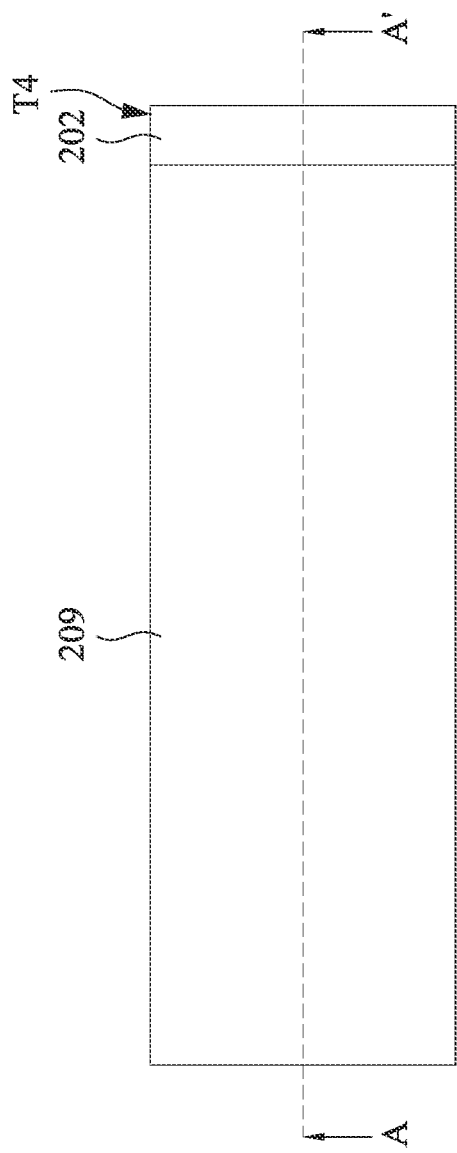
Figure 43B:
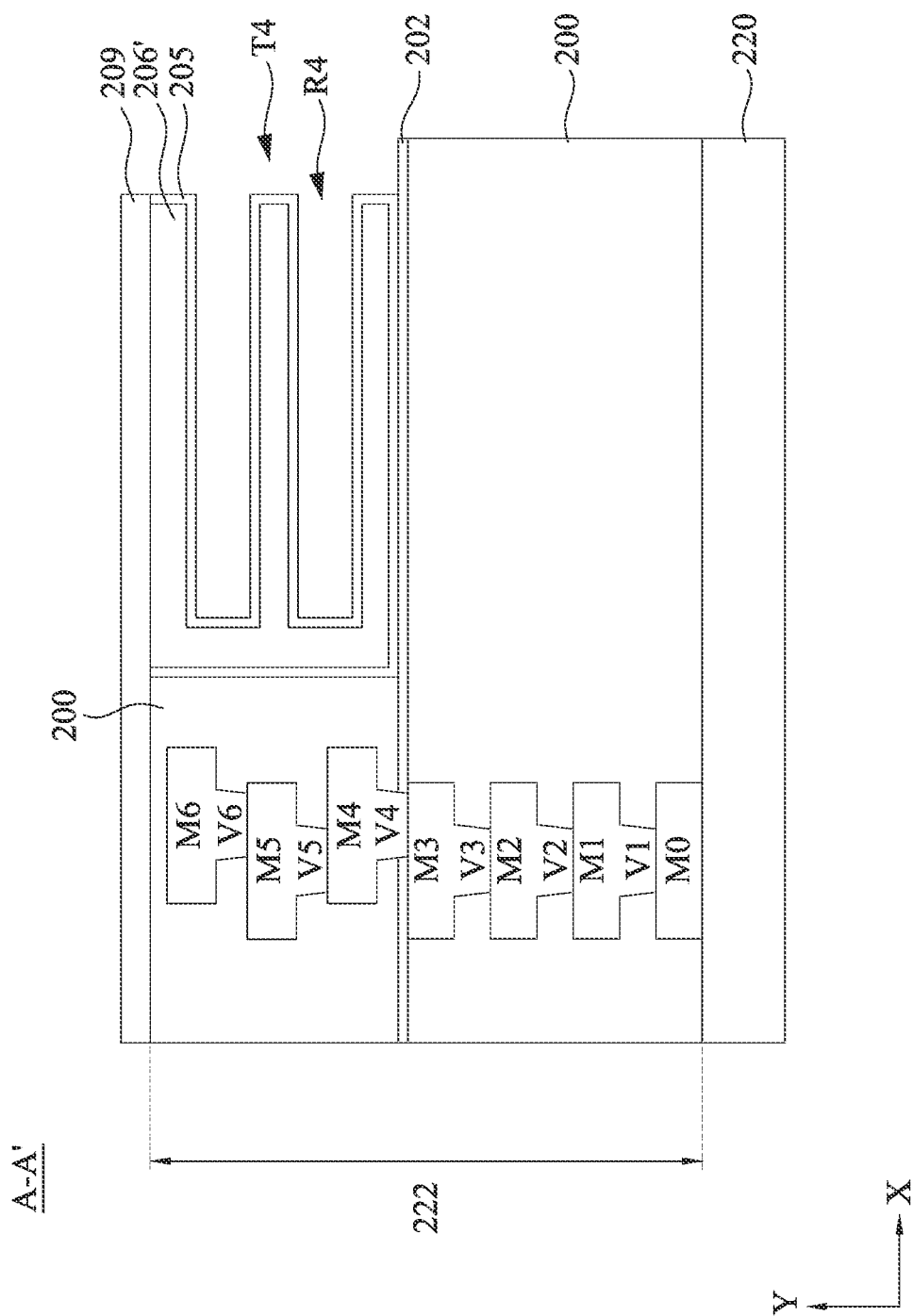

Referring back to FIG. 33A, the method M3 then proceeds to block S303 where a sacrificial multi-layer stack including alternating first sacrificial layers and second sacrificial layers is formed in the capacitor opening of the IMD structure of the interconnect structure. With reference to FIGS. 37A and 37B, in some embodiments of block S303, a sacrificial multi-layer stack 20 is formed in the capacitor opening O6 of the IMD structure 200. The sacrificial multi-layer stack 20 includes alternating first sacrificial layers 203 and second sacrificial layers 204. In some embodiments, as will be subsequently described in greater detail, the first sacrificial layers 203 and second sacrificial layers 204 will be removed in sequence as shown in FIGS. 39B and 43B. The first sacrificial layers 203 can have a different etching selectivity than the etching of the second sacrificial layers 204. The first sacrificial layers 203 are formed of a different material than the second sacrificial layers 204. For example, the first sacrificial layers 203 are formed of metal nitride, and the second sacrificial layers 204 are formed of a semiconductor material. The metal nitride may include titanium nitride (TiN), tantalum nitride (TaN), tungsten nitride (WN), or the like. The semiconductor material may include a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like.

In some embodiments, the sacrificial multi-layer stack 20 includes three layers of the first sacrificial layers 203 and two layers of the second sacrificial layers 204. It should be appreciated that the sacrificial multi-layer stack 20 may include any number of the first sacrificial layers 203 and the second sacrificial layers 204. By way of example but not limiting the present disclosure, a number of the first sacrificial layers 203 and the second sacrificial layers 204 may be in a range from about 1 to about 1000. The first and second sacrificial layers 203 and 204 in the sacrificial multi-layer stack 20 are formed by alternating deposition and etching processes in sequence. For example, each sacrificial layer is formed by depositing a sacrificial material in opening O6, followed by removing a portion of the sacrificial material from sidewalls of the opening O6 by a directional etching process, while leaving another portion of the sacrificial material at a bottom of the opening O6. In some embodiments, each of the layers of the sacrificial multi-layer stack 20 may be grown by a process such as vapor phase epitaxy (VPE) or molecular beam epitaxy (MBE), deposited by a process such as chemical vapor deposition (CVD) or atomic layer deposition (ALD), or the like.

Figure 38A:
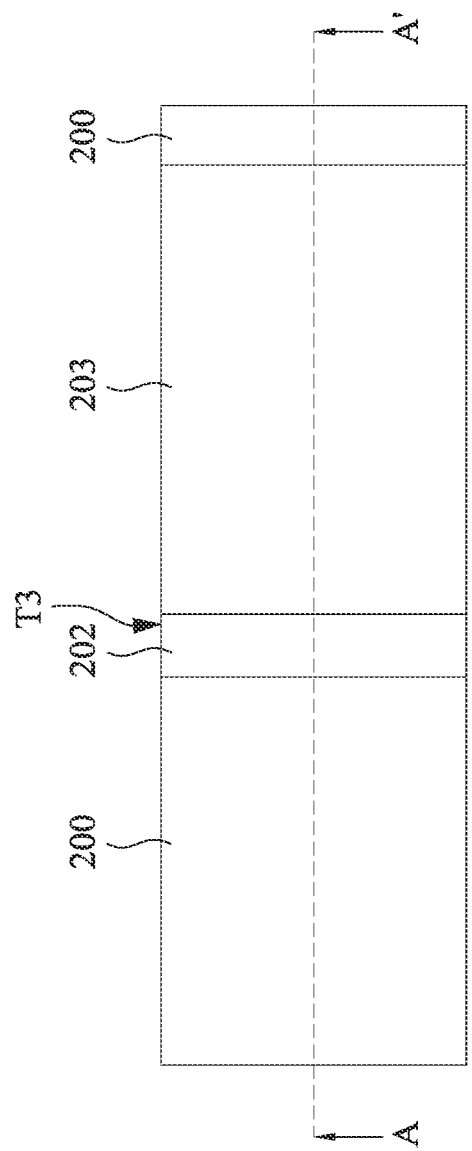
Figure 38B:
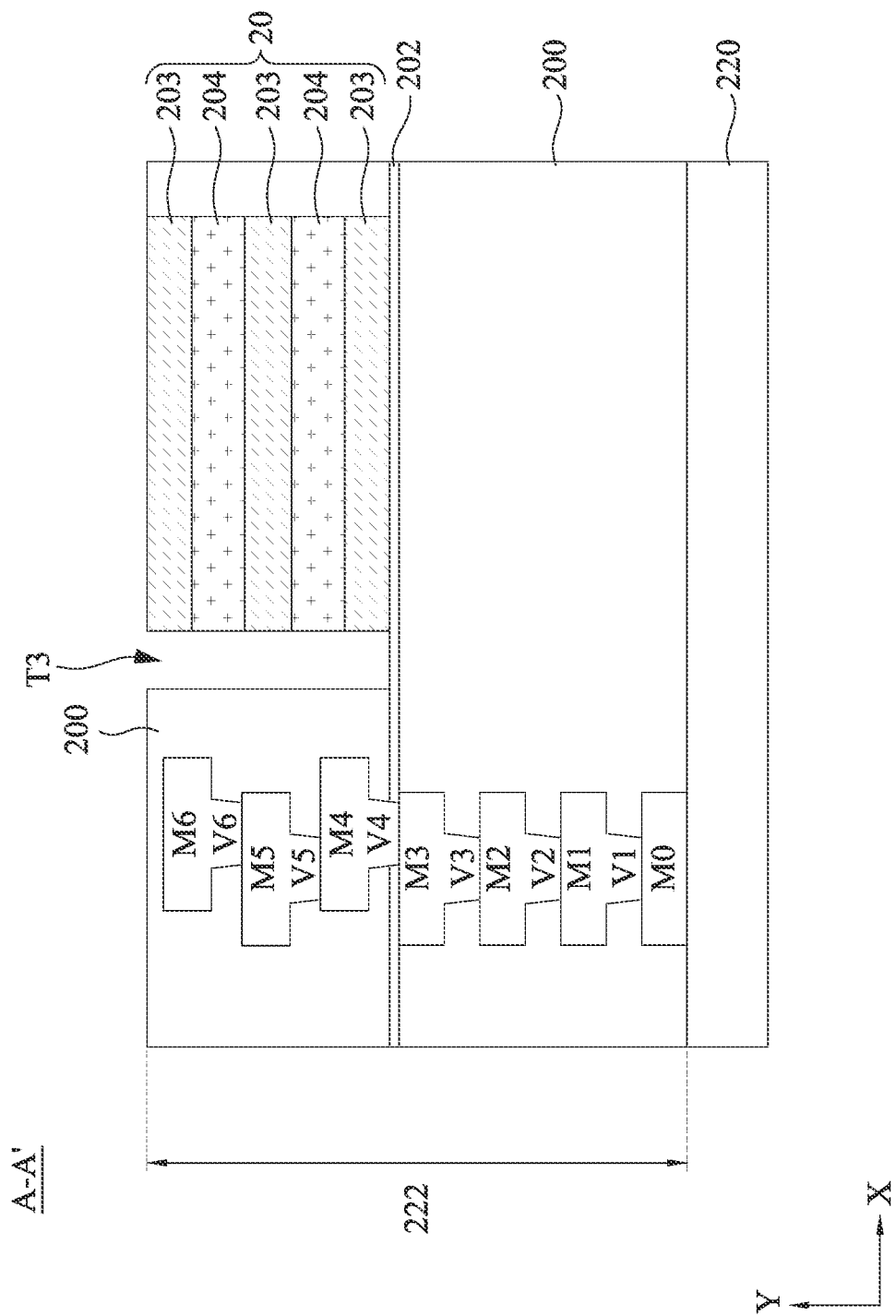

Referring back to FIG. 33A, the method M3 then proceeds to block S304 where a first capacitor trench is formed in the IMD structure to expose a sidewall of the sacrificial multi-layer stack. With reference to FIGS. 38A and 38B, in some embodiments of block S304, a first capacitor trench T3 is formed in the IMD structure 200 to expose a sidewall of the sacrificial multi-layer stack 20. For example, a patterned mask (not shown) may be formed over the IMD structure 200 and used to etch the first capacitor trench T3 that extend in the IMD structure 200 by using photolithography and etching techniques to expose the sidewall of the sacrificial multi-layer stack 20. In some embodiments, after the first capacitor trench T3 is formed, the patterned mask can be removed by a suitable technique, such as a planarization process, a wet clean process, an ashing process, or the like. In some embodiments, the first capacitor trench T3 can be interchangeably referred to a first capacitor opening.

Referring back to FIG. 33A, the method M3 then proceeds to block S305 where the first sacrificial layers in the sacrificial multi-layer stack are removed to form first capacitor recesses through the first capacitor trench. With reference to FIGS. 39A and 39B, in some embodiments of block S305, the first sacrificial layers 203 (see FIG. 38B) in the sacrificial multi-layer stack 20 are removed, so that the first capacitor recesses R3 are formed. The first capacitor recesses R3 expose three side surfaces of each of the second sacrificial layers 204. In some embodiments, the first sacrificial layers 203 are removed by an anisotropic dry etch process. For example, the etching process may include a dry etch process using reaction gas(es) that selectively etch the first sacrificial layers 203 at faster rates than the IMD structure 200 and the etch stop layer 202. In some embodiments, the first capacitor recesses R3 can be interchangeably referred to capacitor electrode spaces inheriting the shapes of the first sacrificial layers 203.

Figure 40B:
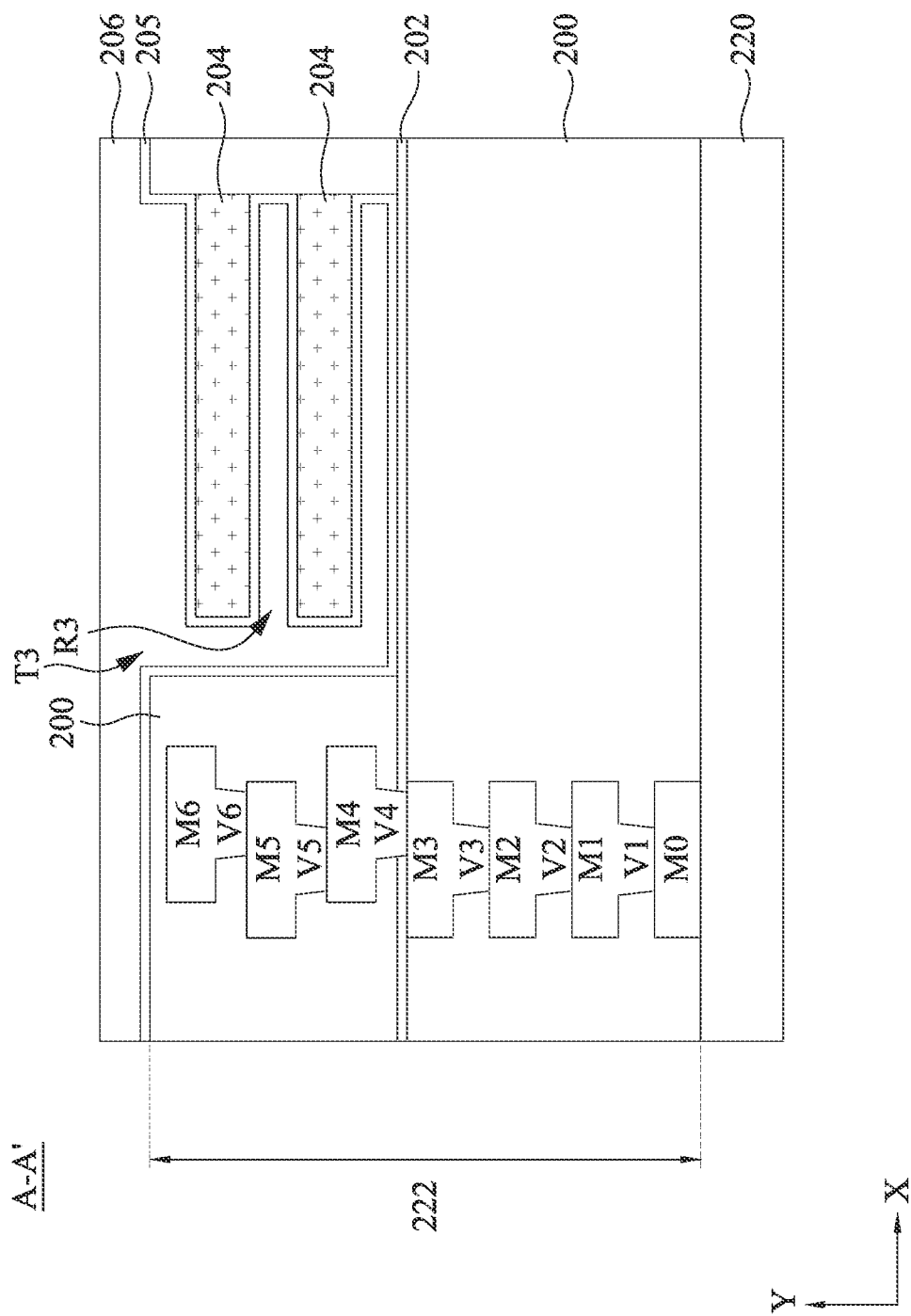

Referring back to FIG. 33A, the method M3 then proceeds to block S306 where a dielectric layer is blanket formed in the first capacitor trench and the first capacitor recesses, and a first conductive material is deposited over the dielectric layer. With reference to FIGS. 40A and 40B, in some embodiments of block S306, a dielectric layer 205 is blanket formed over the IMD structure 200 and in the first capacitor trench T3 and the first capacitor recesses R3. Subsequently, a conductive material 206 is deposited over the dielectric layer 205. In some embodiments, an interface between the dielectric layer 205 and the conductive material 206 can be smooth or rough.

In some embodiments, the dielectric layer 205 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 205 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 205 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 205 may have a multilayer structure including, such as a silicon oxide layer (e.g., $SiO_2$ layer), a first high-k material layer (e.g., $HfO_2$ layer), and a second high-k material layer (e.g., $ZrO_2$ layer). In some embodiments, the dielectric layer 205 may be deposited using any suitable method, such as CVD, physical vapor deposition (PVD), ALD, PEALD, PECVD, SACVD, FCVD, spin-on, and/or the like, or a combination thereof.

In some embodiments, the conductive material 206 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the conductive material 206 may include, but are not limited to, titanium nitride (TiN), tungsten nitride (WN), tungsten (W), ruthenium (Ru), palladium (Pd), platinum (Pt), cobalt (Co), copper (Cu), nickel (Ni), argentum (Ag), Aurum (Au), conductive metal oxides, and/or other suitable materials. In some embodiments, the conductive material 206 may be deposited using any suitable method, such as CVD, physical vapor deposition (PVD), ALD, PEALD, PECVD, SACVD, FCVD, spin-on, and/or the like, or a combination thereof.

Figure 41A:
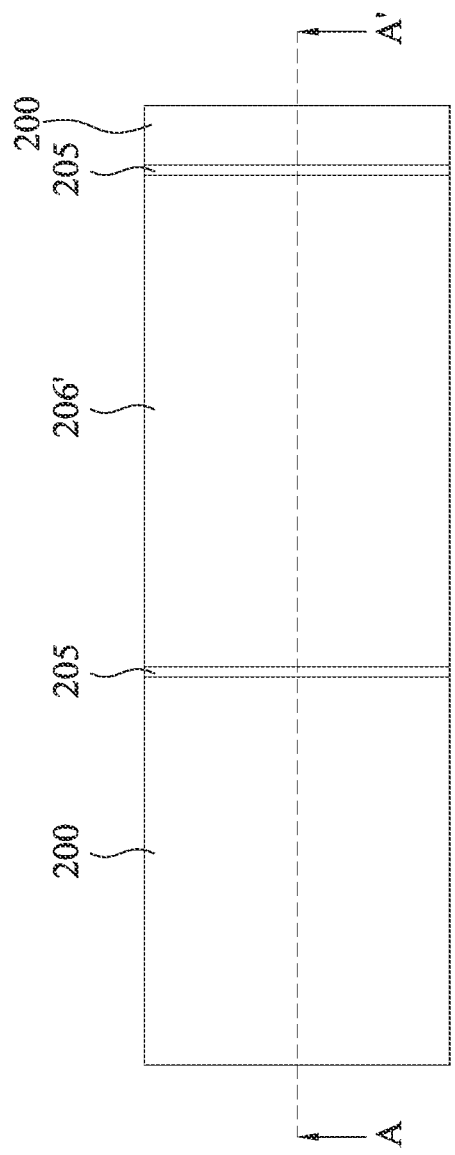
Figure 41B:
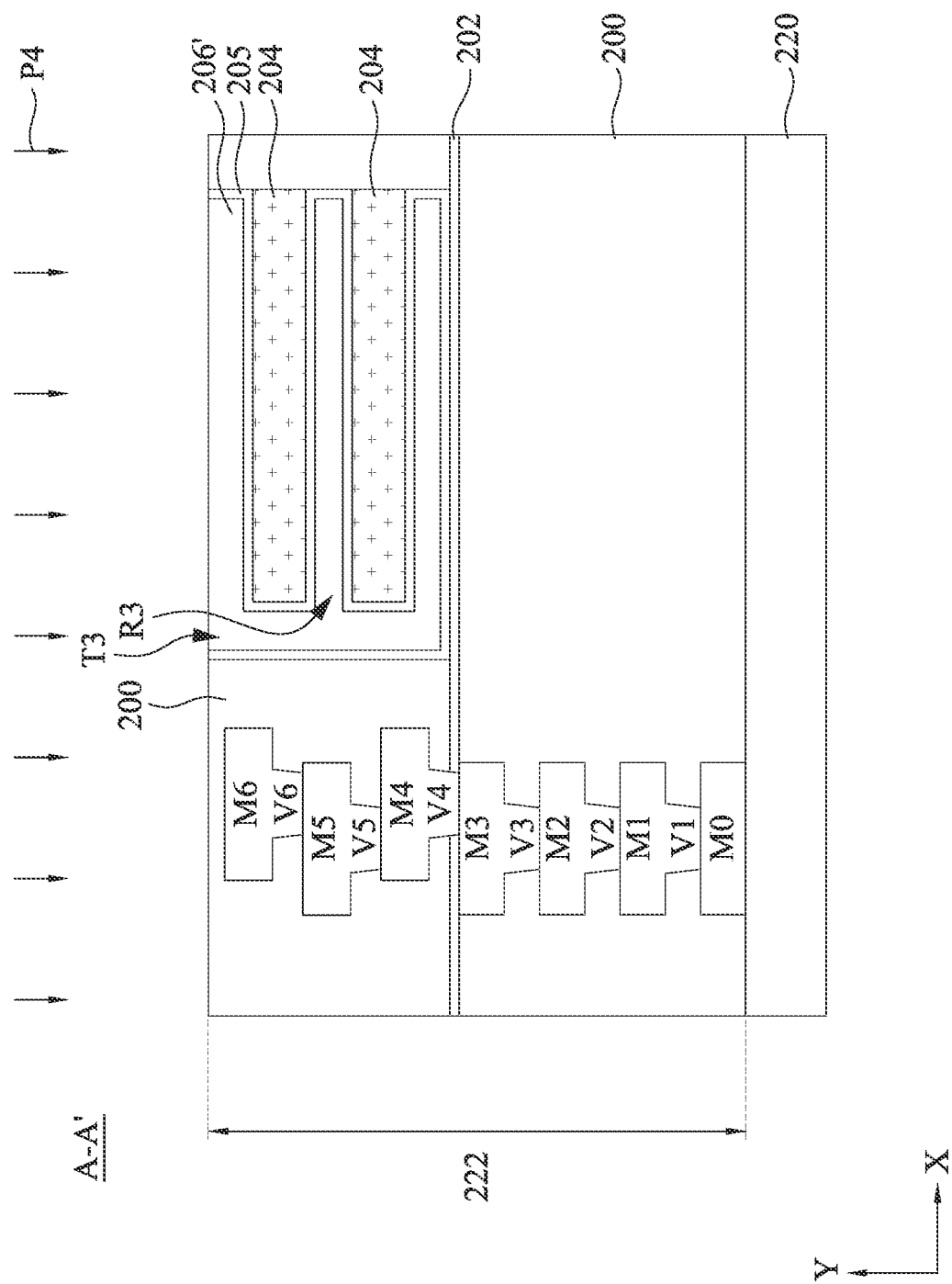

Referring back to FIG. 33A, the method M3 then proceeds to block S307 where a first planarization process is performed to remove the excessive first dielectric layer and the first conductive material above a top surface of the IMD structure to form a first electrode of a vertically stacked multi-layer metal-insulator-metal (MIM) capacitor in the first capacitor trench and the first capacitor recesses. With reference to FIGS. 41A and 41B, in some embodiments of block S307, a planarization process P4 is performed to remove the excessive dielectric layer 205 and the conductive material 206 above a top surface of the IMD structure 200 to form a first electrode 206' of a vertically stacked multi-layer MIM capacitor C2 (see FIG. 45B) in the first capacitor trench T3 and the first capacitor recesses R3.

Figure 42A:
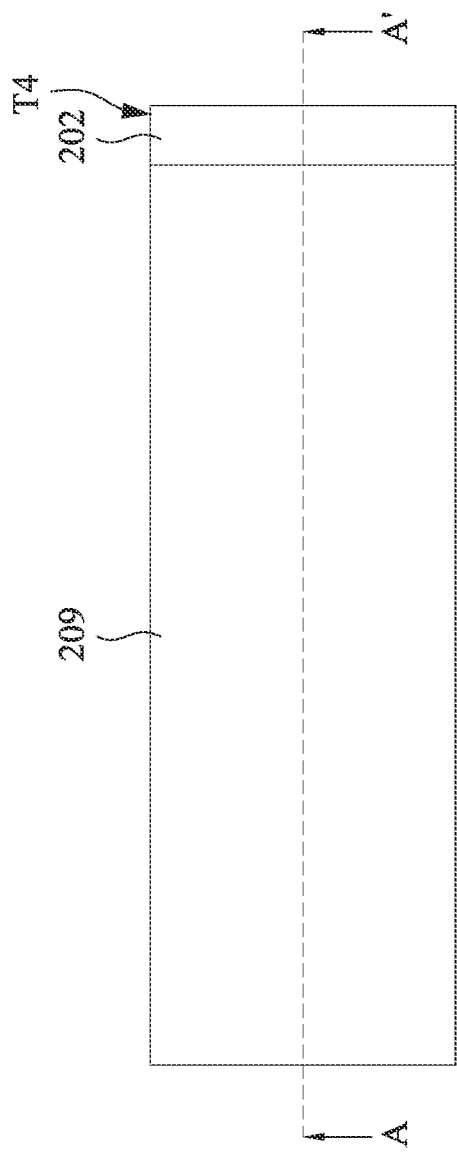
Figure 42B:
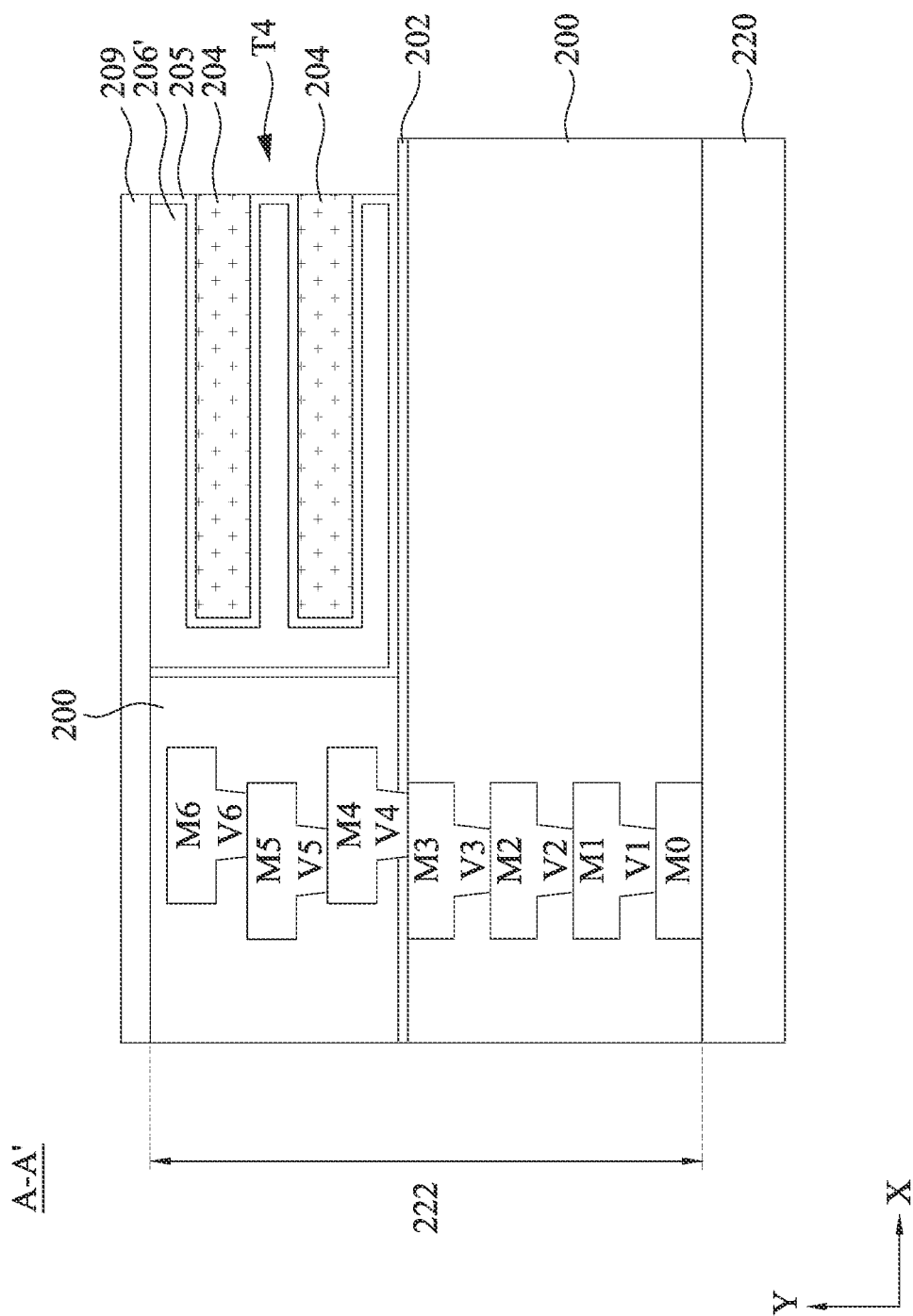

Referring back to FIG. 33A, the method M3 then proceeds to block S308 where the IMD structure adjacent to the sacrificial multi-layer stack is removed to form a second capacitor trench that exposes the second sacrificial layers. With reference to FIGS. 42A and 42B, in some embodiments of block S308, the IMD structure 200 adjacent to the second sacrificial layers 204 (see FIG. 41B) is removed to form a second capacitor trench T4 that exposes the second sacrificial layers 204. For example, a patterned mask 209 may be formed over the full metallization stack and first electrode 205' while remains the IMD structure 200 adjacent to the second sacrificial layers 204 uncovered. The patterned mask 209 can be used to etch the second capacitor trench T4 that extend in the IMD structure 200 by using photolithography and etching techniques to expose the second sacrificial layers 204. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). For example, the etching process may include a dry etch process using reaction gas(es) that selectively etch the IMD structure 200 at a faster rate than the etch stop layer 202. In some embodiments, the patterned mask 209 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the patterned mask 209 may be made of a different material than the etch stop layer 202 and/or the IMD structure 200. In some embodiments, the patterned mask 209 may be made of the same material as the etch stop layer 202 and/or the IMD structure 200. In some embodiments, the second capacitor trench T4 can be interchangeably referred to a second capacitor opening.

Referring back to FIG. 33B, the method M3 then proceeds to block S309 where the second sacrificial layers are moved through the second capacitor trench to form second capacitor recesses. With reference to FIGS. 43A and 43B, in some embodiments of block S309, the second sacrificial layers 204 (see FIG. 42B) are moved in one or more etching process through the second capacitor trench T4, so that the second capacitor recesses R4 are formed. For example, the second sacrificial layers 204 are removed by a suitable etching techniques, such as dry etching, wet etching, and/or other etching methods (e.g., reactive ion etching). In some embodiments, the second sacrificial layers 204 are removed by an anisotropic dry etch process. For example, the etching process may include a dry etch process using reaction gas(es) that selectively etch the second sacrificial layers 204 at faster rates than the dielectric layer 205 and the etch stop layer 202. In some embodiments, the second capacitor recesses R4 can be interchangeably referred to capacitor electrode spaces inheriting the shapes of the second sacrificial layers 204.

Figure 44A:
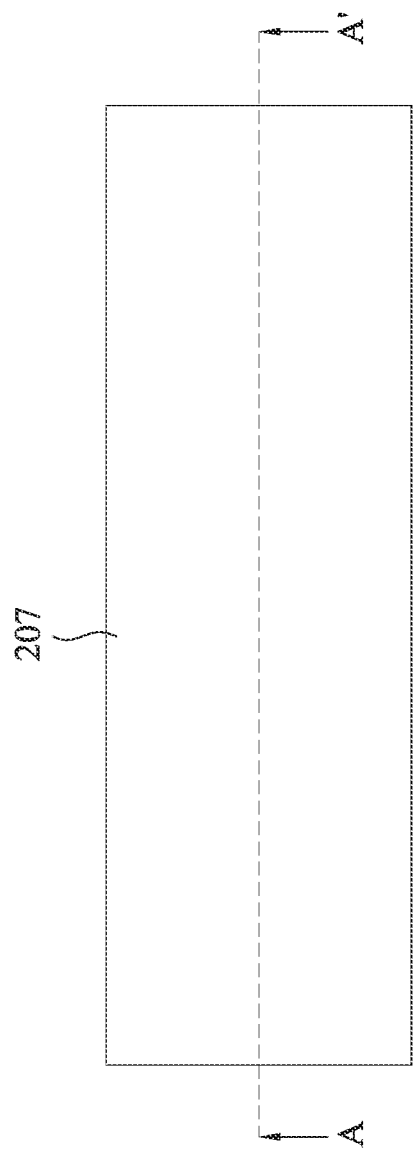
Figure 44B:
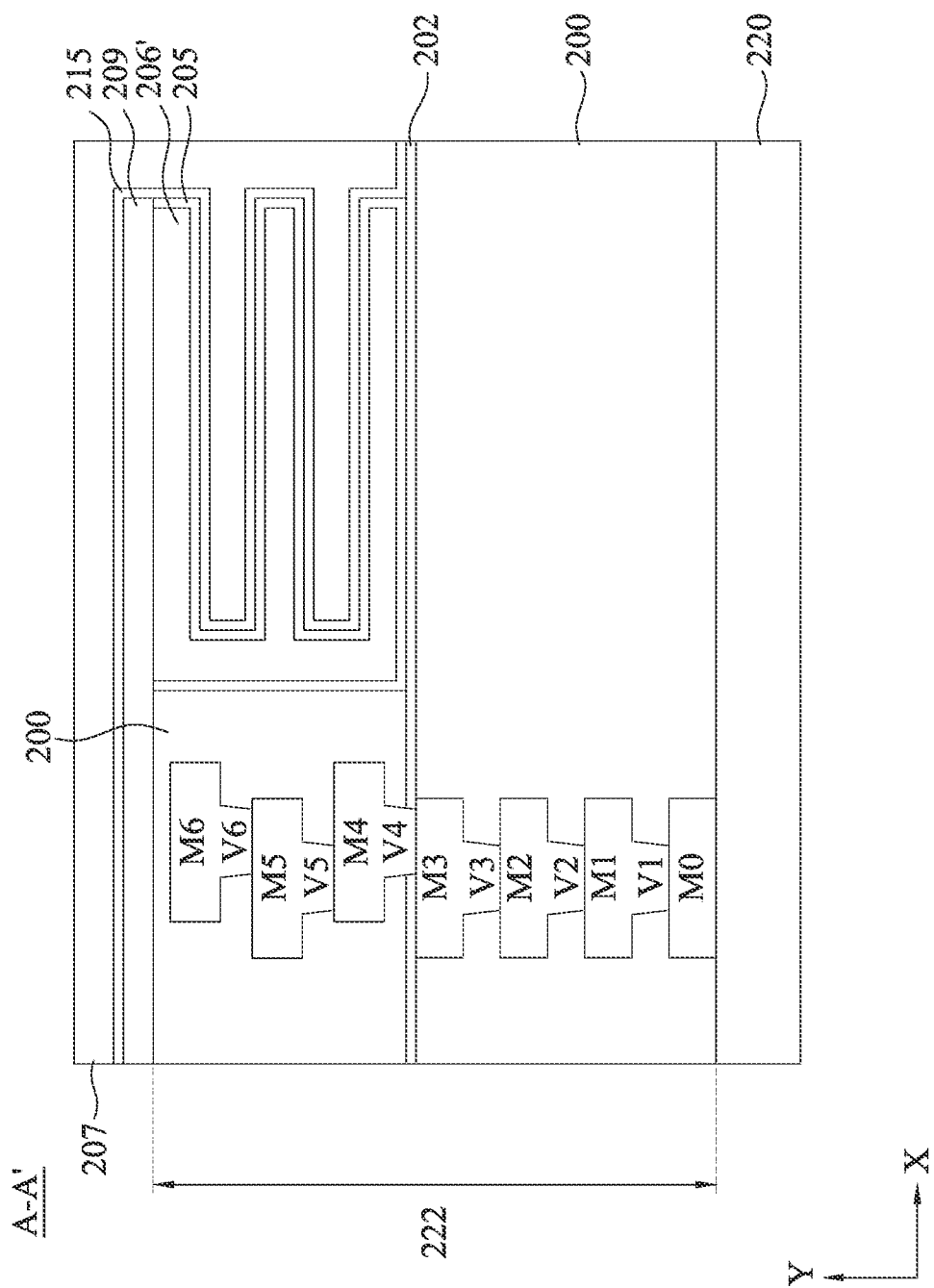

Referring back to FIG. 33B, the method M3 then proceeds to block S310 where a second dielectric layer is blanket formed over the substrate and in the second capacitor trench and the second capacitor recesses, and a second conductive material is deposited over the second dielectric layer. With reference to FIGS. 44A and 44B, in some embodiments of block S310, a dielectric layer 215 is blanket formed over the interconnect structure 222 and in the second capacitor trench T4 and the second capacitor recesses R4. Subsequently, a conductive material 207 is deposited over the dielectric layer 215. In some embodiments, an interface between the dielectric layer 215 and the conductive material 207 can be smooth or rough.

In some embodiments, the dielectric layer 215 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the dielectric layer 215 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), any suitable materials, or combinations thereof. In some embodiments, the dielectric layer 215 may include SiCN, $SiO_2$, HZO (a mixture of $HfO_2$ and $ZrO_2$), PZT ($PbZr_{0.52}Ti_{0.84}O_3$), VDF-TrFE (ferroelectric polymer), any suitable materials, or combinations thereof. In alternative embodiments, the dielectric layer 215 may have a multilayer structure including, such as a silicon oxide layer (e.g., $SiO_2$ layer), a first high-k material layer (e.g., $HfO_2$ layer), and a second high-k material layer (e.g., $ZrO_2$ layer).

In some embodiments, the dielectric layer 215 may be made of the same material as the dielectric layer 205. In some embodiments, the dielectric layer 215 may be made of a different material than the dielectric layer 205. In some embodiments, the dielectric layer 215 may be deposited using any suitable method, such as CVD, physical vapor deposition (PVD), ALD, PEALD, PECVD, SACVD, FCVD, spin-on, and/or the like, or a combination thereof.

In some embodiments, the conductive material 207 may include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the conductive material 207 may include, but are not limited to, titanium nitride (TiN), tungsten nitride (WN), tungsten (W), ruthenium (Ru), palladium (Pd), platinum (Pt), cobalt (Co), copper (Cu), nickel (Ni), argentum (Ag), Aurum (Au), conductive metal oxides, and/or other suitable materials. In some embodiments, the conductive material 207 may be made of the same material as the conductive material 206. In some embodiments, the conductive material 207 may be made of a different material than the conductive material 206. In some embodiments, the conductive material 207 may be deposited using any suitable method, such as CVD, physical vapor deposition (PVD), ALD, PEALD, PECVD, SACVD, FCVD, spin-on, and/or the like, or a combination thereof.

Figure 45A:
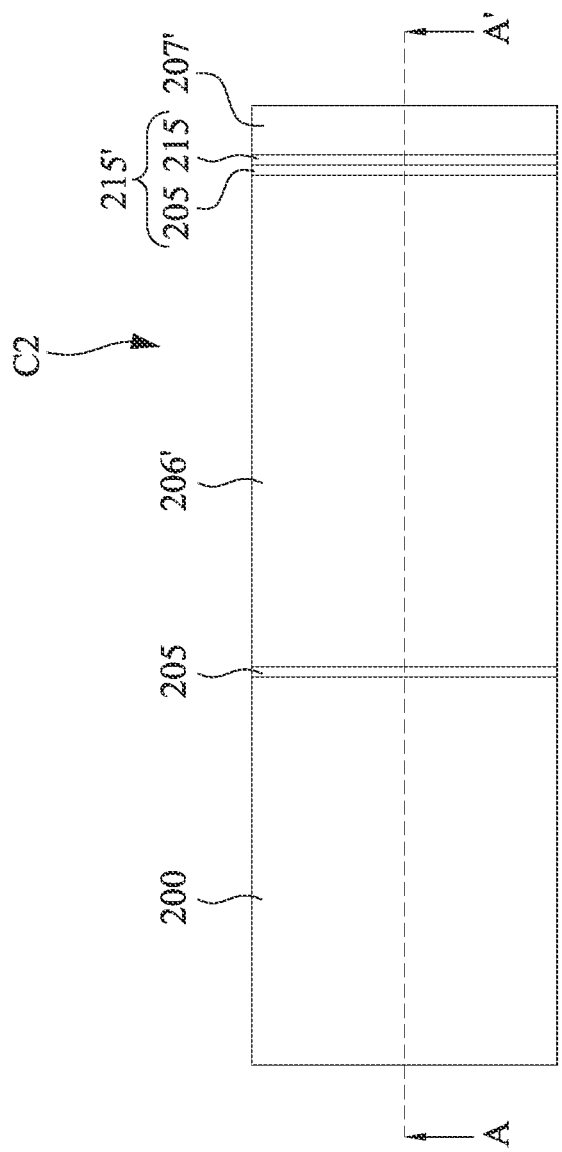
Figure 45B:
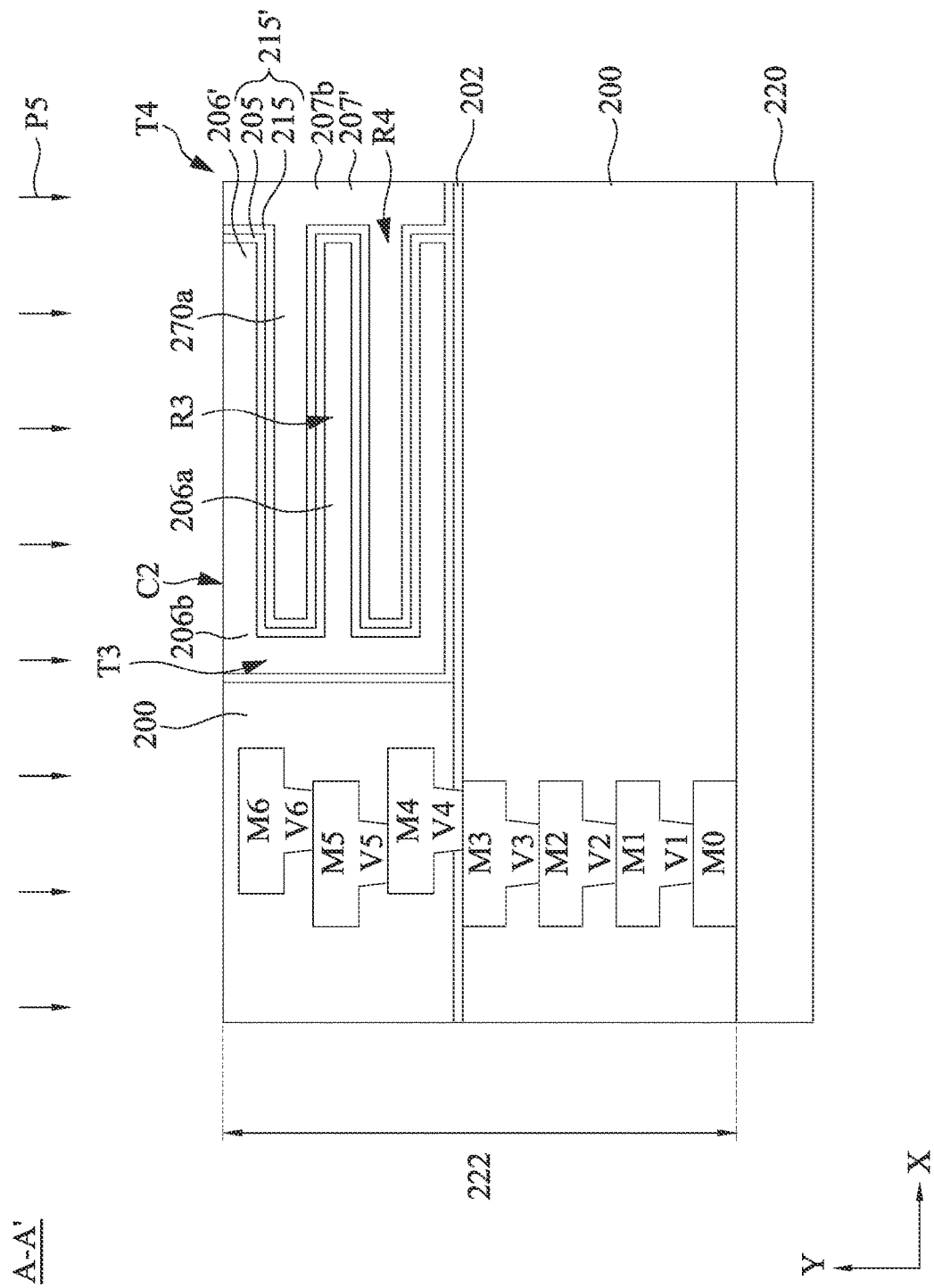

Referring back to FIG. 33B, the method M3 then proceeds to block S311 where a second planarization process is performed to remove the excessive second dielectric layer and the second conductive material above the top surface of the IMD structure to form a second electrode of the vertically stacked multi-layer MIM capacitor in the second capacitor trench and the second capacitor recesses. With reference to FIGS. 45A and 45B, in some embodiments of block S311, a planarization process P5 (e.g., CMP) is performed to remove the excessive dielectric layer 215 and the conductive material 207 above the top surface of the IMD structure 200 to form a second electrode 207' of the vertically stacked multi-layer MIM capacitor C2 in the second capacitor trench T4 and the second capacitor recesses R4. In some embodiments, the dielectric layers 205 and 215 can be collectively referred to as an insulator 215' of the vertically stacked multi-layer MIM capacitor C2. As a result of this method, the vertically stacked multi-layer MIM capacitor C2 may include the first and second electrode 206' and 207' and the insulator 205' sandwiched between the first and second electrode 206' and 207'.

This is described in greater detail with reference to FIG. 45B, the first electrode 206' of the vertically stacked multi-layer MIM capacitor C2 incudes a plurality of first lateral portions 206a formed in the first capacitor recesses R3 and a first vertical portion 206b formed in the first capacitor trench T3. The plurality of first lateral portions 206a extend in X-direction, and the first vertical portion 206b extends in Y-direction and connects the plurality of first lateral portion 206a. In some embodiments, at least two of the first lateral portions 206a may have different thicknesses. In some embodiments, the first lateral portions 206a may have a thickness in a range from about 0.1 nm to about 1 μm, such as about 0.1, 1, 10, 15, 100, or 1000 nm.

The second electrode 207' of the vertically stacked multi-layer MIM capacitor C2 incudes a plurality of second lateral portions 207a formed in the second capacitor recesses R4 and a second vertical portion 207b formed in the second capacitor trench T4. The second lateral portions 207a extend in X-direction, and the second vertical portion 207b extends in Y-direction and connects the plurality of second lateral portion 207a. The first lateral portions 206a interleave with the second lateral portions 207a. Therefore, the capacitor C2 can include vertically stacked interleaved lateral portions 206a and 207a. An advantage is that the capacitor C2 including vertically stacked interleaved electrodes can increase the overlap area therebetween, such that the capacitance of the capacitor C2 can be improved.

In some embodiments, at least two of the second lateral portions 207a may have different thicknesses. In some embodiments, the second lateral portions 207a may have a thickness in a range from about 0.1 nm to about 1 µm, such as about 0.1, 1, 10, 15, 100, or 1000 nm. The first electrode 206' is spaced apart from the second electrode 207' by the insulator 215'. In some embodiments, the insulator 215' may have a thickness in a range from about 0.1 nm to about 100 nm. In some embodiments, the vertically stacked multi-layer MIM capacitor C2 may be a cylinder, cuboid, thin film, or any suitable geometry, with or without rounded corners. In some embodiments, when viewed from a top view, the vertically stacked multi-layer MIM capacitor C2 may have a dimension (e.g., diameter, width, or length) in a range from about 1 nm to about 10 mm, such as about 1, 10, 100, 1000, 10000, 100000, or 100000 nm, by way of example but not limiting the present disclosure.

Figure 46A:
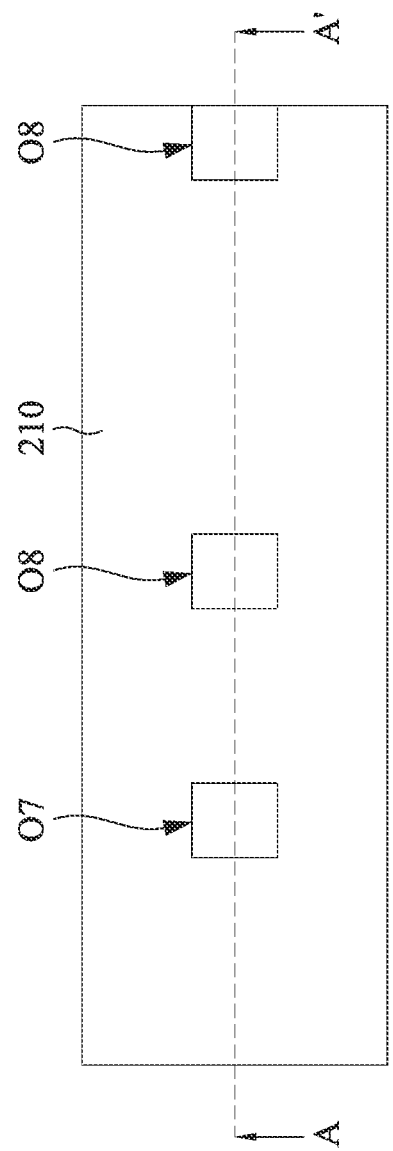
Figure 46B:
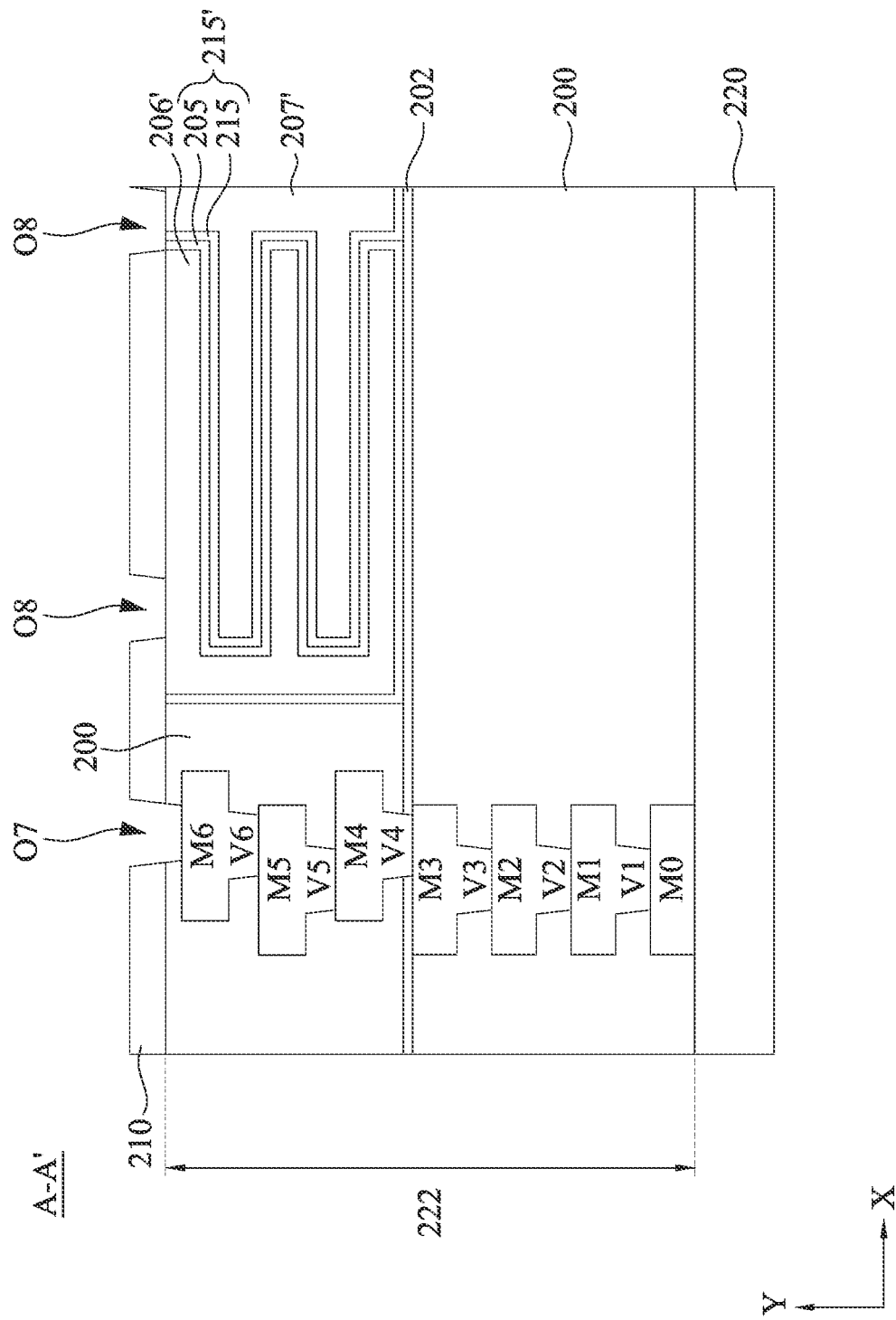

Referring back to FIG. 33B, the method M3 then proceeds to block S312 where a dielectric material is deposited over the interconnect structure. With reference to FIGS. 46A and 46B, in some embodiments of block S312, a dielectric material 210 is deposited over the interconnect structure 222. In some embodiments, the dielectric material 210 may be made of silicon oxide, silicon nitride, silicon oxynitride, silicon carbide, SiOC, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the dielectric material 210 may be deposited using any suitable method, such as CVD, physical vapor deposition (PVD), ALD, PEALD, PECVD, SACVD, FCVD, spin-on, and/or the like, or a combination thereof. In some embodiments, the dielectric material 210 can be interchangeably referred to a hard mask layer. In some embodiments, the dielectric material 210 may be made of the same material as the dielectric material 104. In some embodiments, the dielectric material 210 may be made of the same material as the IMD structure 200. In some embodiments, the dielectric material 210 may be made of a different material than the IMD structure 200.

Referring back to FIG. 33B, the method M3 then proceeds to block S313 where a contact opening are formed down through the dielectric material and the IMD structure to expose the full metallization stack, and a plurality of capacitor contact openings are formed down through the dielectric material to expose the first and second electrodes. With reference to FIGS. 46A and 46B, in some embodiments of block S313, a contact openings O7 are formed down through the dielectric material 210 and the IMD 200 to expose the full metallization stack, and a plurality of capacitor contact openings O8 are formed down through the dielectric material 210 to expose the first and second electrodes 206' and 207'.

Figure 47A:
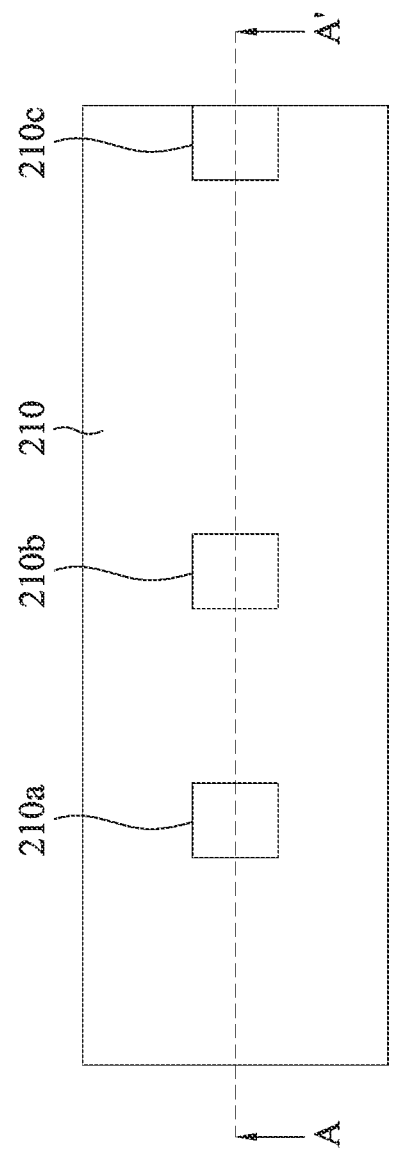
Figure 47B:
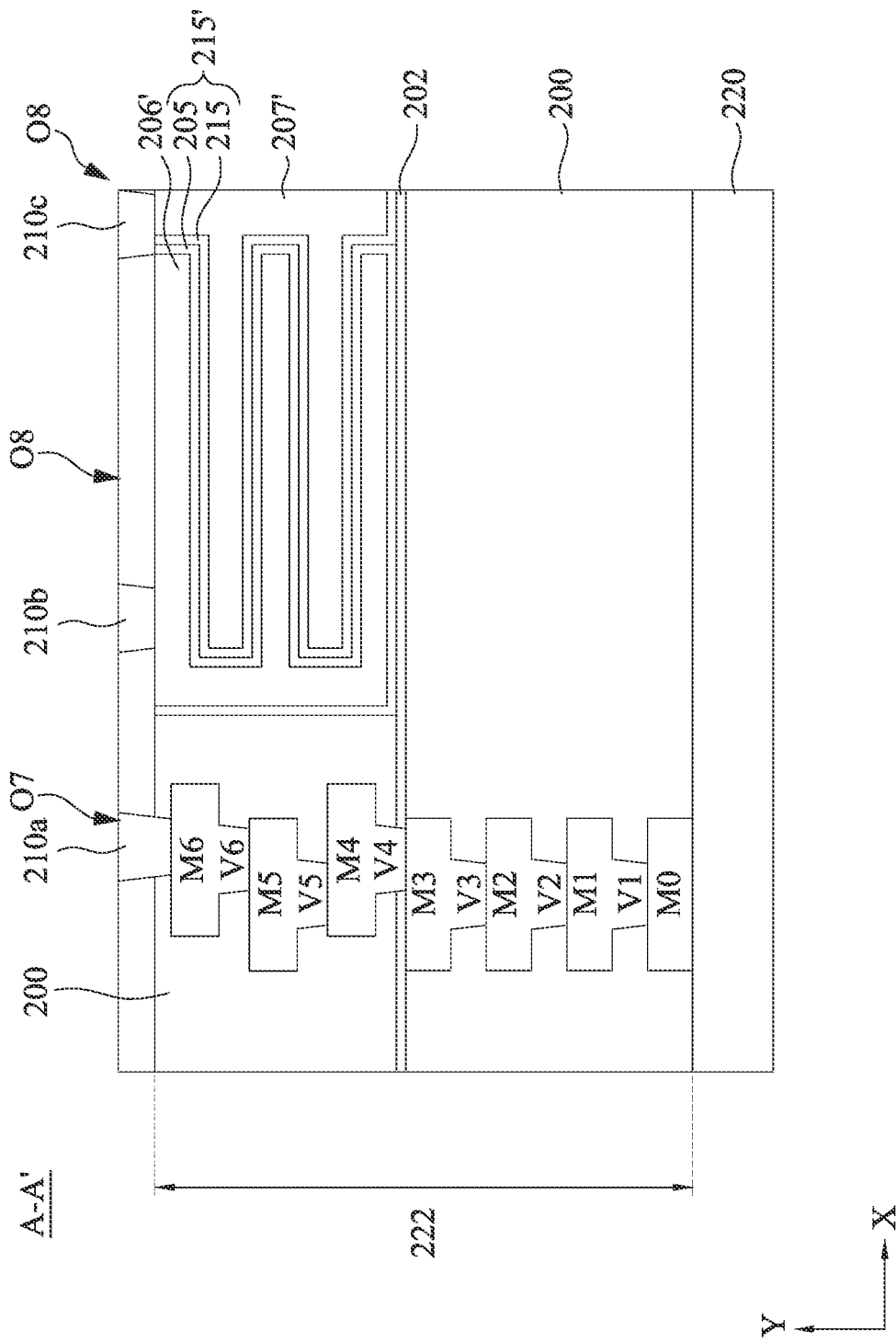

Referring back to FIG. 33B, the method M3 then proceeds to block S314 where a contact are formed in the contact opening and land on the full metallization stack, and the capacitor contacts are formed in the capacitor contact openings and land on the first and second electrodes of the vertically stacked multi-layer MIM capacitor. With reference to FIGS. 47A and 47B, in some embodiments of block S314, a conductive material is deposited over the IMD 200 to fill the contact opening O7 and the capacitor contact openings O8. Subsequently, a planarization process (e.g., CMP) is performed to remove the excess conductive material from above a top surface of the dielectric material 210. The remaining conductive material fills the contact opening O7 and serves as the contacts 210a and fills the capacitor contact openings O8 and serves as first and second capacitor contacts 210b and 210c. The contact 210a formed in the contact opening O7 land on the full metallization stack, and the capacitor contacts 110b and 110c formed in the capacitor contact openings O8 land on the first and second electrodes 206' and 207' of the vertically stacked multi-layer MIM capacitor C2. The capacitor contact 210b may be used to provide the first voltage potential to the first electrode 206', and the capacitor contact 210c may be used to provide the second voltage potential to the second electrode 207' of the vertically stacked multi-layer MIM capacitor C2, the second voltage potential is different than the first voltage potential.

In some embodiments, the conductive material may be deposited using any suitable method, such as CVD, physical vapor deposition (PVD), ALD, PEALD, PECVD, SACVD, FCVD, spin-on, and/or the like, or a combination thereof. In some embodiments, the conductive material may include TiN, TaN, Ti, Ta, Cu, Al, Ag, W, Ir, Ru, Pt, combinations thereof, or other suitable conductive materials.

In order to improving the capacitance of a MIM capacitor in an IC structure, the MIM capacitor may be in the form of a high AR cylinder structure or in the form of a multi-layer structure with a plurality of through vias penetrating thereof to increase the capacitance. However, the MIM capacitor in the form of the high AR cylinder structure needs high uniformities of electrodes and insulator to achieve high AR and a cap supporter to prevent the high AR cylinder structure from toppling, and the MIM capacitor in the form of the multi-layer structure with the through vias penetrating thereof may need additional through vias to connect the electrode layers therein, which will result in additional costs and increase the space occupied by the related components in the MIM capacitor.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a vertically stacked multi-layer MIM capacitor that includes vertically stacked interleaved electrodes. An advantage is that the capacitor of the present disclosure does not require a high AR trench etch process and high uniformity depositions for electrodes and insulator or an additional cap supporter as the high AR cylinder structure and additional through vias as the multi-layer structure, which in turn allows for reducing the manufacturing cost and decreasing the space occupied by the related components in the capacitor. Another advantage is that the vertically stacked interleaved electrodes of the capacitor can increase the overlap area therebetween, such that the capacitance of the capacitor can be improved.

In some embodiments, the method includes forming a sacrificial multi-layer stack including alternating first sacrificial layers and second sacrificial layers stacked in a vertical direction on a substrate; removing the first sacrificial layers to form first spaces each interposing two of the second sacrificial layers; depositing a first dielectric layer and a first electrode material in the first spaces; removing the second sacrificial layers to form second spaces each interposing two portions of the first electrode material; depositing a second dielectric layer and a second electrode material in the second spaces. In some embodiments, forming the sacrificial multi-layer stack includes alternating depositing first sacrificial films and second sacrificial films on the substrate; and patterning the first and second sacrificial films to form a fin. In some embodiments, the method further includes forming a gate structure on the substrate, the gate structure having a top surface level with a top surface of the first electrode material. In some embodiments, the gate structure includes a gate dielectric layer having a same material as the first dielectric layer. In some embodiments, the gate structure includes a gate electrode layer having a same material as the first electrode material. In some embodiments, the method further includes forming metallization layers on the substrate prior to forming the sacrificial multi-layer stack. In some embodiments, the first sacrificial layers are made of a material different than the second sacrificial layers and comprising silicon, germanium, stannum, silicon carbide, silicon germanium, germanium stannum, silicon germanium stannum, a III-V compound semiconductor, a II-VI compound semiconductor, or combinations thereof, and the second sacrificial layers are made of a material comprising silicon germanium, pure germanium, a III-V compound semiconductor, a II-VI compound semiconductor, or combinations thereof. In some embodiments, the first sacrificial layers are made of a metal nitride, and the second sacrificial layers are made of a silicon-containing material. In some embodiments, the metal nitride includes titanium nitride, tantalum nitride, tungsten nitride, or combinations thereof. In some embodiments, the second dielectric layer is made of a same material as the first dielectric layer. In some embodiments, the second dielectric layer is made of a different material than the first dielectric layer.

In some embodiments, the method includes forming a sacrificial multi-layer stack including alternating first sacrificial layers and second sacrificial layers stacked in a vertical direction on a substrate; depositing a dielectric material over the sacrificial multi-layer stack; forming a dummy gate structure in the dielectric material, the dummy gate structure having a material the same as the first sacrificial layers and different than the second sacrificial layers; etching the dielectric material to form a first opening exposing a first side of the sacrificial multi-layer stack; removing the dummy gate structure to form a gate trench, and removing the first sacrificial layers exposed by the first opening to form first spaces each between two of the second sacrificial layers; depositing a first high-k dielectric layer and a first electrode material in the gate trench, the first opening, and the first spaces; etching the dielectric material to form a second opening exposing a second side of the sacrificial multi-layer stack; removing the second sacrificial layers exposed by the second opening to form second spaces each between two portions of the first electrode material; forming a second electrode material in the second opening and the second spaces. In some embodiments, the method further includes before forming the second electrode material, conformally depositing a second high-k dielectric layer in the second opening and the second spaces. In some embodiments, the method further includes after forming the dummy gate structure and before etching the dielectric material to form the first opening exposing the first side of the sacrificial multi-layer stack, etching the dielectric material to form source/drain openings exposing the substrate and on opposite sides of the dummy gate structure; and forming source/drain regions in portions of the substrate exposed by the source/drain openings. In some embodiments, the dielectric material comprises silicon oxycarbide, silicon oxide, silicon nitride, silicon oxynitride, silicon carbide, tetraethoxysilane, phosphosilicate glass, borophosphosilicate glass, or combinations thereof. In some embodiments, the first electrode material comprises tungsten, ruthenium, palladium, platinum, cobalt, nickel, argentum, aurum, titanium nitride tungsten nitride, or combinations thereof.

In some embodiments, the integrated circuit (IC) structure includes a first capacitor electrode, a second capacitor electrode, and a first insulator. The first capacitor electrode includes a first vertical portion on a semiconductor substrate and a plurality of first lateral portions laterally extending from the first vertical portion and arranged along a direction perpendicular to a top surface of the semiconductor substrate. The second capacitor electrode spaced apart from the first capacitor electrode and includes a second vertical portion on the semiconductor substrate and a plurality of second lateral portions laterally extending from the second vertical portion and arranged along the direction perpendicular to the top surface of the semiconductor substrate. The first lateral portions of the first capacitor electrode interleave with the second lateral portions of the second capacitor electrode. The first insulator interposes the first capacitor electrode and the second capacitor electrode. In some embodiments, the IC structure further includes a plurality of metal lines and a plurality of metal vias alternating arranged in the direction perpendicular to the top surface of the semiconductor substrate, and the metal lines and the metal vias are arranged in a position above a bottom surface of the first capacitor electrode and below a top surface of the first capacitor electrode. In some embodiments, the first insulator further wraps around the first capacitor electrode. In some embodiments, the IC structure further includes a second insulator interposing the second capacitor electrode and the first insulator. In some embodiments, the IC structure further includes a gate structure on the semiconductor substrate, the gate structure having a top surface level with top surfaces of the first and second capacitor electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a sacrificial multi-layer stack including alternating first sacrificial layers and second sacrificial layers stacked in a vertical direction on a substrate, wherein the first sacrificial layers are made of a metal nitride, and the second sacrificial layers are made of a silicon-containing material;
removing the first sacrificial layers to form first spaces each interposing two of the second sacrificial layers;
depositing a first dielectric layer and a first electrode material in the first spaces;
removing the second sacrificial layers to form second spaces each interposing two portions of the first electrode material; and
depositing a second dielectric layer and a second electrode material in the second spaces.

2. The method of claim 1, wherein forming the sacrificial multi-layer stack comprises:
alternating depositing first sacrificial films and second sacrificial films on the substrate; and
patterning the first and second sacrificial films to form a fin.

3. The method of claim 1, further comprising:
forming a gate structure on the substrate, the gate structure having a top surface level with a top surface of the first electrode material.

4. The method of claim 3, wherein the gate structure comprises a gate dielectric layer having a same material as the first dielectric layer.

5. The method of claim 3, wherein the gate structure comprises a gate electrode layer having a same material as the first electrode material.

6. The method of claim 1, further comprising forming metallization layers on the substrate prior to forming the sacrificial multi-layer stack.

7. The method of claim 1, wherein the first sacrificial layers are made of a material different than the second sacrificial layers and comprising silicon, germanium, stannum, silicon carbide, silicon germanium, germanium stannum, silicon germanium stannum, a III-V compound semiconductor, a II-VI compound semiconductor, or combinations thereof, and the second sacrificial layers are made of a material comprising silicon germanium, pure germanium, a III-V compound semiconductor, a II-VI compound semiconductor, or combinations thereof.

8. The method of claim 1, wherein the metal nitride comprises titanium nitride, tantalum nitride, tungsten nitride, or combinations thereof.

9. The method of claim 1, wherein the second dielectric layer is made of a same material as the first dielectric layer.

10. The method of claim 1, wherein the second dielectric layer is made of a different material than the first dielectric layer.

11. A method, comprising:
forming a sacrificial multi-layer stack including alternating first sacrificial layers and second sacrificial layers stacked in a vertical direction on a substrate;
depositing a dielectric material over the sacrificial multi-layer stack;
forming a dummy gate structure in the dielectric material, the dummy gate structure having a material the same as the first sacrificial layers and different than the second sacrificial layers;
etching the dielectric material to form a first opening exposing a first side of the sacrificial multi-layer stack;
removing the dummy gate structure to form a gate trench, and removing the first sacrificial layers exposed by the first opening to form first spaces each between two of the second sacrificial layers;
depositing a first high-k dielectric layer and a first electrode material in the gate trench, the first opening, and the first spaces;
etching the dielectric material to form a second opening exposing a second side of the sacrificial multi-layer stack;
removing the second sacrificial layers exposed by the second opening to form second spaces each between two portions of the first electrode material; and
forming a second electrode material in the second opening and the second spaces.

12. The method of claim 11, further comprising:
before forming the second electrode material, conformally depositing a second high-k dielectric layer in the second opening and the second spaces.

13. The method of claim 11, further comprising:
after forming the dummy gate structure and before etching the dielectric material to form the first opening exposing the first side of the sacrificial multi-layer stack, etching the dielectric material to form source/drain openings exposing the substrate and on opposite sides of the dummy gate structure; and
forming source/drain regions in portions of the substrate exposed by the source/drain openings.

14. The method of claim 11, wherein the dielectric material comprises silicon oxycarbide, silicon oxide, silicon nitride, silicon oxynitride, silicon carbide, tetraethoxysilane, phosphosilicate glass, borophosphosilicate glass, or combinations thereof.

15. The method of claim 11, wherein the first electrode material comprises tungsten, ruthenium, palladium, platinum, cobalt, nickel, argentum, aurum, titanium nitride tungsten nitride, or combinations thereof.

16. A method, comprising:
forming a sacrificial multi-layer stack including alternating first sacrificial layers and second sacrificial layers stacked in a vertical direction on a substrate, wherein the first sacrificial layers are made of a metal nitride, and the second sacrificial layers are made of a silicon-containing material;
removing the first sacrificial layers to form first spaces each interposing two of the second sacrificial layers;
depositing a first insulator at least in the first spaces;
after depositing the first insulator, depositing a first electrode material at least in the first spaces to form a first capacitor electrode over a semiconductor substrate, the first capacitor electrode comprising:
a first vertical portion on the semiconductor substrate; and
a plurality of first lateral portions laterally extending from the first vertical portion and arranged along a direction perpendicular to a top surface of the semiconductor substrate;
removing the second sacrificial layers to form second spaces each interposing corresponding two lateral portions of the first capacitor electrode; and
depositing a second insulator at least in the second spaces;
after depositing the second insulator, depositing a second electrode material at least in the second spaces to form a second capacitor electrode over the second insulator, the second capacitor electrode being spaced apart from the first capacitor electrode and comprising:
a second vertical portion on the semiconductor substrate; and
a plurality of second lateral portions laterally extending from the second vertical portion and arranged along the direction perpendicular to the top surface of the semiconductor substrate, the first lateral portions of the first capacitor electrode interleaving with the second lateral portions of the second capacitor electrode, wherein the first and second insulators interpose between the first and second capacitor electrodes.

17. The method of claim 16, further comprising:
forming a plurality of metal lines and a plurality of metal vias alternating arranged in the direction perpendicular to the top surface of the semiconductor substrate, wherein the metal lines and the metal vias are arranged in a position above a bottom surface of the first capacitor electrode and below a top surface of the first capacitor electrode.

18. The method of claim 16, further comprising:
forming a gate structure on the semiconductor substrate, wherein the gate structure has a top surface level with top surfaces of the first and second capacitor electrodes.

19. The method of claim 16, wherein the metal nitride comprises titanium nitride, tantalum nitride, tungsten nitride, or combinations thereof.

20. The method of claim 16, wherein the first sacrificial layers are made of a material different than the second sacrificial layers and comprising silicon, germanium, stannum, silicon carbide, silicon germanium, germanium stannum, silicon germanium stannum, a III-V compound semiconductor, a II-VI compound semiconductor, or combinations thereof, and the second sacrificial layers are made of a material comprising silicon germanium, pure germanium, a III-V compound semiconductor, a II-VI compound semiconductor, or combinations thereof.

* * * * *